(12) United States Patent
Hartmann et al.

(10) Patent No.: US 8,587,945 B1
(45) Date of Patent: Nov. 19, 2013

(54) SYSTEMS STRUCTURES AND MATERIALS FOR ELECTRONIC DEVICE COOLING

(75) Inventors: Mark Hartmann, Boulder, CO (US); Greg Roda, Broomfield, CO (US)

(73) Assignee: Outlast Technologies LLC, Golden, CO (US)

(*) Notice: Subject to any disclaimer, the term of this patent is extended or adjusted under 35 U.S.C. 154(b) by 0 days.

(21) Appl. No.: 13/559,739

(22) Filed: Jul. 27, 2012

(51) Int. Cl.
*H05K 7/20* (2006.01)

(52) U.S. Cl.
USPC ........... 361/708; 361/705; 361/706; 361/719; 361/720; 361/679.53; 361/679.54

(58) Field of Classification Search
USPC ............... 361/679.53, 679.54, 705, 706, 708, 361/719, 720
See application file for complete search history.

(56) References Cited

U.S. PATENT DOCUMENTS

| | | | |
|---|---|---|---|
| 4,768,286 A * | 9/1988 | Ketcham | 29/841 |
| 5,006,924 A * | 4/1991 | Frankeny et al. | 257/714 |
| 5,060,114 A * | 10/1991 | Feinberg et al. | 361/706 |
| 5,208,733 A * | 5/1993 | Besanger | 361/704 |
| 5,245,508 A * | 9/1993 | Mizzi | 361/694 |
| 5,887,435 A * | 3/1999 | Morton | 62/3.6 |
| 5,898,572 A * | 4/1999 | Shennib et al. | 361/713 |
| 5,929,164 A | 7/1999 | Zhang | |
| 5,978,221 A * | 11/1999 | Sawa et al. | 361/704 |
| 6,169,142 B1 | 1/2001 | Nakano et al. | |
| 6,407,922 B1 * | 6/2002 | Eckblad et al. | 361/704 |
| 6,451,422 B1 * | 9/2002 | Nguyen | 428/323 |
| 6,620,515 B2 | 9/2003 | Feng et al. | |
| 6,690,578 B2 * | 2/2004 | Edelmann | 361/699 |
| 6,815,486 B2 | 11/2004 | Bhagwagar et al. | |
| 6,867,978 B2 * | 3/2005 | Whittenburg et al. | 361/719 |
| 6,870,736 B2 * | 3/2005 | Lee et al. | 361/704 |
| 6,898,084 B2 * | 5/2005 | Misra | 361/710 |
| 6,926,955 B2 | 8/2005 | Jayaraman et al. | |
| 6,947,285 B2 * | 9/2005 | Chen et al. | 361/708 |
| 6,965,071 B2 * | 11/2005 | Watchko et al. | 174/377 |
| 7,013,555 B2 * | 3/2006 | McCullough | 29/611 |
| 7,031,162 B2 * | 4/2006 | Arvelo et al. | 361/718 |
| 7,074,490 B2 | 7/2006 | Feng et al. | |
| 7,078,109 B2 | 7/2006 | Hill et al. | |

(Continued)

FOREIGN PATENT DOCUMENTS

EP    1783169 A2    5/2007

OTHER PUBLICATIONS

Almatis Premium Alumina, "Reactive and Calcined Aluminas for the Ceramic Industry", Product Guide downloaded Oct. 19, 2012, p. 8, Publisher: Almatis GmbH, Published in: DE.

(Continued)

*Primary Examiner* — Anatoly Vortman
(74) *Attorney, Agent, or Firm* — Neugeboren O'Dowd PC

(57) ABSTRACT

An electronic device having one or more components that generate heat during operation includes a structure for temperature management and heat dissipation. The structure for temperature management and heat dissipation comprises a heat transfer substrate having a surface that is in thermal communication with the ambient environment and a temperature management material in physical contact with at least a portion of the one or more components of the electronic device and at least a portion of the heat transfer substrate. The temperature management material comprises a polymeric phase change material having a latent heat of at least 5 Joules per gram and a transition temperature between 0° C. and 100° C., and a thermal conductive filler.

21 Claims, 25 Drawing Sheets

(56) References Cited

U.S. PATENT DOCUMENTS

| | | | |
|---|---|---|---|
| 7,408,787 B2* | 8/2008 | Matayabas et al. | 361/784 |
| 7,464,462 B2* | 12/2008 | Edwards et al. | 29/890.03 |
| 7,468,886 B2* | 12/2008 | Coico et al. | 361/711 |
| 7,535,715 B2* | 5/2009 | Chung | 361/707 |
| 7,550,097 B2 | 6/2009 | Tonapi et al. | |
| 7,569,630 B2 | 8/2009 | Ma et al. | |
| 7,576,988 B2* | 8/2009 | Schwarz | 361/704 |
| 7,672,132 B2* | 3/2010 | Fitzgerald et al. | 361/702 |
| 7,743,763 B2* | 6/2010 | Grip et al. | 126/569 |
| 7,760,507 B2* | 7/2010 | Jewram et al. | 361/713 |
| 7,879,933 B2 | 2/2011 | Hanssen | |
| 8,223,498 B2* | 7/2012 | Lima | 361/720 |
| 2002/0105071 A1* | 8/2002 | Mahajan et al. | 257/720 |
| 2002/0132896 A1* | 9/2002 | Nguyen | 524/404 |
| 2003/0066672 A1* | 4/2003 | Watchko et al. | 174/50 |
| 2003/0111333 A1* | 6/2003 | Montgomery et al. | 204/164 |
| 2003/0194537 A1 | 10/2003 | Bhagwagar et al. | |
| 2004/0005736 A1* | 1/2004 | Searls et al. | 438/122 |
| 2004/0081843 A1* | 4/2004 | Bunyan | 428/517 |
| 2004/0097635 A1* | 5/2004 | Fan et al. | 524/496 |
| 2004/0218354 A1* | 11/2004 | Lee et al. | 361/687 |
| 2005/0041406 A1* | 2/2005 | Matayabas et al. | 361/784 |
| 2005/0197436 A1* | 9/2005 | Czubarow | 524/405 |
| 2010/0012883 A1 | 1/2010 | Hartmann et al. | |
| 2010/0016513 A1 | 1/2010 | Hartmann et al. | |
| 2011/0242764 A1 | 10/2011 | Hill et al. | |

OTHER PUBLICATIONS

Anslyn, E.V., et al., "Modern Physical Organic Chemistry", Chapter 6, Stereochemistry, 2005, Publisher: Univ. Sci. Books, Published in: US.

Atiqullah, M., et al., "Synthesis of Functional Polyolefins using Metallocenes: A Comprehensive Review", Polymer Reviews, downloaded Aug. 30, 2012, Apr. 19, 2010, pp. 178-230, vol. 50, No. 2, Publisher: King Fahd University of Petroleum & Minerals, Published in: US.

Baughman, T.W., "Functionalized Ethylene Copolymers and Materials Via Olefin Metathesis Polymerization", A Dissertation Presented to the Graduate School of the University of Florida, 2006, p. 204 Publisher: U. FLA., Published in: US.

Becker, G., et al., "Thermal Conductivity in Advanced Chips", Advanced Packaging, Jul. 2005, pp. 1-6, Publisher: PennWell Corp., Published in: US.

"Black Silicon Carbide Powder", Product Guide, Jun. 15, 2002, Publisher: sales@ukabrasives.com, Published in: US.

"Nanjing Capatue Chemical Co., Ltd., Silane Coupling Agent, Antioxidant, Rubber Additive Manufacturers/Suppliers", Webpage found at http://capatue.en.made-in-china.com/ downloaded Oct. 19, 2012, p. 7 Published in: US.

"Dow Corning Thermal Phase Change Material PCM-250", Electronics Solutions, 2002, p. 2, Publisher: Dow Corning Corp., Published in: US.

Dow Corning, "Silanes Solutions", Webpage found at http://www.dowcorning.com/content/silanes/ downloaded Oct. 19, 2012, p. 1, Publisher: Dow Corning Corp., Published in: US.

"Product Information: Information About Dow Corning Brand Thermal Interface Pads & Films", Electronics Solutions, 2003, p. 8, Publisher: Dow Corning Corp., Published in: US.

"DuPont Elvaloy resins", Webpage found at http://www2.dupont.com/Elvaloy/en_US downloaded Oct. 19, 2012, p. 1, Publisher: DuPont, Published in: US.

Evonik Industries, "Dynasylan organofunctional silanes", Webpage found at http://www.dynasylan.com/product/dynasylan/en/Pages/default.aspx downloaded Oct. 19, 2012, p. 1, Published in: US.

Fujita, T., et al., "Polymerization of Alkenes", Comprehensive Organometallic Chemistry III, 2007, pp. 691-734, No. 11.20, Publisher: Elsevier, Ltd.

Milliken Chemical, "Hyperform for Nucleation", Webpage found at http://millikenchemical.com/pages/products/hyperform-for-nucleation/default.aspx downloaded Oct. 19, 2012, p. 2 Publisher: Milliken & Company, Published in: US.

BASF, "Irgafos: antioxidant—process stabilizer", Webpage found at http://www.basf.com/group/corporate/en/brand/IRGAFOS downloaded Oct. 19, 2012, p. 3 Publisher: BASF The Chemical Company, Published in: US.

BASF, "Irganox", Webpage found at http://www.basf.com/group/corporate/en/brand/IRGANOX downloaded Oct. 19, 2012, p. 3, Publisher: BASF The Chemical Company, Published in: US.

"Kenrich Petrochemicals, Inc.—Makers of Additives for Polymers", Webpage found at http://www.4kenrich.com/ downloaded Oct. 19, 2012, p. 2 Publisher: Kenrich Petrochemicals, Inc., Published in: US.

"Kraton—Giving Innovators Their Edge", Webpage found at http://www.kraton.com downloaded Oct. 19, 2012, p. 6, Publisher: Kraton Performance Polymers, Inc., Published in: US.

Lasance, C.J.M., "Thermal Conductivity of Filled Plastics", Electronics Cooling Magazine, Webpage found at http://www.electronics-cooling.com/2009/05/thermal-conductivity-of-filled-plastic downloaded Mar. 21, 2012, May 2009.

Lee, W.S., et al., "Comparative study of thermally conductive fillers in underfill for the electronic components", Diamond and Related Materials, Jun. 28, 2005, pp. 1647-1653, vol. 14, No. 2005, Publisher: Elsevier B.V.

Lee, B., et al., "Thermally conductive and electrically insulating EVA composite encapsulants for solar photovoltaic (PV) cell", "eXPRESS Polymer Letters", 2008, pp. 357-363, vol. 2, No. 5, Published in: US.

"PolarTherm thermally conductive Boron Nitride fillers for polymeric materials", Product Guide, 2006-2007, p. 2, Publisher: Momentive Performance Materials, Published in: US.

Momentive, "Boron Nitride (BN) Powder", Webpage found at http://ww2.momentive.com/Products/Main.aspx? id=22818 downloaded Jun. 6, 2012, p. 2, Published in: US.

Chemtura, "Products & Services—Naugalube 531", Webpage found at http:www.chemtura.com/ downloaded Oct. 19, 2012, p. 2, Publisher: Chemtura Corporation, Published in: US.

Chemtura, "Products & Services—Naugard 300E", Webpage found at http:chemtura.com/ downloaded Oct. 19, 2012, p. 2, Publisher: Chemtura Corporation, Published in: US.

Park J.J., et al., "Design of Thermal Interface Material With High Thermal Conductivity and Measurement Apparatus", J. Eelectronic Packaging, Mar. 2006, pp. 42-52, vol 128, Pubilisher: Electronic and Photonic Packaging Div. of ASME, Published in: US.

"Thermal Interface Materials for Electronics Cooling", Products & Custom Solutions Catalog, May 2012, p. 68, Publisher: Parker Chomerics.

Prasher, R., et al., "Thermal Interface Materials: A Brief Review of Design Characteristics and Materials", Webpage found at http://www.electronics-cooling.com/2004/02/thermal-interface-materials-a-brief-review-of-design-characteristics-and-materials downloaded Jun. 2, 2012, 2001, p. 12, Published in: US.

Prasher, R., "Thermal Interface Materials: Historical Perspective, Status and Future Directions", Proceedings of the IEEE, Aug. 2006, pp. 1572-1586, vol. 94, No. 8, Publisher: IEEE, Published in: US.

Rantala, Jukka, "The Anisotropic Thermal Conductivity of Plastics", Electronics Cooling Magazine, Webpage found at http://www.electronics-cooling.com/2001/08/the-anisotropic-thermal-conductivity-of-plastics/ downloaded Aug. 1, 2001, p. 2, Published in: US Saha, S. K., et al., "Thermal Management of Electronics Using PCM-Based Heat Sink Subjected to Cyclic Heat Load", IEEE Transactions on Components, Packaging and Manufacturing Technology, Mar. 2012, pp. 464-473, vol. 2, No. 3, Publisher: IEEE, Published in: US.

Su, Jun-Feng, et al., "Effect of interface debonding on the thermal conductivity of microencapsulated-paraffin filled epoxy matrix composites", Composites: Part A, Dec. 11, 2011, p. 325-332, vol. A, No. 43 (2012), Publisher: Elsevier, Ltd., Published in: US.

Thermacore, "Thermal Management Solutions", Webpage found at http://www.thermacore.com/# downloaded Oct. 19, 2012, p. 1, Publisher: Thermacore, Inc., Published in: US.

(56) References Cited

OTHER PUBLICATIONS

Thermo Cool, "Thermal Solutions Experts", Webpage found at http://thermocoolcorp.com/new/ downloaded Oct. 19, 2012, Publisher: Thermo Cool Corp., Published in: US.

Cytec, "TMI (Meta) Unsaturated Aliphatic Isocyanate", Product Data Sheet—Urethanes, 2009, p. 2 Publisher: Cytec Industries, Inc., Published in: US.

"DuPont Tyzor Organic Titanates", Product Information brochure for Tyzor TPT, 2008, Publisher: DuPont, Published in: US.

Wong, C.P., et al., "Comparative Study of Thermally Conductive Fillers for Use in Liquid Encapsulants for Electronic Packaging", IEEE Transactions on Advanced Packaging, Feb. 1999, pp. 54-59, vol. 22, No. 1, Publisher: IEEE, Published in: US.

* cited by examiner

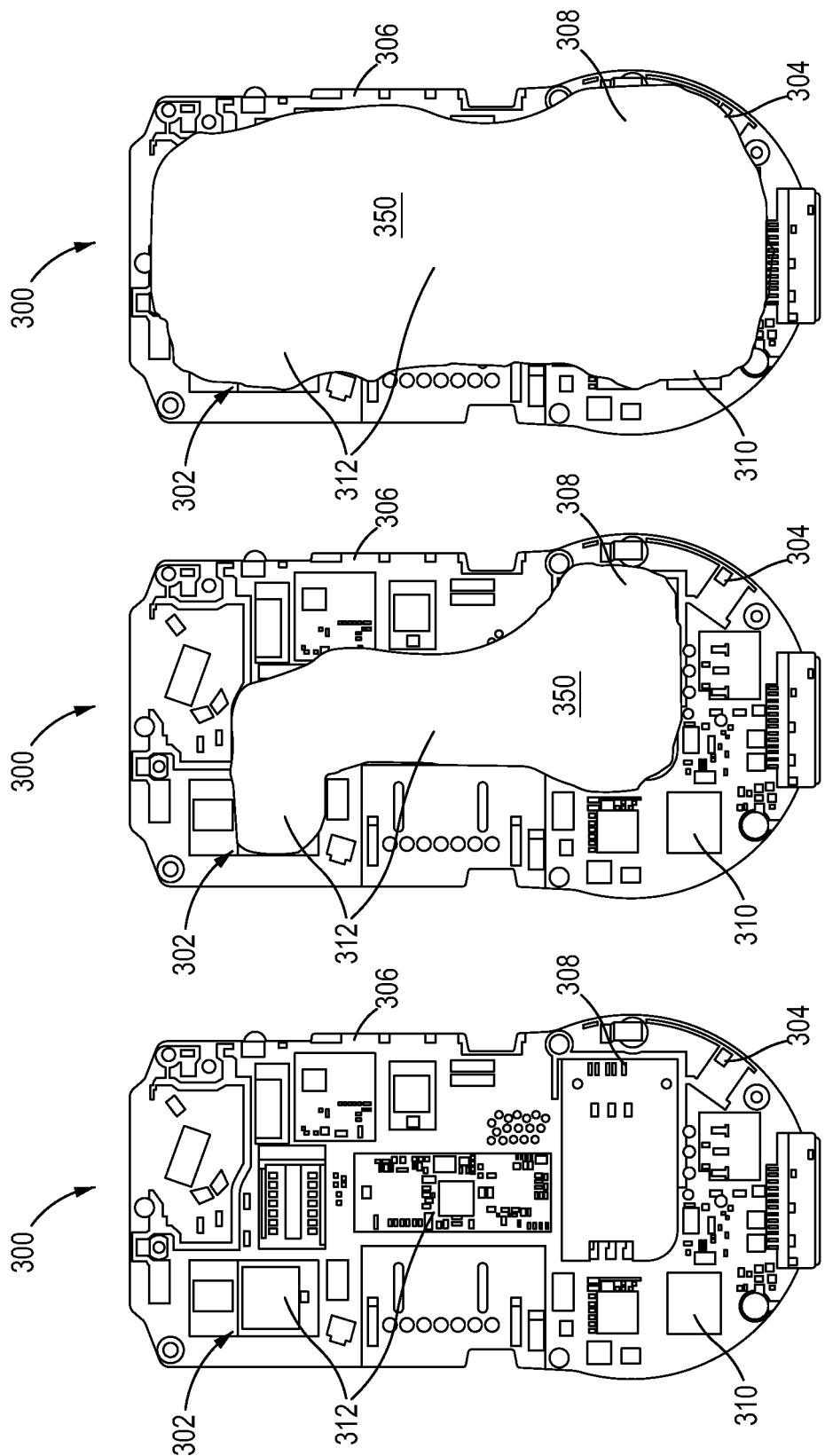

| L7 | L8 |
|----|----|
| L5 | L6 |
| L3 | L4 |
| L1 | L2 |

| L6 |
|----|
| L5 |
| L4 |
| L3 |
| L2 |
| L1 |

SYSTEMS STRUCTURES AND MATERIALS FOR ELECTRONIC DEVICE COOLING

FIELD OF THE INVENTION

In general, the present invention relates to systems, structures and compositions used to enhance the performance of electronic devices and components by increasing the cooling efficiency and capacity of the devices and components.

BACKGROUND OF THE INVENTION

Electronic devices, and in particular personal electronic devices such as smart phones, tablets, and laptop computers, have gone through major evolutions in the past decade. The devices themselves have become smaller and smaller, while at the same time, utilizing more and more processing power, advanced communications electronics, and fewer moving parts. For example, and most particular to aspects of the present invention, the small size of modern personal electronics has demanded that mechanical cooling systems, such as fans and other air handling devices, be removed and replaced with passive cooling systems. However, the higher processing power and demands of modern electronic devices only adds to the heat generated by these devices. The temperatures generated by such devices have been reported widely in the news and have even led to user injuries and device damage. The use and development of smaller, faster, more powerful computer chips and electronic components in mobile phones, computers, laptops, tablets, etc. has caused a dramatic increase in the power, run time and heat generation in these components. The increased power and heat generation must be controlled to prevent overheating and damage to the components. This overheating also causes hotspots and hot areas on the surface of the device thereby causing discomfort or injury to the human user and therefore there is a need to manage this heat. This heat control is done by either removing the heat by various means or "throttling" back the power and speed of the components to reduce the generated heat. Reducing the speed and power of the components is not preferable since this creates inefficiencies, prolonged wait times for results, reduced download speeds, etc. Therefore materials are needed to both absorb or store this generated heat and subsequently rapidly remove or conduct heat away from the components. This is made more difficult by the shrinking of the component and total device area, all leading to a larger heat flux per unit area.

More notable is the fact that when the operating temperature of these devices increase, the performance of the device drops, either purposely by design, or naturally because of the inherent characteristics of solid state electronics. Many devices have built in safe modes that completely shut down the processors and other heat generating components if the operating temperature gets too high.

Electronic heat dissipation techniques require that the heat be move away from the operating electronic components and to the ambient environment. Without the benefit of fans and other mechanical cooling systems, the generated heat is merely transmitted by conduction to the exterior surface of the device or some other substrate. Thus, most devices become warm or hot to the touch during operation as heat exchangers are utilized to move the heat from the electronics to the device case. These prior methods rely solely on thermal conduction techniques to move the heat from one point to another.

The use of phase change materials (PCMs) in various industries to store and release heat is known. For example, the use of various forms and compositions of PCMs (micro-encapsulated or raw), their methods of manufacture and applications thereof have been widely disclosed. PCMs have been used widely in the textile and fabrics industries but have not been effectively utilized or disclosed in the electronics fields, particularly when utilized to effect heat storage and removal. The use of PCMs in the electronics industries has thus far been limited to mixing micro-encapsulated PCMs into an epoxy or otherwise mixing waxes and gels. No one has been able to figure out how to effectively take these materials, form them, lock them into place in a complicated and sensitive electronic assembly, maintain high latent heats with thermal conductivity while conforming to the confines of an enclosed electronic device or other processor confined within a sealed or other casing.

Thermal management materials (TMM), thermal interface materials (TIMs), heat management materials, heat spreaders, etc. all have key functions in an electronics package, i.e. to dissipate heat in order to allow higher processing speeds. More specifically, thermal interface materials and heat sinks bring the heat generating electronics components (i.e. chips, transistors, semiconductors, integrated circuits (ICs), discrete devices, batteries, etc.) into good thermal contact with the heat removal hardware.

SUMMARY OF THE INVENTION

Exemplary embodiments are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

In one embodiment an electronic device having one or more components that generate heat during operation includes a structure for temperature management and heat dissipation. The structure for temperature management and heat dissipation comprises a heat transfer substrate having a surface that is in thermal communication with the ambient environment and a temperature management material in physical contact with at least a portion of the one or more components of the electronic device and at least a portion of the heat transfer substrate. The temperature management material comprises a polymeric phase change material having a latent heat of at least 5 Joules per gram and a transition temperature between 0° C. and 100° C., and a thermal conductive filler.

In one embodiment the heat transfer substrate is a printed circuit board and the one or more components of the electronic device are mounted to the printed circuit board. In another embodiment, the electronic device further comprised a second substrate in thermal communication with the heat transfer substrate. In some embodiments, the heat transfer substrate is an exterior surface of the electronic device or a display of the electronic device.

In other embodiments, the thermal conductive filler is a form of carbon, graphene, alumina, or a boron compound. In other embodiments, the structure for temperature management and heat control further comprises a fusible material.

In one embodiment, the thermally conductive filler comprises between 5% and 95% of the temperature management material. In another embodiment, the thermally conductive filler has a purity that is greater than 95%.

In another embodiment the structure for temperature management and heat control further comprises a fire resistant additive. In yet another embodiment, the electronic device further comprises a housing containing the one or more electronic components and the structure for temperature management and heat dissipation.

In one embodiment, a personal computing device, such as a cell phone, PDA, tablet, or laptop computer comprises a housing, a printed circuit board, one or more components attached to the printed circuit board that generate heat during operation of the electronic device, and a structure for temperature management and heat dissipation. The structure for temperature management and heat dissipation comprises a heat transfer substrate having a surface that is in thermal communication with the printed circuit board and a surface that is in thermal communication with the ambient environment and a temperature management material in physical contact with at least a portion of the one or more components of the electronic device and at least a portion of the heat transfer substrate.

In one embodiment the temperature management material comprises a polymeric phase change material having a latent heat of at least 5 Joules per gram and a transition temperature between 0° C. and 100° C., and a thermal conductive filler.

In another embodiment, a method of constructing a personal computing device comprises applying a temperature management material over at least a portion of one or more heat generating components attached to a printed circuit board of the device, enclosing the printed circuit board, the one or more components, and the structure for temperature management and heat dissipation with the housing; and curing the temperature management material. In some embodiments, the temperature management material substantially fills any voids within the housing.

Many additional aspects and embodiments are described herein as would be recognized y one of ordinary skill in the art.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

FIGS. 3A-3C show the circuit board of a device in accordance with aspects of the present invention;

Figure 1:
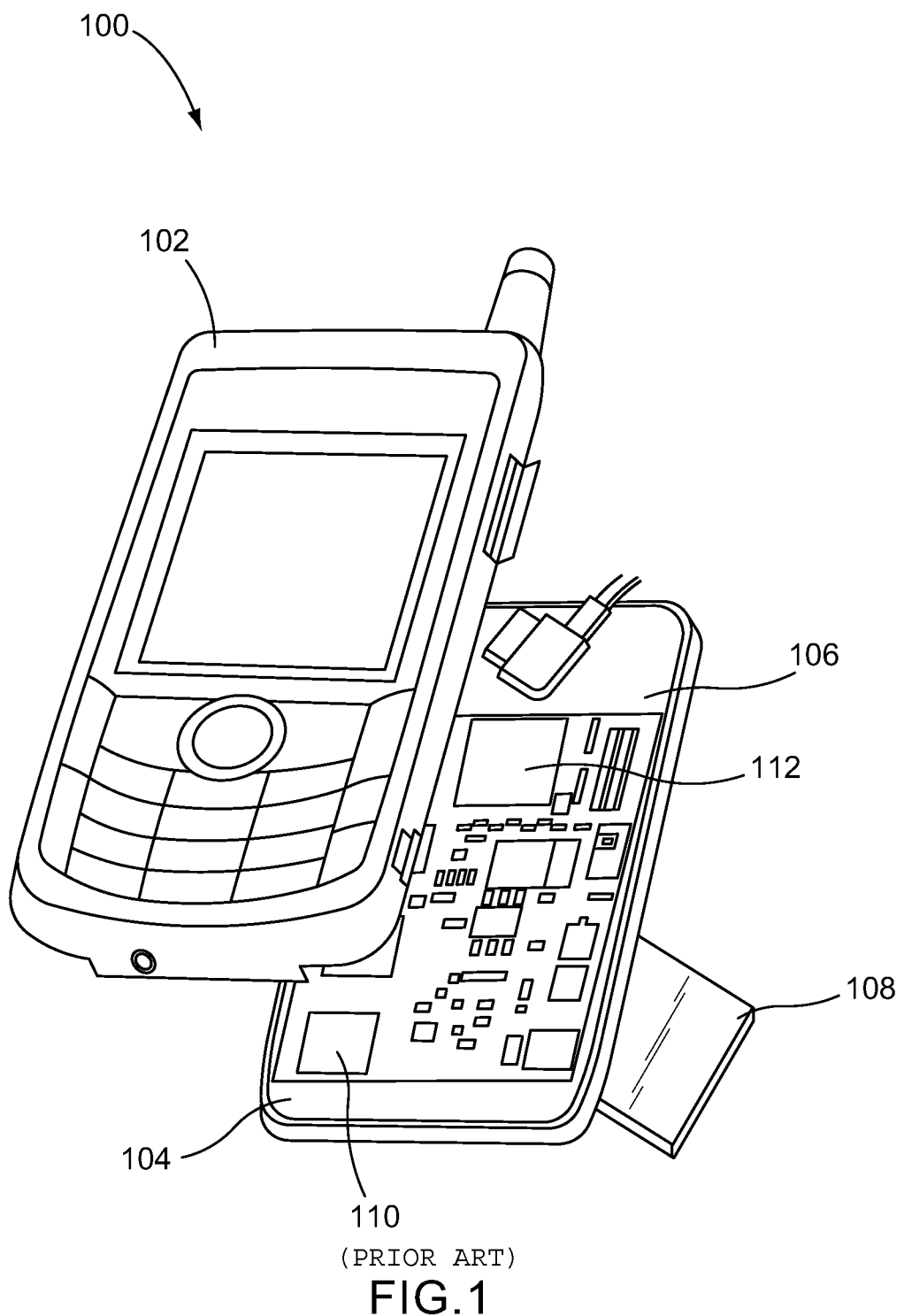
FIG. 1 shows a high level diagram of a typical mobile phone.

Other embodiments and aspects are disclosed herein, including various figures and process descriptions described and illustrated throughout the specification.

DETAILED DESCRIPTION

Throughout this specification references are made to the use of various materials, combinations, chemical formulations and other aspects that may be used in various combinations to form one or more materials, end products, or compositions in accordance with aspects of the present invention. It should be understood, both to one of skill in the art as well as the examining divisions in the United States Patent Office and Patent Offices throughout the world, that each of the lists of materials, examples, and other embodiments are included herein in order to teach one of skill in the art that they may be combined into various alternative embodiments, without requiring specific claim permutations of these individual features. The claims as presented herein, as well as any potential future amendments to those claims, may include one or more combinations of these materials, ranges and other alternatives without departing from the spirit and scope of the invention described herein. In particular it is contemplated that one of skill in the art would recognize and find adequate support in the written description for any combination of the features disclosed herein, whether described in a single example or embodiment, or described in different sections of the written description. The description of these various examples and options is specifically drafted to comply with 35 U.S.C. §112 of the United States Patent Laws, Article 123(2) of the European Patent Laws as well as other similar national country laws relating to the adequacy of the written description.

It should be clearly understood that by providing examples of specific compositions and methods in the later part of this description, applicant does not intend to limit the scope of the claims to any of those specific composition. To the contrary, it is anticipated that any combination of the functional groups, polymeric phase change materials, and articles described herein may be utilized to achieve the novel aspects of the present invention. The claims are not intended to be limited to any of the specific compounds described in this disclosure or any disclosure incorporated herein.

It is known that good thermal management materials should have high thermal conductivity, high specific heat capacity, high latent heat capacity, high polytropic heat capacity, low coefficient of thermal expansion, low air content, good gap-filling, good surface wetting and adhesion, good rheology, etc.

Thermal conductivity, or the rate of heat transfer across a material and expressed as watts per meter kelvin (W/(m·K)) or W·m$^{-1}$·K$^{-1}$, is controlled by the flow of free electrons or crystal lattice vibrations (phonons). In metals, conductivity is primarily due to free electrons, whereas for nonmetals it is mainly due to phonon transport. Thermal conductivity can vary dependent on type of materials, temperature, material phase, impurities, etc. For instance the change in thermal conductivity that occurs when ice (thermal conductivity of 2.18 W/(m·K) at 0° C.) melts into liquid water (thermal conductivity of 0.58 W/(m·K) at 0° C.). Another example is for pure crystalline substances can exhibit different thermal conductivities along different crystal axes, due to differences in phonon coupling along a given crystal axis. The thermal conductivity of plastics depends strongly on the degree of crystallinity in polymers (Anisotropicity of crystalline polymers). This is mostly due to phonon transport (flowing lattice vibrational energy) that is efficient along the crystalline axis but reduced substantially in amorphous areas or by various scattering processes in the other directions.

DEFINITIONS

The following definitions apply to various elements described with respect to various aspects of the invention. These definitions may likewise be expanded upon herein.

As used herein, the term "monodisperse" refers to being substantially uniform with respect to a set of properties. Thus, for example, a set of microcapsules that are monodisperse can refer to such microcapsules that have a narrow distribution of sizes around a mode of the distribution of sizes, such as a mean of the distribution of sizes. A further example is a set of polymer molecules with similar molecular weights.

As used herein, the term "latent heat" refers to an amount of heat absorbed or released by a material as it undergoes a transition between two states. Thus, for example, a latent heat can refer to an amount of heat that is absorbed or released as a material undergoes a transition between a liquid state and a crystalline solid state, a liquid state and a gaseous state, a crystalline solid state and a gaseous state, two crystalline solid states or crystalline state and amorphous state or any combination thereof.

As used herein, the term "transition temperature" refers to an approximate temperature at which a material undergoes a transition between two states. Thus, for example, a transition temperature can refer to a temperature at which a material undergoes a transition between a liquid state and a crystalline solid state, a liquid state and a gaseous state, a crystalline solid state and a gaseous state, two crystalline solid states or crystalline state and amorphous state. A temperature at which an amorphous material undergoes a transition between a glassy state and a rubbery state may also be referred to as a "glass transition temperature" of the material or combination thereof.

As used herein, the term "phase change material" refers to a material that has the capability of absorbing or releasing heat to adjust heat transfer at or within a temperature stabilizing range. A temperature stabilizing range can include a specific transition temperature or a range of transition temperatures. This allows for the adjustment of heat transfer or thermal conductivity within this transition range. In some instances, a phase change material can be capable of inhibiting heat transfer during a period of time when the phase change material is absorbing or releasing heat, typically as the phase change material undergoes a transition between two states. This action is typically transient and will occur until a latent heat of the phase change material is absorbed or released during a heating or cooling process. Heat can be stored or removed from a phase change material, and the phase change material typically can be effectively recharged by a source emitting or absorbing it. For certain implementations, a phase change material can be a mixture of two or more materials. By selecting two or more different materials and forming a mixture, a temperature stabilizing range can be adjusted for any desired application. The resulting mixture can exhibit two or more different transition temperatures or a single modified transition temperature when incorporated in the articles described herein.

As used herein, the term "polymer" refers to a material that includes a set of macromolecules. Macromolecules included in a polymer can be the same or can differ from one another in some fashion. A macromolecule can have any of a variety of skeletal structures, and can include one or more types of monomeric units. In particular, a macromolecule can have a skeletal structure that is linear or non-linear. Examples of non-linear skeletal structures include branched skeletal structures, such those that are star branched, comb branched, or dendritic branched, and network skeletal structures. A macromolecule included in a homopolymer typically includes one type of monomeric unit, while a macromolecule included in a copolymer typically includes two or more types of monomeric units. Examples of copolymers include statistical copolymers, random copolymers, alternating copolymers, periodic copolymers, block copolymers, radial copolymers, and graft copolymers. In some instances, a reactivity and a functionality of a polymer can be altered by addition of a set of functional groups, such as acid anhydride groups, amino groups and their salts, N-substituted amino groups, amide groups, carbonyl groups, carboxy groups and their salts, cyclohexyl epoxy groups, epoxy groups, glycidyl groups, hydroxy groups, isocyanate groups, urea groups, aldehyde groups, ester groups, ether groups, alkenyl groups, alkynyl groups, thiol groups, disulfide groups, silyl or silane groups, groups based on glyoxals, groups based on aziridines, groups based on active methylene compounds or other b-dicarbonyl compounds (e.g., 2,4-pentandione, malonic acid, acetylacetone, ethylacetone acetate, malonamide, acetoacetamide and its methyl analogues, ethyl acetoacetate, and isopropyl acetoacetate), halo groups, hydrides, or other polar or H bonding groups and combinations thereof. Such functional groups can be added at various places along the polymer, such as randomly or regularly dispersed along the polymer, at ends of the polymer, on the side, end or any position on the crystallizable side chains, attached as separate dangling side groups of the polymer, or attached directly to a backbone of the polymer. Also, a polymer can be capable of cross-linking, entanglement, network formation, ionic bonding, covalent bonding or hydrogen bonding in order to increase its mechanical strength or its resistance to degradation under ambient or processing conditions. As can be appreciated, a polymer can be provided in a variety of forms having different molecular weights, since a molecular weight of the polymer can be dependent upon processing conditions used for forming the polymer. Accordingly, a polymer can be referred to as having a specific molecular weight or a range of molecular weights. As used herein with reference to a polymer, the term "molecular weight" can refer to a number average molecular weight, a weight average molecular weight, or a melt index of the polymer.

Examples of polymers (including those polymers used for crosslinkers and binders) include polyhydroxyalkonates, polyamides, polyamines, polyimides, polyacrylics (e.g., polyacrylamide, polyacrylonitrile, and esters of methacrylic acid and acrylic acid), polycarbonates (e.g., polybisphenol A carbonate and polypropylene carbonate), polydienes (e.g., polybutadiene, polyisoprene, and polynorbornene), polyepoxides (e.g. bisphenol A, bisphenol F, multifunctional glycidyl based epoxies either crosslinked or uncrosslinked with amines, acids, alcohols, etc.), polyesters (e.g., polycaprolactone, polyethylene adipate, polybutylene adipate, polypropylene succinate, polyesters based on terephthalic acid, and polyesters based on phthalic acid), polyethers (e.g., polyethylene glycol or polyethylene oxide, polybutylene glycol, polypropylene oxide, polyoxymethylene or paraformaldehyde, polytetramethylene ether or polytetrahydrofuran, and polyepichlorohydrin), polyfluorocarbons, formaldehyde polymers (e.g., urea-formaldehyde, melamine-formaldehyde, and phenol formaldehyde), natural polymers (e.g., polysaccharides, such as cellulose, chitan, chitosan, and starch; lignins; proteins; and waxes), polyolefins (e.g., polyethylene, polypropylene, polybutylene, polybutene, and polyoctene), polyphenylenes, silicon-containing polymers (e.g., polydimethyl siloxane, polyalkyl siloxanes and polycarbomethyl silane), polyurethanes, polyvinyls (e.g., polyvinyl butyral, polyvinyl alcohol, esters and ethers of polyvinyl alcohol, polyvinyl acetate, polystyrene, polymethylstyrene, polyvinyl chloride, polyvinyl pyrrolidone, polymethyl vinyl ether, polyethyl vinyl ether, and polyvinyl methyl ketone), polyacetals, polyarylates, alkyd-based polymers (e.g., polymers based on glyceride oil), copolymers (e.g., polyethylene-co-vinyl acetate and polyethylene-co-acrylic acid, styrene-butadiene, or any combination of the above), and mixtures thereof. The term polymer is meant to be construed to include any substances that become available after the filing of this application and that exhibit the general polymeric properties described above.

As used herein, the term "chemical bond" and its grammatical variations refer to a coupling of two or more atoms based on an attractive interaction, such that those atoms can form a stable structure. Examples of chemical bonds include covalent bonds and ionic bonds. Other examples of chemical bonds include hydrogen bonds and attractive interactions between carboxy groups and amine groups.

As used herein, the term "covalent bond" means a form of chemical bonding that is characterized by the sharing of pairs of electrons between atoms, or between atoms and other covalent bonds. Attraction-to-repulsion stability that forms between atoms when they share electrons is known as covalent bonding. Covalent bonding includes many kinds of interactions, including σ-bonding, π-bonding, metal-metal bonding, agostic interactions, and three-center two-electron bonds.

As used herein, the term "ionic bond" or "electrovalent bond" means a bond formed through electrostatic attraction between oppositely charged ions. For example, between a positively charged cation and a negatively charged anion. Ionic bonds can be formed between a metal such Na, Fe, Ag, etc. and a nonmetal, or between two metals, or between two non-metals such as ammonia and acids. Ionic compounds can conduct electricity when molten, in a solid or in solution.

As used herein, the term "molecular group" and obvious variations thereof, refers to a set of atoms that form a portion of a molecule. In some instances, a group can include two or more atoms that are chemically bonded to one another to form a portion of a molecule. A group can be neutral on the one hand or charged on the other, e.g., monovalent or polyvalent (e.g., bivalent) to allow chemical bonding to a set of additional groups of a molecule. For example, a monovalent group can be envisioned as a molecule with a set of hydride groups removed to allow chemical bonding to another group of a molecule. A group can be neutral, positively charged, or negatively charged. For example, a positively charged group can be envisioned as a neutral group with one or more protons (i.e., H+) added, and a negatively charged group can be envisioned as a neutral group with one or more protons removed. A group that exhibits a characteristic reactivity or other set of properties can be referred to as a functional group, reactive function or reactive functional groups. Examples of reactive functional groups include those such as acid anhydride groups, amino groups, N-substituted amino groups and their salts, amide groups, carbonyl groups, carboxy groups and their salts, cyclohexyl epoxy groups, epoxy groups, glycidyl groups, hydroxy groups, isocyanate groups, urea groups, aldehyde groups, ester groups, ether groups, alkenyl groups, alkynyl groups, thiol groups, disulfide groups, silyl or silane groups, groups based on glyoxals, groups based on aziridines, groups based on active methylene compounds or other b-dicarbonyl compounds (e.g., 2,4-pentandione, malonic acid, acetylacetone, ethylacetone acetate, malonamide, acetoacetamide and its methyl analogues, ethyl acetoacetate, and isopropyl acetoacetate), halo groups, hydrides, or other polar or H bonding groups and combinations thereof.

As used herein the term "Melt flow index" or MFI is a measure of the ease of flow of the melt of a polymer. In academic terms the melt flow is defined as the mass of polymer, in grams, flowing in ten minutes through a capillary of a specific diameter and length by a pressure applied via prescribed alternative gravimetric weights for alternative prescribed temperatures. The method is described in the similar standards ASTM D1238 and ISO 1133.

Molecular Weight Polydispersity—A polydispersity index (PDI), is a measure of the distribution of molecular mass in a given polymer sample. The PDI calculated is the weight average molecular weight divided by the number average molecular weight. It indicates the distribution of individual molecular masses in a batch of polymers. The PDI has a value equal to or greater than 1, but as the polymer chains approach uniform chain length, the PDI approaches unity (1). For some natural polymers PDI is almost taken as unity. The PDI from polymerization is often denoted as:

$$PDI=M_w/M_n$$

Mn is more sensitive to molecules of low molecular mass, while Mw is more sensitive to molecules of high molecular mass. A polymer material is denoted by the term polydisperse if its chain lengths vary over a wide range of molecular masses.

Stereochemistry—Stereochemistry involves the study of the relative spatial arrangement of atoms within molecules. One branch of stereochemistry is the study of chiral molecules. Stereochemistry is also known as 3D chemistry. Examples, explanations, descriptions and definitions of various stereochemical nomenclature and naming regimes can be found in chapter 6 "Stereochemistry" in "Modern Physical Organic Chemistry" by Anslyn and Dougherty, ©2005, University Science Books.

Polymer stereochemistry descriptions of atactic, syndiotactic, isotactic, cis- and trans-, R— and S-, L-, D- and Meso- will be used.

Polymerization—Polymerization is a process of reacting monomer molecules together in a chemical reaction to form three-dimensional networks or polymer chains. Many forms of polymerization and different systems exist to categorize them are known in the art.

Rheology and Viscosity—Rheology is the characterization of the flow of matter while viscosity is the measure of resistance to flow or deformation. Viscosity can be measured by various means and characterized as a melt flow index (MFI) or centipoise (cps), usually at a given temperature or shear rate.

As used herein, the term "thermal conductivity" ("k" and also denoted as λ or κ), is the property of a material's ability to conduct heat and is measured in W/m·K. Thermal conductivity is defined as the quantity of heat (Q) transmitted through a unit thickness (L) in a direction normal to a surface of unit area (A) due to a unit temperature gradient (ΔT) under steady state conditions and when the heat transfer is dependent only on the temperature gradient. In equation form this becomes the following:

Thermal Conductivity=heat×distance/(area×temperature gradient)

$\lambda = Q \times L / (A \times \Delta T)$

Generally in low conducting materials k<0.1 W/m·K. In good conducting materials k=0.1-10 W/m·K. In highly conducting material k>10 W/m·K. In accordance with aspects of the present invention the thermal management and heat dissipation material preferably has a k value of >0.5 W/m·K. In another embodiment k>1.0 W/m·K and it yet another embodiment k is >10 W/m·K.

As used herein, the term "heat dissipation" refers to the movement or spreading of heat from a high temperature environment to a low temperature environment, e.g. moving heat from a warm processor or other heat producing electronic component to cooler ambient air. Methods to dissipate heat can be accomplished by using high thermal conductivity materials such as metallic or ceramic heat spreaders, heat spreader plates, heat sinks, heat pipes, heat exchangers, loop pipes, liquid cold pipes, heat fins, fans, circulating coolants or a combination thereof. Further examples are products such as those supplied by Thermo Cool Corp., Thermacore Inc., etc.

General Structure of Electronic Devices

Aspects of the inventions disclosed herein may be used in connection with a wide variety of electronic device and any other device that generates heat to the detriment of the performance of the processors and other operating circuits (memory, video chips, telecom chips, etc.). While reference is made herein to such common devices as cell phone, PDAs, smart-phones, tablets, laptop computers and other generally portable devices, the same features may be incorporated into virtually any electronic device that requires cooling during operation. For example, electronics used in automotive components, aircraft components, guidance systems and GPS devices incorporated into civilian and military equipment and other vehicles may benefit from aspects of the present invention such as engine control units (ECU), airbag modules, body controllers, door modules, cruise control modules, instrument panels, climate control modules, anti-lock braking modules (ABS), transmission controllers, and power distribution modules. Aspects of the present invention can also be incorporated into the casings of electronics or other structural components. In the end, any device that relies on the performance characteristics of an electronic processor or other electronic circuit can benefit from the increased or more stable performance characteristics resulting from utilizing aspects of the present invention.

In general, aspects of the invention relate to incorporating a material, coating, or layer of a phase change material containing substance onto, over or otherwise near the heat producing components of an electronic device so that heat is pulled away from those components and stored and/or dissipated through some form of heat transfer substrate to the ambient environment. Described below are various embodiments of the devices that can utilize such a substance and structure and different embodiments of such a composition as used in these devices.

FIG. 1 shows a general representation of a cell phone 100 that includes a front panel 102, including common features such as a keyboard and screen. A rear panel 104 engages with the front panel 102 and encloses, among other components, a printed circuit board (PCB) 106 that includes operating electronics. While the PCB 106 has many different pieces of electronics, connectors and other features, the primary components referred to in this disclosure are those that generally generate heat, such as battery 108, transmitter/receiver or other communications chip 110, and processor 112. Most electronics devices have at least one of these components or some other element that generates heat during operation and for which there is a need to reduce the buildup of that heat during operation. By referring to one or another specific types of device in this disclosure, it is not intended to limit the scope of the claims herein as the claims are applicable to virtually any electronic device known or unknown that suffers from the same heat related problems.

Figure 2:
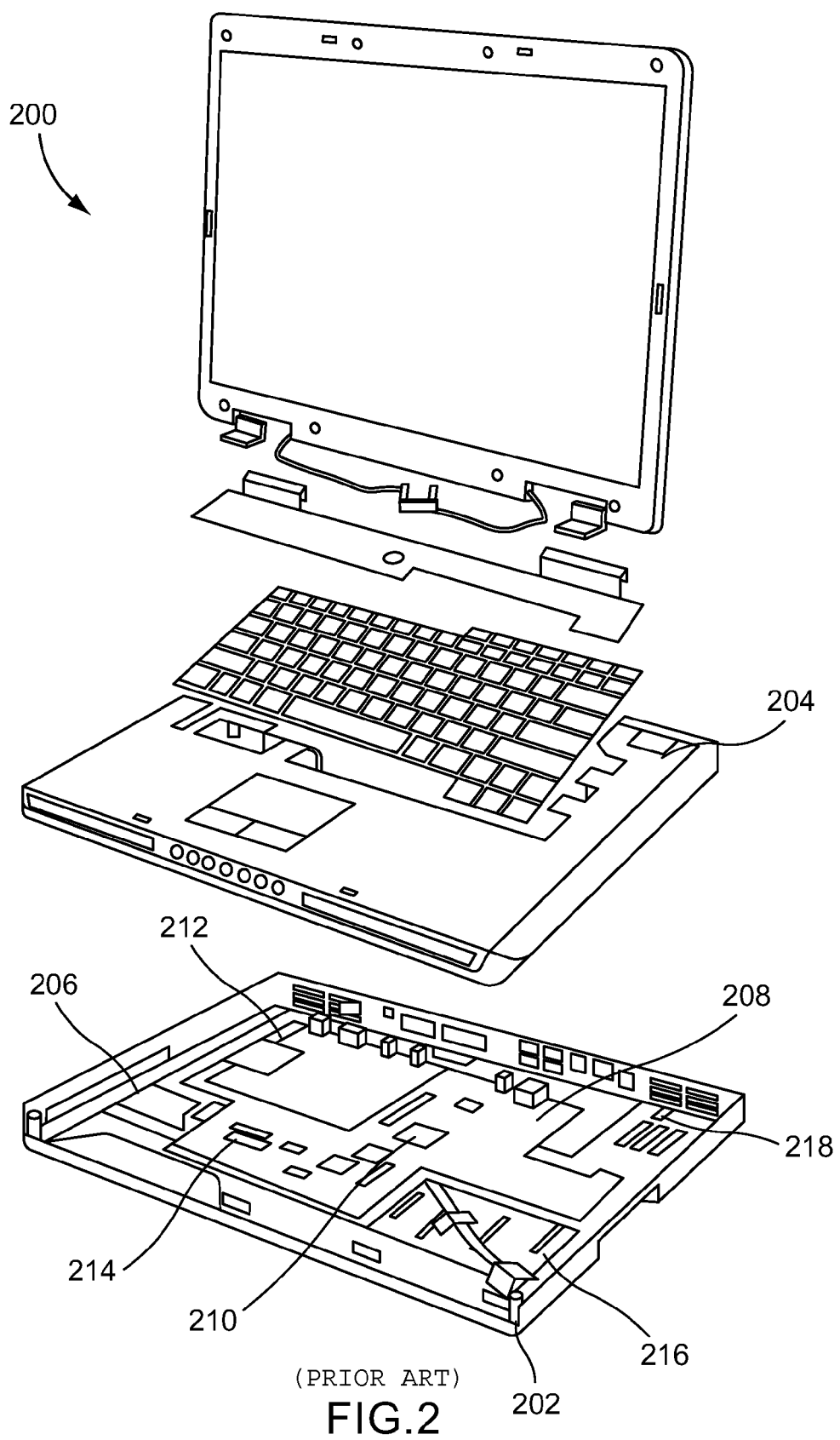
FIG. 2 shows a high level diagram of a typical portable computer.

FIG. 2 is a generalized diagram showing the main components and features of a laptop computer 200 with a similar detail as that of FIG. 1. Computer 200 includes a lower panel 202, an upper panel 204, an internal panel 206 and an electronics section 208 that includes, among other components, a processor 210, a system board 212, memory 214, a storage device such as a hard drive 216 and a battery 218. Many of the components within the computer 200 generate heat during operation and there is also a need in these devices to reduce the buildup of that heat.

FIG. 3A shows a more detailed diagram of the electronic component circuit board 300 of a representative cell phone. While circuit board 300 includes many circuits and other components, reference will primarily be made herein to those that regularly produce heat during operation, such as transceiver or communication module 302, wireless communication module 304, power supply module 306 battery 308, graphics driver 310, and processor 312. Each of these components is one that will generate heat during operation and that also will suffer a degradation in performance as their temperature rises. With reference to FIG. 3B, the same cell phone circuit board 300 is shown with the same components 302, 304, 306, 308, 310 and 312 covered in a temperature management material 350 according to one of various aspects of the present invention. In FIG. 3B, temperature management material 350 is shown in a first configuration dispersed and coated over only those portions of circuit board 300 that contain heat generating components, leaving the other components of the circuit board exposed as they would be normally. In FIG. 3C, temperature management material 350 is shown in a second configuration dispersed and coated over substantially the entire surface of circuit board 300 without segregating the heat generating components from the non-heat generating components.

Figure 4A:
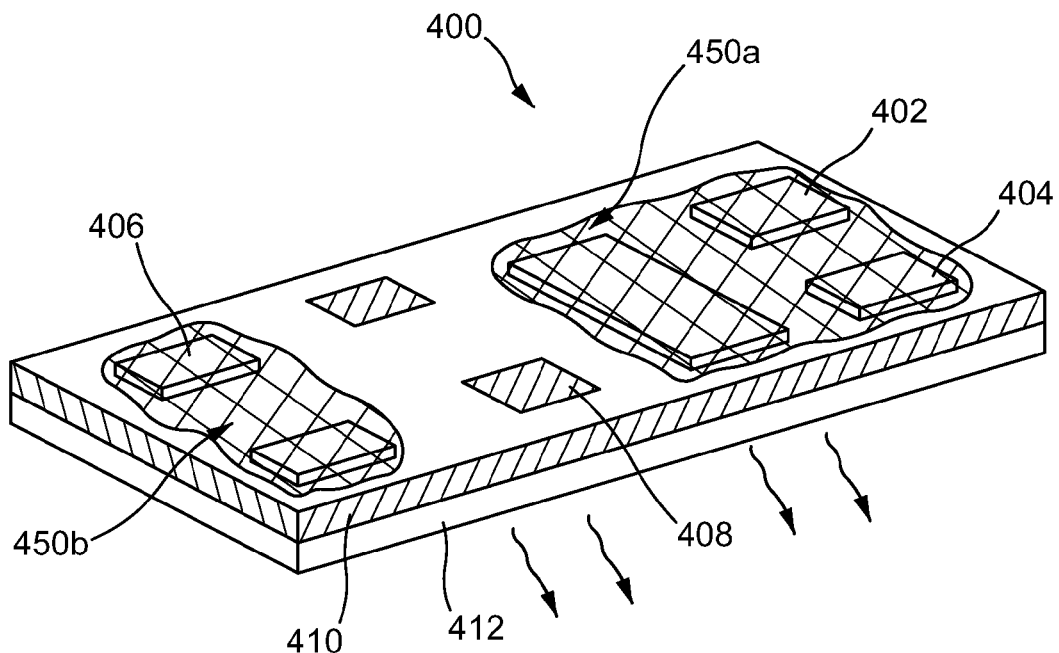
FIGS. 4A-4B show high level diagrams of a circuit board and related structures in accordance with aspects of the present invention.
Figure 4B:
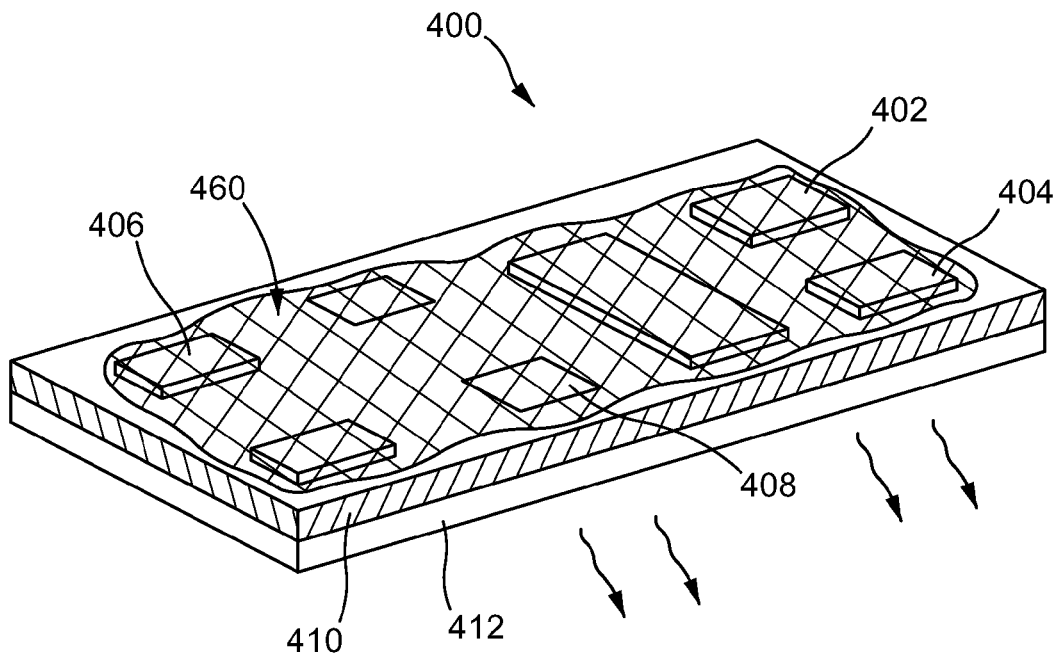

With reference to FIGS. 4A and 4B several perspective views of a printed circuit board 400 are shown, illustrating various options and embodiments for incorporating a temperature management material into the structure of the circuit boards. For example, in FIG. 4A, printed circuit board 400 includes several heat generating components 402, 404 and 406 such as processors, graphic chips and telecommunication chips as described above. PCB 400 includes a backing or other outer surface 412 that protects and also conducts heat away from the operable components within the device. Regions of temperature management material are dispersed on the PCB components at 450a and 450b and are generally dispersed to only cover those elements that contribute to the generation of heat and for which it is desired to reduce the effects of the heat on the operable components. Because of the composition of the temperature management material 450*a* and 450*b* (discussed in more detail below), heat is both stored and more rapidly and efficiently moved away from the electronic components and to an ambient environment. In an alternate embodiment, the temperature management material has an increased surface area and volume that is in direct contact with the outer casing, thus providing a larger thermal transfer area in order to rapidly pull heat away from the operable components and dissipate that heat to the outside environment or to a heat transfer substrate.

FIG. 4B shows another embodiment where there is no or little discrimination as to where the temperature management material 460 is dispersed on the PCB 400 such that both heat generating components and non-heat generating components are covered or otherwise coating with the temperature management material 460. While this embodiment necessarily uses a greater amount of the temperature management material, it is easier to form and manufacture since less precision is needed to disperse the material 460. Other advantages are also realized from the use of a greater amount of temperature management material such as impact resistance and water resistance. These are discussed in further detail below.

While FIGS. 4A and 4B are shown with the outer device casing 412 shown opposite the face of the PCB 400 that includes the temperature management material 450*a*, 450*b* and/or 460, it is contemplated that one or more of the PCB components (or just the heat generating components) may be placed on the opposite side of the PCB such 400 that the temperature management material is in direct contact with the outer casing 412, thereby increasing the thermal conductivity between the temperature regulating material and the outer casing 412.

Figure 5A:
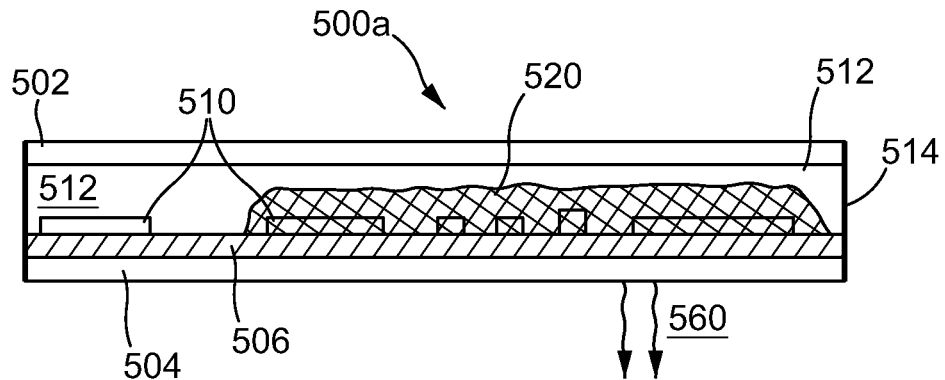
FIGS. 5A-5C show cross sections of several of the embodiments from FIGS. 4A-4C.
Figure 5B:
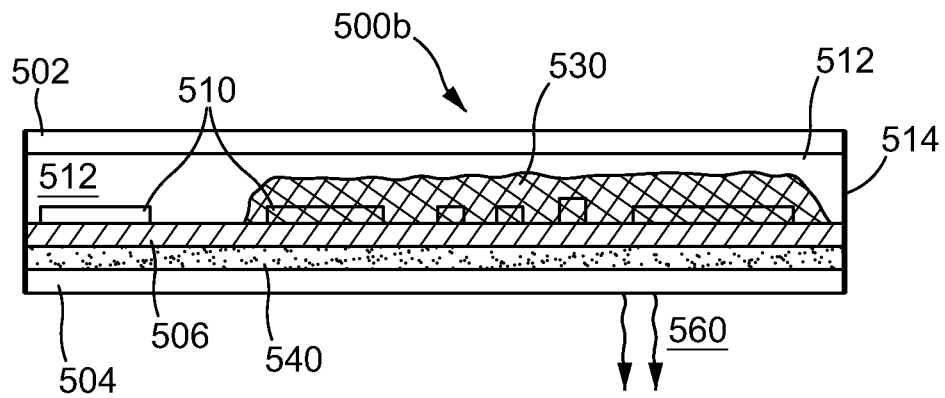
Figure 5C:
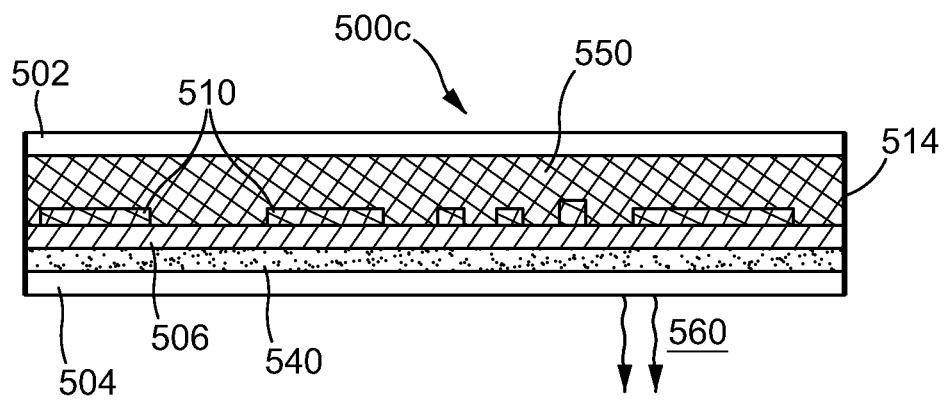

FIGS. 5A-5C illustrate various cross-sectional embodiments of an electronic device constructed in accordance with aspects of the present invention. First with reference to FIG. 5A, an electronic device 500*a* is shown with the major components in cross section. Device 500*a* includes a top display surface 502, a back surface 504 and a printed circuit board 506. Mounted on the printed circuit board 506 are one or more electronic components 510, some of which generate heat while in operation. As is customary in many electronic devices, a seal or other gasket type device 514 is located along the periphery of the device. In many known devices, heat generated by one or more of the electronic components 510 is dissipated via heat transfer or conduction by transferring to the back surface 504 and then to the environment as shown by reference number 560. In prior devices, electronic components 510 may be coupled with known heat transfer components, substrates, or other mechanical heat sinks to better move the heat from the components themselves to the outer environment at 560. In the embodiment of FIG. 5A and in conjunction with aspects of the present invention, temperature management material 520 is dispersed or otherwise coated or attached to the specific components 510 on PCB 506 that generate heat. The composition of the temperature management material 520 provides a mechanism to both store the heat generated by the components 510 and also to more quickly and efficiently move that heat away from the components and to the ambient environment at 560.

FIG. 5B shows another embodiment an electronic device 500*b* shown with the major components in cross section. Similar to the embodiment in FIG. 5A, device 500*b* includes a top display surface 502, a back surface 504 and a printed circuit board 506. Mounted on the printed circuit board 506 are one or more electronic components 510, some of which generate heat while in operation. A seal or other gasket type device 514 is located along the periphery of the device. Heat generated by one or more of the electronic components 510 is dissipated via heat transfer or conduction by transferring to the back surface 504 and then to the environment as shown by reference number 560. In the embodiment of FIG. 5B and in conjunction with aspects of the present invention, temperature management material 520 is dispersed or otherwise coated or attached to the specific components 510 on PCB 506 that generate heat. In addition, in the embodiment of FIG. 5B, a second temperature management material 540 is dispersed between the PCB and the back surface 504. The temperature management material 540 may be the same or a different composition or blend as the first temperature management material 520 as described in more detail in the sections that follow.

FIG. 5C shows another embodiment an electronic device 500*c* shown with the major components in cross section. Similar to the embodiments in FIGS. 5A and 5B, device 500*c* includes a top display surface 502, a back surface 504 and a printed circuit board 506. Mounted on the printed circuit board 506 are one or more electronic components 510, some of which generate heat while in operation. A seal or other gasket type device 514 is located along the periphery of the device. Heat generated by one or more of the electronic components 510 is dissipated via heat transfer or conduction by transferring to the back surface 504 and then to the environment as shown by reference number 560. In the embodiment of FIG. 5C and in conjunction with aspects of the present invention, temperature management material 550 completely fills the gaps left within the device that are typically found between the components on PCB 506 and either of the top or bottom surfaces. In this embodiment, all component surfaces are in contact with the temperature management material. In addition, in the embodiment of FIG. 5C, a second temperature management material 540 is dispersed between the PCB and the back surface 504. The temperature management material 540 may be the same or a different composition or blend as the first temperature management material 550 as described in more detail in the sections that follow.

Figure 6A:
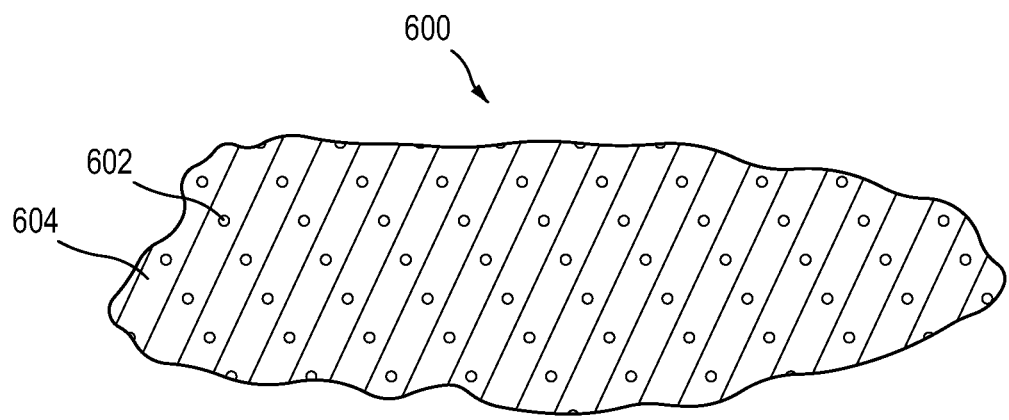
FIGS. 6A-6C show details of the embodiments of FIGS. 5A-5C.
Figure 6B:
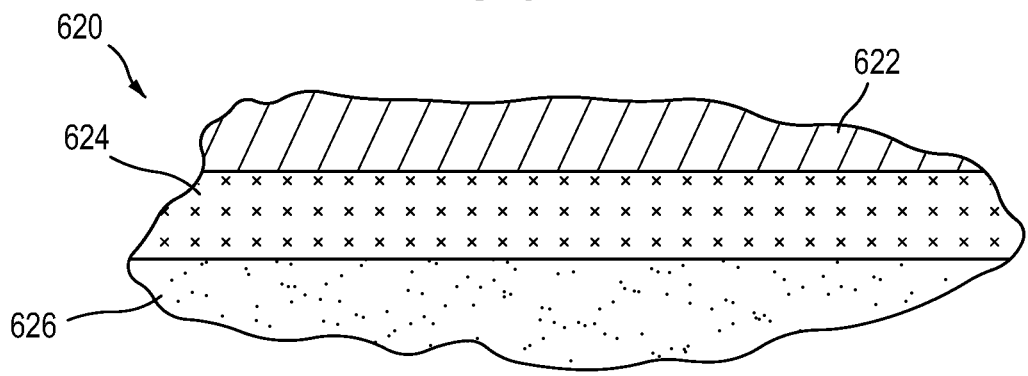
Figure 6C:
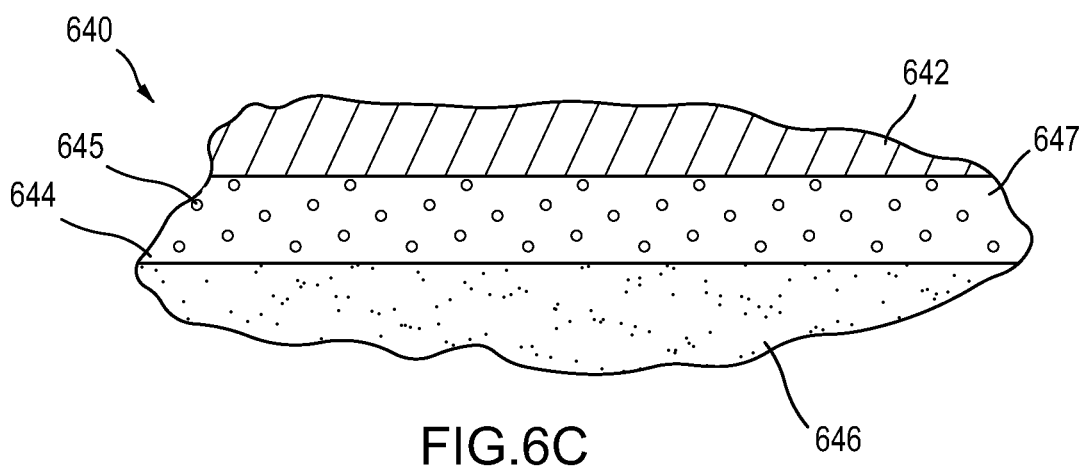

FIGS. 6A-6C show various embodiments of a temperature management material and the various components that may be used to form that material. In FIG. 6A a uniform mixture of a PCM 602 and a thermal conductive filler 604 is shown as forming the temperature management material 600. In the example of FIG. 6A the PCM 602 is a microencapsulated PCM (mCAP) but can also be a raw or otherwise unencapsulated PCM such as a pPCM (polymeric PCM) or a FP-PCM (functional polymeric PCM). However the phase change material is incorporated into the temperature management material 600, in the example of FIG. 6A, the temperature management material is a uniform substance with some level of homogeneity to the material. There are no specific layers within the example of FIG. 6A.

With reference to FIG. 6B, a temperature management material 620 is shown that includes several layers. A layer 622 is formed from a thermal conductive filler, a layer 624 is formed from a first phase change material, and a layer 626 is formed from a second phase change material. The layers 624 and 626 may each be any of an mPCM, pPCM, or FP-PCM or the layers 624 and 626 may be combinations or blends of one or more of these types of phase change materials. In addition, each of layer 624 and 626 can utilize any of the PCM materials discussed herein in various combinations that may be necessary to fit a specific temperature control scenario. For example, certain electronics applications may generate more heat, or have a steeper heating curve profile and thus warrant the use of PCMs that have higher latent heat values or higher PCM loading requirements in order to effectively manage the temperature changes that occur in those devices. Other applications may have more subtle temperature change profiles and not demand PCMs with such large latent heat values and can thus utilize lower loading amounts.

With reference to FIG. 6C, another temperature management material 640 is shown that also includes several layers. A layer 642 is formed from a thermal conductive filler, a layer 644 is formed from a first phase change material, and a layer 646 is formed from a second phase change material. As with the example of FIG. 6B, the layers 644 and 646 may each be any of an mPCM, pPCM, or FP-PCM or the layers 644 and 646 may be combinations or blends of one or more of these types of phase change materials. In addition, each of layer 644 and 646 can utilize any of the PCM materials discussed herein in various combinations that may be necessary to fit a specific temperature control scenario. In the embodiment and example of FIG. 6C, layer 644 is shown utilizing microcapsules 645. These microcapsules may be within a polymeric binder 647 (with or without its own PCM and latent heat qualities).

Figures 16A, 16B, 16C:
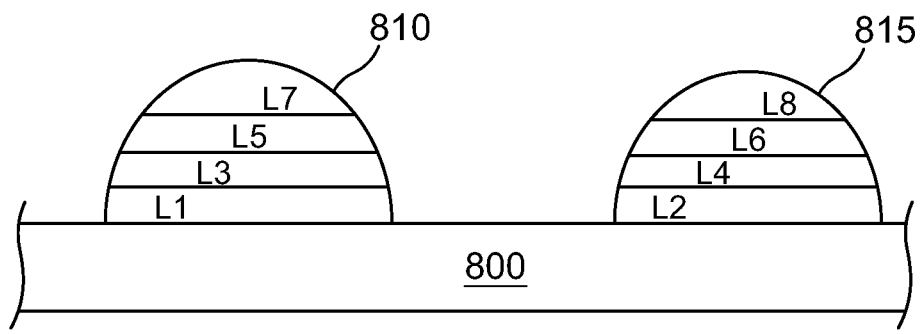
FIGS. 16A-16C show various layering embodiments that may be used in connection with aspects of the present invention.

FIGS. 16A-16C show other layering options that may be utilized in constructing the structure for temperature management and heat dissipation. As exemplified in FIGS. 16A-16C, any combination of these different layers are also possible. In FIGS. 16A-16C each of L1 through L8 represent different layers on a substrate or electronic components 800 or different regions within a discrete portion of a layer 810 and 815. It should be understood that many different combinations of these layers are possible and it is not intended to limit the invention to any of the physical structures depicted by FIGS. 16A-16C. These are merely representative of several of the possibilities.

Use of PCMs and Thermal Management Materials

The sections above describe various compositions and other materials that may be used in connection with the electronic structures and devices that may benefit from the temperature control and thermal management aspects of the present invention. However, by referring to any of the specific structural embodiments or any of the precise and specific chemical compositions (above or further in this disclosure), it is not intended to limit the scope of the claims to any one in particular. To the contrary, the specification is arranged such that one of skill in the art could combine one or more of the structures and electronic devices described herein with one or more of the chemical compositions described herein in order to create a device that worked for a specific purpose.

The compositions and other PCM materials described herein can be used in conjunction with various electronics and electrical articles such as conductors, heat sinks, semiconductors, transistors, integrated circuits, batteries, wiring, switches, capacitors, resistors, diodes, boards, coverings, motors, engines, etc. Further details of these structures are described in conjunction with FIGS. 1-6.

While the above description of phase change technology and the different types of chemicals and other materials useful in temperature regulation is generally applicable and relevant to aspects and embodiments of the present invention, there are other aspects and unique features that find particular relevance in electronics applications and promoting more efficient cooling in those electronics.

Thermal Management Materials (TMM) for Electronics Temperature Control

PCMs are very advantageous for use as thermal management materials in electronics in that the high crystallinity allows for a combination of good thermal conductivity, high latent heat capacity and energy absorption all leading to improved heat management, lower heat buildup, fewer problems and faster processor speeds.

Air is a very poor thermal conductor and therefore air spaces or air gaps anywhere within the TMM is not preferred. Air gaps such as between the electronic components and thermal management materials, cracks or voids within the TMM, voids or gaps between particles and the TMM composite or matrix material, etc. are all problematic for good thermal conductivity. For instance, attaching a heat sink or TMM to a semiconductor package requires that two solid surfaces be brought together into intimate contact. Unfortunately, no matter how well prepared, solid surfaces are never really flat or smooth enough to permit intimate contact. All surfaces have a certain roughness due to microscopic hills and valleys. Superimposed on this surface roughness is a macroscopic non-planarity in the form of a concave, convex or twisted shape. As two such surfaces are brought together, only the hills of the surfaces come into physical contact. The valleys are separated and form air-filled gaps. When two typical electronic component surfaces are brought together, less than one percent of the surfaces may make physical contact with the remainder (99%) of the surfaces separated by a layer of interstitial air. Some heat is conducted through the physical contact points, but much more has to transfer through the air gaps. Since air is a poor conductor of heat, it should be replaced by a more conductive material to increase the joint conductivity and thus improve heat flow across the thermal interface. The thermal management materials should have good rheological characteristics and surface wetting to have good "gap-filling" properties, i.e. the ability to flow, wetout and fill gaps, crevices, cracks, etc. to reduce air gaps and improve thermal movement. These TMM flow properties can be formulated into the material through the use of additives or designed into the TMM molecules. These materials described below are broadly referred to as thermal conductive fillers.

TMMs should also have good adhesive, tack or bonding properties to prevent the loose of contact between the TMM and the electronic components when the end device is dropped, damaged, impacted or exposed to high or low temperatures.

Current electronics thermal management materials have many disadvantages such as poor latent heat properties, poor heat sink properties in the appropriate temperature range, poor gap/void filling properties, poor rheology, etc.

Figure 21:
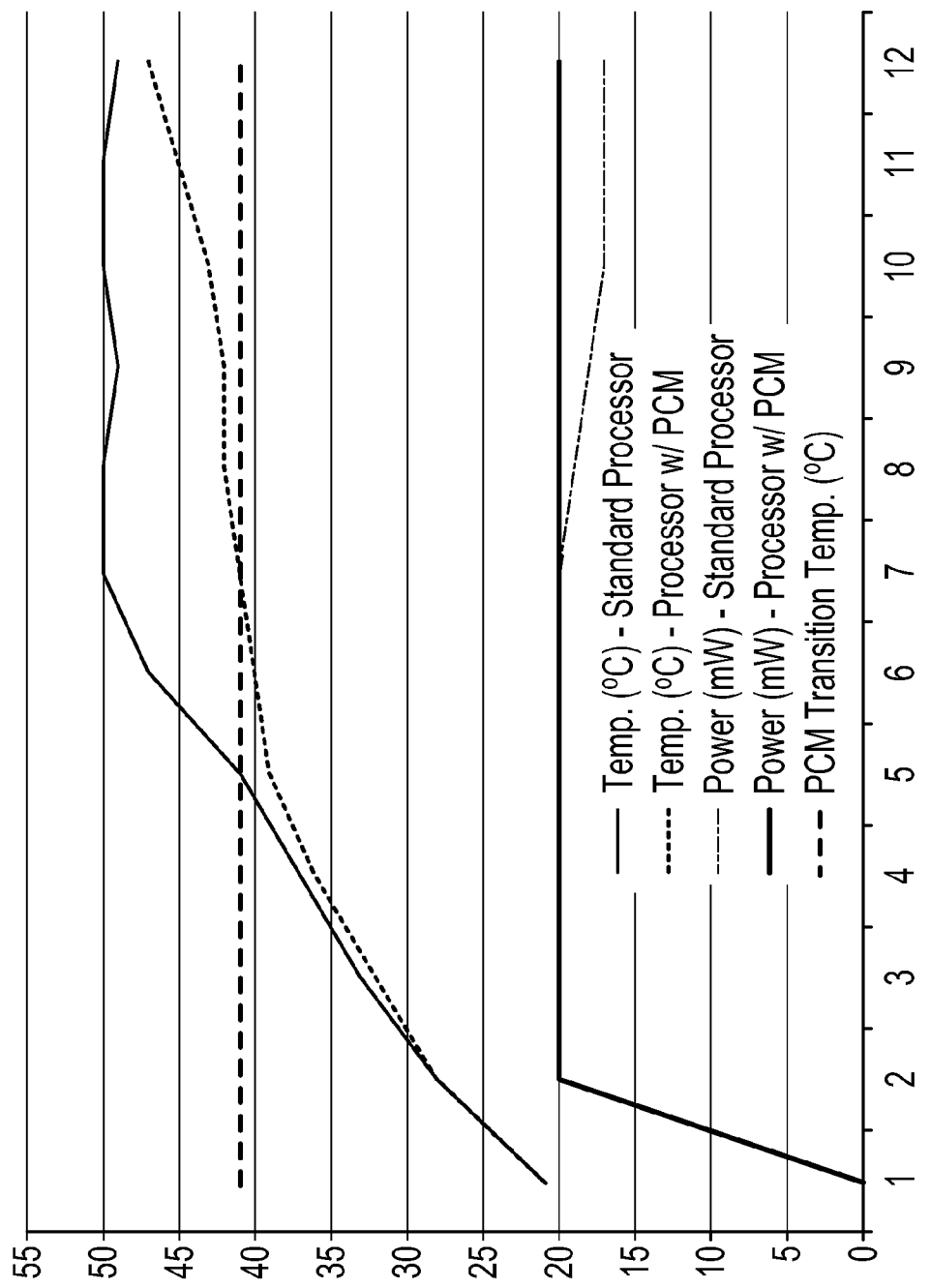
FIG. 21 shows a graph depicting processor temperature in relation to PCM transition temperature and standard power over time.
Figure 22:
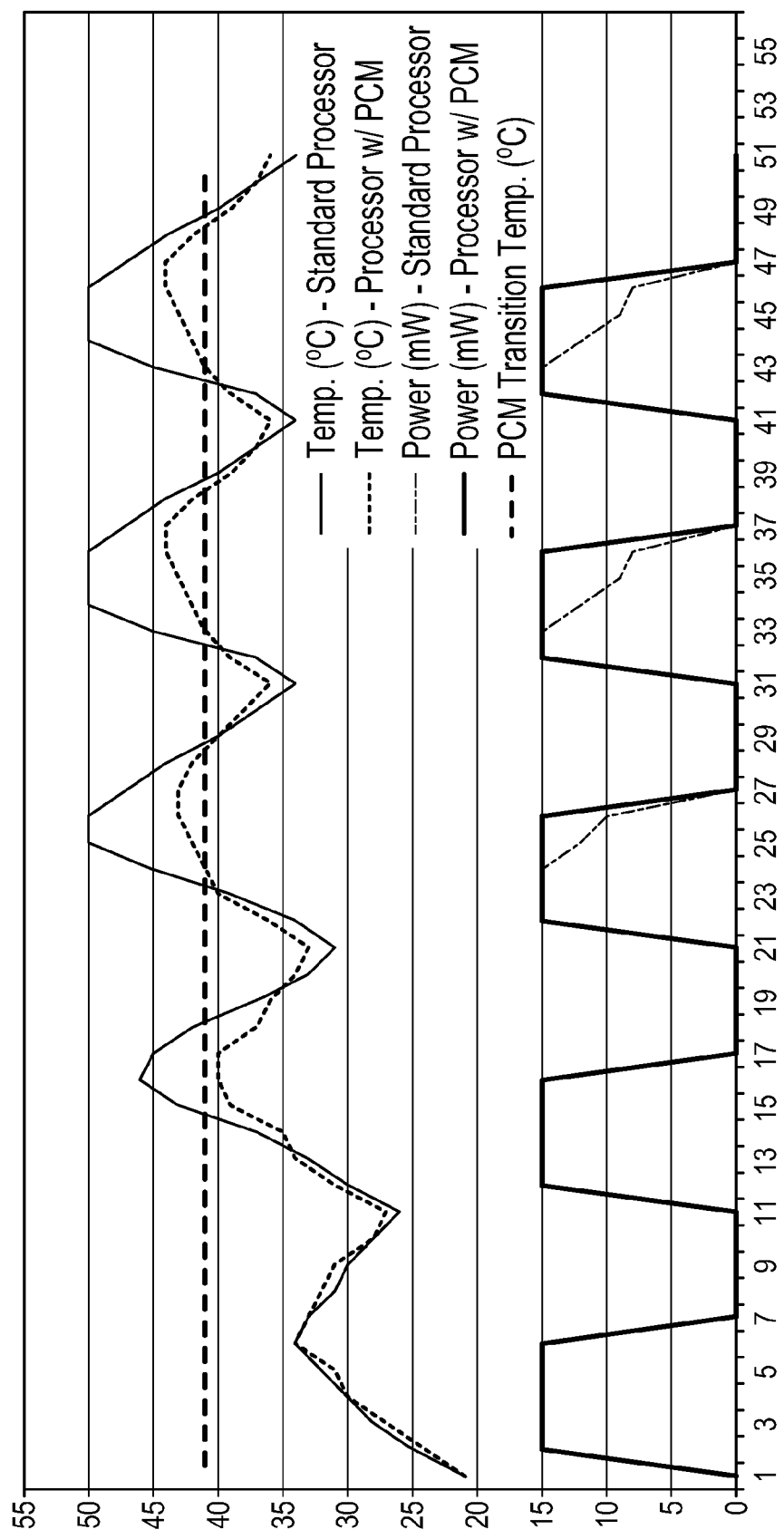
FIG. 22 shows another graph depicting processor temperature in relation to PCM transition temperature and transient temperature over time.

FIGS. 21 and 22 show graphs that illustrate the benefits of using aspects of the present invention in connection with electronics and the ability to moderate the buildup of heat within an electronic device. Temperature profiles and power profiles of a standard processor and a processor utilizing aspects of the present invention incorporating a PCM are shown in FIGS. 21 and 22. The PCM transition temperature is also shown for reference. FIG. 21 shows the results for a standard power measurement and FIG. 22 shows the results for a transient power measurement.

As described in general terms above and in the definition section, the term "phase change material" refers to a material that has the capability of absorbing or releasing heat to adjust heat transfer at or within a temperature stabilizing range. A temperature stabilizing range can include a specific transition temperature or a range of transition temperatures. In some instances, a phase change material can be capable of inhibiting heat transfer during a period of time when the phase change material is absorbing or releasing heat, typically as the phase change material undergoes a transition between two states. This action is typically transient and will occur until a latent heat of the phase change material is absorbed or released during a heating or cooling process. Heat can be stored or removed from a phase change material, and the phase change material typically can be effectively recharged by a source of heat or cold. For certain implementations, a phase change material can be a mixture of two or more materials. By selecting two or more different materials and forming a mixture, a temperature stabilizing range can be adjusted for any desired application. The resulting mixture can exhibit two or more different transition temperatures or a single modified transition temperature when incorporated in the articles described herein.

PCMs that can be used include various organic and inorganic substances. Organic PCMs may be preferred for the embodiments disclosed herein. Examples of phase change materials include hydrocarbons (e.g., straight-chain alkanes or paraffinic hydrocarbons, branched-chain alkanes, unsaturated hydrocarbons, halogenated hydrocarbons, and alicyclic hydrocarbons), alkanes, alkenes, alkynes, arenes, hydrated salts (e.g., calcium chloride hexahydrate, calcium bromide hexahydrate, magnesium nitrate hexahydrate, lithium nitrate trihydrate, potassium fluoride tetrahydrate, ammonium alum, magnesium chloride hexahydrate, sodium carbonate decahydrate, disodium phosphate dodecahydrate, sodium sulfate decahydrate, and sodium acetate trihydrate), waxes, oils, water, fatty acids (caproic acid, caprylic acid, lauric acid, myristic acid, palmitic acid, stearic acid, arachidic acid, behenic acid, lignoceric acid and cerotic acid, etc.), fatty acid esters (methyl caprylate, methyl caprate, methyl laurate, methyl myristate, methyl palmitate, methyl stearate, methyl arachidate, methyl behenate, methyl lignocerate, etc.), fatty alcohols (capryl alcohol, lauryl alcohol, myristyl alcohol, cetyl alcohol, stearyl alcohol, arachidyl alcohol, behenyl alcohol, lignoceryl alcohol, ceryl alcohol, montanyl alcohol, myricyl alcohol, and geddyl alcohol, etc.), dibasic acids, dibasic esters, 1-halides, primary alcohols, secondary alcohols, tertiary alcohols, aromatic compounds, clathrates, semiclathrates, gas clathrates, anhydrides (e.g., stearic anhydride), ethylene carbonate, methyl esters, polyhydric alcohols (e.g., 2,2-dimethyl-1,3-propanediol, 2-hydroxymethyl-2-methyl-1,3-propanediol, ethylene glycol, polyethylene glycol, pentaerythritol, dipentaerythritol, pentaglycerine, tetramethylol ethane, neopentyl glycol, tetramethylol propane, 2-amino-2-methyl-1,3-propanediol, monoaminopentaerythritol, diaminopentaerythritol, and tris(hydroxymethyl)acetic acid), sugar alcohols (erythritol, D-mannitol, galactitol, xylitol, D-sorbitol), polymers (e.g., polyethylene, polyethylene glycol, polyethylene oxide, polypropylene, polypropylene glycol, polytetramethylene glycol, polypropylene malonate, polyneopentyl glycol sebacate, polypentane glutarate, polyvinyl myristate, polyvinyl stearate, polyvinyl laurate, polyhexadecyl methacrylate, polyoctadecyl methacrylate, polyesters produced by polycondensation of glycols (or their derivatives) with diacids (or their derivatives), and copolymers, such as polyacrylate or poly(meth)acrylate with alkyl hydrocarbon side chain or with polyethylene glycol side chain and copolymers including polyethylene, polyethylene glycol, polyethylene oxide, polypropylene, polypropylene glycol, or polytetramethylene glycol), metals, and mixtures thereof. Any combination of natural alcohols, natural fatty acids, sugars, celluloses and natural glycols can be combined to yield PCMs. General formulas such as the following, where m or n can be 0-100:

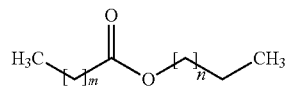

Polymerized alcohols such as polyvinyl alcohol, polyglycerols (mol. wt. of 100-10,000) or multifunctional alcohols esterified with various fatty acids.

Paraffinic PCMs may be a paraffinic hydrocarbons, that is, hydrocarbons represented by the formula $C_nH_{n+2}$, where n can range from about 10 to about 44 carbon atoms. PCMs useful in the invention include paraffinic hydrocarbons having 13 to 30 carbon atoms. For example, the melting point of a homologous series of paraffin hydrocarbons is directly related to the number of carbon atoms as shown in the following table:

| Paraffinic Hydrocarbon | No. of Carbon Atoms | Melting Point (° C.) |
|---|---|---|
| n-Octacosane | 28 | 61.4 |
| n-Heptacosane | 27 | 59.0 |
| n-Hexacosane | 26 | 56.4 |
| n-Pentacosane | 25 | 53.7 |
| n-Tetracosane | 24 | 50.9 |
| n-Tricosane | 23 | 47.6 |
| n-Docosane | 22 | 44.4 |
| n-Heneicosane | 21 | 40.5 |
| n-Eicosane | 20 | 36.8 |
| n-Nonadecane | 19 | 32.1 |
| n-Octadecane | 18 | 28.2 |
| n-Heptadecane | 17 | 22.0 |
| n-Hexadecane | 16 | 18.2 |
| n-Pentadecane | 15 | 10.0 |
| n-Tetradecane | 14 | 5.9 |
| n-Tridecane | 13 | −5.5 |

Use of Polymeric Phase Change Materials (pPCMs) and Functional Polymeric Phase Change Materials (fpPCMs) as TMMs Reactive Functional Groups Examples of suitable reactive functional groups include functional groups such as acid anhydride groups, amino groups, N-substituted amino groups and their salts, amide groups, imine groups, imide groups, azide groups, azo groups, amine-fromaldehyde groups, carbonyl groups, carboxy groups and their salts, cyclohexyl epoxy groups, epoxy groups, glycidyl groups, hydroxy groups, isocyanate groups, cyanate groups, urea groups, aldehyde groups, ketone groups, ester groups, ether groups, alkenyl groups, alkynyl groups, thiol groups, disulfide groups, silyl or silane groups, halogenated leaving groups, peroxide groups, salt groups, groups based on glyoxals, groups based on aziridines, groups based on active methylene compounds or other b-dicarbonyl compounds (e.g., 2,4-pentandione, malonic acid, acetylacetone, ethylacetone acetate, malonamide, acetoacetamide and its methyl analogues, ethyl acetoacetate, and isopropyl acetoacetate), halo groups, hydrides, or other polar or H bonding groups and combinations thereof.

Further details of the variety of examples of reactive functions and functional groups that may be used in accordance with one or more aspects of the present invention can be found in commonly owned and co-pending patent application Ser. Nos. 12/174,607 and 12/174,609, the details of which have been incorporated by reference into this disclosure. It should be clearly understood that by providing examples of specific compositions and methods in the later part of this description, applicant does not intend to limit the scope of the claims to any of those specific composition. To the contrary, it is anticipated that any combination of the functional groups, polymeric phase change materials, and articles described herein may be utilized to achieve the novel aspects of the present invention. The claims are not intended to be limited to any of the specific compounds described in this disclosure or any disclosure incorporated herein.

Polymeric Phase Change Materials and Reactivity

Several publications referenced herein deal with polymeric PCMs (P-PCM), which present an intermediate case between the solid-liquid PCMs and the solid-solid PCMs. P-PCMs are solid both prior to phase change and after it. The difference is in their degree of structure. At lower temperatures, that degree is greater than that at the elevated temperature, so that at a temperature of phase change, P-PCM converts from the more structured form into its less structured one. Typically, in the more structures form, some sections of the polymer are better aligned and more closely compacted. The better aligned sections resemble crystallites. Therefore, the phase change on heating P-PCM is also referred to as change from a more crystallized form to a less crystallized form. Differently put, at the elevated temperatures (above the transition temperature), P-PCMs are essentially amorphous. At the lower temperatures (below the transition temperature) they have a degree of crystallinity. Similarly, the changes on heat absorption and on heat release could be referred to as decrystallization and recrystallization, respectively. The related enthalpy could also be referred to as enthalpy of decrystallization.

Typically, P-PCMs have sections that are capable of being better aligned and more closely compacted. Such sections could be referred to as crystallizable sections. In some embodiments, the functional polymeric PCM described herein in accordance with various aspects of the present invention comprises at least one such crystallizable section. According to an embodiment of the invention, the polymer comprises a backbone and side chains. Preferably, the side chains form a crystallizable section.

Functional Polymeric Phase Change Materials (FP-PCMs)

As used here, the term "reactive function" means a chemical group (or a moiety) capable of reacting with another chemical group to form a covalent or an electrovalent bond, examples of which are given above. Preferably, such reaction is doable at relatively low temperatures, e.g. below 200° C., more preferably below 100° C., and at conditions suitable to handle delicate substrates, e.g. electronic components or other delicate substrates. As used herein the term "carrying a function" and obvious variations of this term, means having a function bound to it, e.g. covalently or electrovalently.

The reactive function could be placed on (carried on or covalently bound or electrovalently bonded to) any part of the FP-PCM molecule, e.g. on a side chain, along the backbone chain or on at least one of the ends of the backbone chain or side chain. According to various embodiments of the invention, the FP-PCM comprises multiple reactive functions and those functions are spread at substantially regular intervals, stereospecifically (i.e. isotactic, syndiotactic, or atactic, etc.) or randomly along the molecule, e.g. along the backbone chain. Any combination of these is also possible.

The molecular weight of an FP-PCM is preferably of at least 500 Daltons, more preferably at least 2000 Daltons. Preferably the weight of the crystallizable section forms at least 20%, more preferably at least 50%, and most preferably at least 70% of the total weight of the FP-PCM.

The molecular weight can be monodisperse or polydisperse where all the polymer molecules are the same molecular weight or different molecular weights as defined by the polydispersity. Mn is the number average molecular wt., Mw is weight average molecular wt. and the molecular wt. polydispersity (Pd) is defined by Mn/Mw. A Pd of 1.0 means all polymer molecules are monodisperse and have the same molecular weight. Aspects of a composition constructed in accordance with the present invention have a Pd of between 1.0-100 and preferably between 1.0-10.0, most preferably between 1.0-5.0.

Aspects of the present invention include utilizing a PCM with a single phase change temperature or multiple such temperatures. According to one embodiment, a FP-PCM has at least one phase change temperature in the range between $-10°$ C. and 300° C., preferably between 10° C. and 100° C. and a phase change enthalpy of at least 25 J/g. In some instances, a phase change material can have a latent heat that is at least about 1 Joule per gram, at least about 5 Joules per gram (J/g), at least about 10 J/g, at least about 20 J/g, at least about 30 J/g, at least about 40 J/g, at least about 50 J/g, at least about 60 J/g, at least about 70 J/g, at least about 80 J/g, at least about 90 J/g, or at least about 100 J/g. Thus, for example, the phase change material can have a latent heat from about 5 J/g to about 400 J/g, 10 J/g to about 100, J/g, 20 J/g to about 100 J/g, from about 60 J/g to about 400 J/g, from about 80 J/g to about 400 J/g, or from about 100 J/g to about 400 J/g.

The phase change at each of the temperatures has its own enthalpy, so that according to some of the embodiments, the composition used has a single phase change enthalpy and, according to other embodiments, multiple such enthalpies. As used herein, the term "overall phase change enthalpy" refers to the enthalpy of phase change in the case of a structure with a single phase change temperature and to the combined enthalpies in case of multiple phase change temperatures. According to an embodiment of the invention, the composition has an overall phase change enthalpy of at least 2.0 Joules/gram (J/g) or 10 J/m2.

An FP-PCM used in accordance with various aspects of the present invention can have a designed stereospecificty. The FP-PCM can be atactic, isotactic or syndiotactic. The FP-PCM can be L-, D- or Meso-.

According to an embodiment of the invention, the FP-PCM has hydrophilic side chains. According to another embodiment of the invention the FP-PCM has hydrophobic side chains. Examples of side chains or monomers which can provide these side chains are in the table below.

| | Long Chain Group Containing Monomers |
|---|---|
| R = | Monomers |
| Long chain n-alkyl crystallizible segments | $CH_2$=$CR'CO_2(CH_2)_nCH_3$  R' = $CH_3$ or H, n = 10-25<br>Long chain n-alkyl acrylates or methacrylates such as stearyl acrylate or stearyl methacrylate,<br>$CH_2$=$CH$—$O$—$(CH_2)_nCH_3$, n = 10-25<br>Long chain n-alkyl vinyl ethers such as stearyl vinyl ether,<br>$CH_2$=$CH$—$O$—$CO$—$(CH_2)_nCH_3$, n = 10-25,<br>Long chain n-alkyl vinyl esters such as vinyl stearate,<br>$CH_2$=$C$—$CO$—$(CH_2)_nCH_3$, n = 10-25,<br>Long chain n-alkyl vinyl ketoness,<br>$CH_2$=$CH$—$(CH_2)_nCH_3$, n = 4-25<br>Long chain n-alkyl olefins such as undecene,<br>or any other long chain n-alkyl containing unsaturated polymerizable monomer |
| Long chain crystallizible glycol segments | $CH_2$=$CR'CO_2(CH_2CH_2O)_nOX$  R' = $CH_3$ or H,<br>n = 1-1,000, X = $CH_3$ or H<br>Glycol based acrylates or methacrylates such as polyethyleneglycol methacrylate, polyethyleneglycol acrylate, $CH_2$=$CH$-$(CH_2)_m$—$O$—$((CH_2)_nO)_zOX$ |

-continued

Long Chain Group Containing Monomers

| R = | Monomers |
|---|---|
| | m = 0-4, n = 1-10, z = 1-1000, X = $CH_3$ or H Glycol based vinyl ethers such as polyethyleneglycol monovinyl ether |
| | $CH_2=CH-O-CO-((CH_2)_nO)_zOX$  n = 1-10, z = 1-1000, X = $CH_3$ or H glycol based vinyl esters such as polyethyleneglycol monovinyl ester or any unsaturated polymerizable hydroxyl functional monomer |

Hydrocarbons—Functional groups that vary based upon the number and order of π bonds impart different chemistry and polarity. Each listing below contains C—H bonds, but each one differs in type (and scope) of reactivity.

| Chemical class | Group | Formula | Structural Formula |
|---|---|---|---|
| Alkene | Alkenyl | $R_2C=CR_2$ | $R_1, R_2, R_3, R_4$ |
| Alkyne | Alkynyl | RC≡CR' | R—≡—R' |
| Benzene derivative | Phenyl | $RC_6H_5$ RPh | R—⌬ |
| Toluene derivative | Benzyl | $RCH_2C_6H_5$ RBn | R—CH2—⌬ |

Groups containing halogens—Haloalkanes are a class of molecule that is defined by a carbon-halogen bond. This bond can be relatively weak (in the case of an iodoalkane) or quite stable (as in the case of a fluoroalkane). In general, with the exception of fluorinated compounds, haloalkanes readily undergo nucleophilic substitution reactions or elimination reactions. The substitution on the carbon, the acidity of an adjacent proton, the solvent conditions, etc. all can influence the outcome of the reactivity.

| Chemical class | Group | Formula | Structural Formula |
|---|---|---|---|
| haloalkane | halo | RX | R—X |
| fluoroalkane | fluoro | RF | R—F |
| chloroalkane | chloro | RCl | R—Cl |
| bromoalkane | bromo | RBr | R—Br |
| iodoalkane | iodo | RI | R—I |

In addition other crystallizable sections of P-PCMs are contemplated, including radicals of fatty acids, radicals of long-chain dicarboxylic acids, radicals of fatty alcohols, radicals of dialcohols, polyester-polycarboxylic or as previously described.

While each of the FP-PCM molecules carries at least one reactive function, large FP-PCM molecules may carry multiple reactive functions. According to an embodiment an FP-PCM carries at least one reactive function per 10,000 Daltons of the molecular weight and preferably two reactive functions.

In various embodiments, the functions are shown along the backbone, but that is only one option. As indicated above, the functions could also be placed at the end(s) of the backbone, on the side chains and any combination of those. Each FP-PCM may have a single or multiple reactive functions. FP-PCM may also carry multiple reactive functions of a similar chemical nature or a combination of reactive functions of different chemical nature.

As indicated, the reactive function of the FP-PCM should be capable of forming covalent or electrovalent bonds with various articles, compounds and other molecules, commonly referred to here as base materials or substrates. Examples of reactive functions capable of forming covalent bonds are acid anhydride groups, amino groups, N-substituted amino groups and their salts, amide groups, imine groups, imide groups, azide groups, azo groups, amine-fromaldehyde groups, carbonyl groups, carboxy groups and their salts, cyclohexyl epoxy groups, epoxy groups, glycidyl groups, hydroxy groups, isocyanate groups, cyanate groups urea groups, aldehyde groups, ketone groups, ester groups, ether groups, alkenyl groups, alkynyl groups, thiol groups, disulfide groups, silyl or silane groups, halogenated leaving groups, peroxide groups, salt groups, groups based on glyoxals, groups based on aziridines, groups based on active methylene compounds or other b-dicarbonyl compounds (e.g., 2,4-pentandione, malonic acid, acetylacetone, ethylacetone acetate, malonamide, acetoacetamide and its methyl analogues, ethyl acetoacetate, and isopropyl acetoacetate), halo groups, hydrides, or other polar or H bonding groups and combinations thereof. FP-PCMs capable of forming covalent bonds are disclosed in commonly assigned U.S. patent application Ser. No. 12/174,607, the teaching of which is incorporated herein by reference in its entirety. Examples of reactive functions capable of forming electrovalent bonds are acid functions, basic functions, positively charged complexes and negatively charged complexes. FP-PCM capable of forming electrovalent bonds such as disclosed in commonly assigned U.S. patent application Ser. No. 12/174,609, the teaching of which is incorporated herein by reference in its entirety. For example, the following are examples of suitable reactive functional groups:

According to another embodiment, the FP-PCM carries reactive functions as its end group or groups. Examples of such FP-PCMs are α,ω-diglycidyl polyesters, α,ω-diglycidyl ethers, α,ω-diisocyanates, α,ω-diureas, α,ω-dialkenes, α-glycidyl polyesters, α-glycidyl ethers, α-ureas and α-isocyanates. (See e.g. the structures depicted in FIGS. 7-10

Groups containing oxygen—Compounds that contain C—O— bonds each possess differing reactivity based upon the location and hybridization of the C—O— bond, owing to the electron-withdrawing effect of $sp^2$ hybridized oxygen and the donating effects of $sp^3$ hybridized oxygen.

| Chemical class | Group | Formula | Structural Formula |
|---|---|---|---|
| Acyl halide | Haloformyl | RCOX | R—C(=O)—X |
| Alcohol | Hydroxyl | ROH | R—O—H |

-continued

| Chemical class | Group | Formula | Structural Formula |
|---|---|---|---|
| Ketone | Carbonyl | RCOR' |  |
| Aldehyde | Aldehyde | RCHO |  |
| Carbonate | Carbonate ester | ROCOOR | 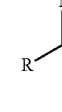 |
| Carboxylate | Carboxylate | RCOO⁻ | 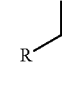 |
| Carboxylic acid | Carboxyl | RCOOH | 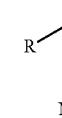 |
| Ether | Ether | ROR' | $R\diagdown O\diagdown R^+$ |
| Ester | Ester | RCOOR' | 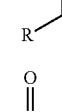 |
| Hydroperoxide | Hydroperoxy | ROOH | 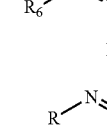 |
| Peroxide | Peroxy | ROOR |  |

Groups containing nitrogen—Compounds that contain Nitrogen in this category may contain C—O— bonds, such as amides.

| Chemical class | Group | Formula | Structural Formula |
|---|---|---|---|
| Amide | Carboxamide | RCONR$_2$ |  |
| Amines | Primary amine | RNH$_2$ |  |
|  | Secondary amine | R$_2$NH | 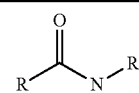 |
|  | Tertiary amine | R$_3$N |  |
|  | 4° ammonium ion | R$_4$N$^+$ |  |
| Imine | Primary ketimine | RC(=NH)R' | |
|  | Secondary ketimine | RC(=NR)R' | |
|  | Primary aldimine | RC(=NH)H | |
|  | Secondary aldimine | RC(=NR')H | |
| Imide | Imide | RC(=O)NC(=O)R' | |
| Azide | Azide | RN$_3$ | |
| Azo compound | Azo (Diimide) | RN$_2$R' | |
| Cyanates | Cyanate | ROCN | |
|  | Isocyanide | RNC | |
| Isocyanates | Isocyanate | RNCO | |
|  | Isothiocyanate | RNCS | |
| Nitrate | Nitrate | RONO$_2$ | |
| Nitrile | Nitrile | RCN | |
| Nitrite | Nitrosooxy | RONO | |

-continued

| Chemical class | Group | Formula | Structural Formula |
|---|---|---|---|
| Nitro compound | Nitro | $RNO_2$ | R—N⁺(=O)(O⁻) |
| Nitroso compound | Nitroso | RNO | R—N=O |
| Pyridine derivative | Pyridyl | $RC_5H_4N$ | (4-pyridyl, 3-pyridyl, and 2-pyridyl structures) |

Groups containing phosphorus and sulfur—Compounds that contain sulfur and phosphorus exhibit unique chemistry due to their varying polarity and ability to form more bonds than nitrogen and oxygen, their lighter analogues on the periodic table.

| Chemical class | Group | Formula | Structural Formula |
|---|---|---|---|
| Phosphine | Phosphino | $R_3P$ | $R_1$—P($R_2$)—$R_3$ |
| Phosphodiester | Phosphate | $HOPO(OR)_2$ | HO—P(=O)(O—$R_1$)(O—$R_2$) |
| Phosphonic acid | Phosphono | $RP(=O)(OH)_2$ | R—P(=O)(OH)(OH) |
| Phosphate | Phosphate | $ROP(=O)(OH)_2$ | R—O—P(=O)(OH)(OH) |
| Sulfide or thioether | | RSR' | R—S—R' |
| Sulfone | Sulfonyl | $RSO_2R'$ | R—S(=O)(=O)—R' |
| Sulfonic acid | Sulfo | $RSO_3H$ | R—S(=O)(=O)—OH |
| Sulfoxide | Sulfinyl | RSOR' | R—S(=O)—R' |

-continued

| Chemical class | Group | Formula | Structural Formula |
|---|---|---|---|
| Thiol | Sulfhydryl | RSH | R—S—H |
| Thiocyanate | Thiocyanate | RSCN | R—S—C≡N |
| Disulfide | Disulfide | RSSR' | R—S—S—R' |

Other chemical classes include Organosilanes, Siloxides, Silyl halides, Silyl hydrides, Hydrosilylation, Silenes, Siloles, and Hypercoordinated silicon.

According to another embodiment, the functional polymeric phase change material may also be chemically bound to the substrate. Binding may be one of covalent binding, electrovalent binding, direct binding, or binding via a connecting compound. According to another embodiment, binding is such as the one resulting from a reaction between a reactive function of the FP-PCM and a reactive function of the substrate, preferably the binding is a result of such reaction. The substrate can be selected from the group consisting of plastic or polymeric layers such as plastic films, plastic sheets, laminates or combinations of above, metals, composites, other polymers, carbons, ceramics, glass, fiberglass or other known materials used in the construction of electronics.

The FP-PCM can be implemented as a coating, laminate, infusion, treatment or ingredient in a coating, laminate, infusion, treatment that is formed adjacent to, on or within the substrate using any suitable coating, laminating, infusion, etc. technique. During use, the FP-PCM can be positioned so that it is adjacent to an internal compartment, thus serving as an inner coating. It is also contemplated that the FP-PCM can be positioned so that it is exposed to an outside environment, thus serving as an outer coating. The FP-PCM covers at least a portion of the substrate. Depending on characteristics of the substrate or a specific coating technique that is used, the FP-PCM can penetrate below the top surface and permeate at least a portion of the substrate. While two layers are described, it is contemplated that the article can include more or less layers for other implementations. In particular, it is contemplated that a third layer can be included so as to cover at least a portion of a bottom surface of the substrate. Such a third layer can be implemented in a similar fashion as the FP-PCM or can be implemented in another fashion to provide different functionality, such as water repellency, stain resistance, stiffness, impact resistance, etc.

In one embodiment, the FP-PCM is blended with a binder which may also contain a set of microcapsules that are dispersed in the binder. The binder can be any suitable material that serves as a matrix within which the FP-PCM and possibly also the microcapsules are dispersed, thus offering a degree of protection to the FP-PCM and microcapsules against ambient or processing conditions or against abrasion or wear during use. For example, the binder can be a polymer or any other suitable medium used in certain coating, laminating, or adhesion techniques. For certain implementations, the binder is desirably a polymer having a glass transition temperature ranging from about −110° C. to about 100° C., more preferably from about −110° C. to about 40° C. While a polymer that is water soluble or water dispersible can be particularly desirable, a polymer that is water insoluble or slightly water soluble can also be used as the binder for certain implementations.

The selection of the binder can be dependent upon various considerations, such as its affinity for the FP-PCM, PCM and/or microcapsules or the substrate, its ability to modify heat transfer, its breathability, its flexibility, its softness, its water absorbency, its coating-forming ability, its resistance to degradation under ambient or processing conditions, and its mechanical strength. In particular, for certain implementations, the binder can be selected so as to include a set of functional groups, acid anhydride groups, amino groups, N-substituted amino groups and their salts, amide groups, imine groups, imide groups, azide groups, azo groups, aminefromaldehyde groups, carbonyl groups, carboxy groups and their salts, cyclohexyl epoxy groups, epoxy groups, glycidyl groups, hydroxy groups, isocyanate groups, cyanate groups urea groups, aldehyde groups, ketone groups, ester groups, ether groups, alkenyl groups, alkynyl groups, thiol groups, disulfide groups, silyl or silane groups, halogenated leaving groups, peroxide groups, salt groups, groups based on glyoxals, groups based on aziridines, groups based on active methylene compounds or other b-dicarbonyl compounds (e.g., 2,4-pentandione, malonic acid, acetylacetone, ethylacetone acetate, malonamide, acetoacetamide and its methyl analogues, ethyl acetoacetate, and isopropyl acetoacetate), halo groups, hydrides, or other polar or H bonding groups and combinations thereof.

These functional groups can allow chemical bonding to a complementary set of functional groups included in either of, or any of, the FP-PCM, the PCM, the thermal conductive particles, the microcapsules and the substrate, thereby enhancing durability of the article during processing or during use. Thus, for example, the binder can be a polymer that includes a set of epoxy groups, which can chemically bond to a set of carboxy groups included in the FP-PCM, PCM, the thermal conductive particles, and/or the microcapsules. As another example, the binder can be a polymer that includes a set of isocyanate groups or a set of amino groups, which can chemically bond with those carboxy groups included in the FP-PCM, PCM, the thermal conductive particles, microcapsules, or substrate.

In some instances, a set of catalysts can be added when forming the coating composition. Such catalysts can facilitate chemical bonding between complementary functional groups, such as between those included in the binder and those included in the microcapsules. Examples of materials that can be used as catalysts include boron salts, hypophosphite salts (e.g., ammonium hypophosphite and sodium hypophosphite), phosphate salts, tin salts (e.g., salts of $Sn^{+2}$ or $Sn^{+4}$, such as dibutyl tin dilaurate and dibutyl tin diacetate), and zinc salts (e.g., salts of $Zn^{+2}$). A desirable amount of a tin salt or a zinc salt that is added to the coating composition can range from about 0.001 to about 1.0 percent by dry weight, such as from about 0.01 to about 0.1 percent by dry weight. A desirable amount of a boron salt or a phosphate salt that is added to the coating composition can range from about 0.1 to about 5 percent by dry weight, such as from about 1 to about 3 percent by dry weight. Other examples of materials that can be used as catalysts include alkylated metals, metal salts, metal halides, and metal oxides, where suitable metals include Li, Be, Na, Mg, K, Ca, Rb, Sr, Ti, V, Mn, Fe, Co Ni, Cu Zn Ga, Ge As, Se, Al, Y, Zr, Nb, Mo, Ru, Rh, Pd, Ag, Cd, In, Sn, Sb, Te, Cs, Ba, La, Hf, Ta, W, Re, Os, Ir, Pt, Au, Hg, Tl, Pb, Bi, Po, A Ra, Ac, Ce, Nd, Pm, Sm, Eu, Gd, Tb, Dy, Ho, Er, Tm, Yb, Lu, Th, Pa, U, Pu, etc. These metals and their compounds can be used singly or blended. Organic acids and bases, such as those based on sulfur (e.g., sulfuric), nitrogen (e.g., nitric), phosphorous (e.g., phosphoric), or halides (e.g., F, Cl, Br, and I), can also be used as catalyst. Further examples of materials that can be used as catalysts include acids such as citric acid, itaconic acid, lactic acid, fumaric acid, and formic acid.

Bonds between substrate, functional phase change material, binder, PCM, the thermal conductive particles, and/or microcapsules are, according to various embodiments, covalent, electrovalent or various combinations of those. Binding could be direct or indirect, e.g. via a connecting compound. According to some embodiments, the connecting compound is selected from a group consisting of functional polymeric phase change material and microcapsules. According to another embodiment, the functional polymeric phase change material forms a binder for at least a portion of a second PCM.

According to another embodiment, the reactive function of the FP-PCM can be converted into another reactive function, which is more suitable for reacting with particular substrates.

According to another embodiment, the reactive function of the FP-PCM could be of various chemical nature. For example, reactive functions capable of reacting and forming covalent or electrovalent bonds with reactive functions of various substrates, e.g. metals, plastics, other electronic components and thermal interface materials.

According to another embodiment of the invention, the reactive function can be any of the following: 1) glycidyl or epoxy such as from glycidyl methacrylate or glycidyl vinyl ether; 2) anhydride such as from maleic anhydride or itaconic anhydride; 3) isocyanate such as from isocyanato methacrylate, TMI® from Cytec Ind. or blocked isocyanates such as 2-(0-[1'-methylproplyideneamino]carboxyamino)ethyl methacrylate; 4) amino or amine-formaldehyde such as from N-methylolacrylamide; and 5) silane such as from methacryloxypropyltriethoxysilane. Such reactive functions can react with OH functional groups of cellulosic based materials; with hydroxyl or carboxyl groups of polyester based materials and with amide functional groups of nylon functional resins.

According to still another embodiment of the invention, the reactive function is a double bond, capable of binding to another double bond, providing a cross-linking point, a polymerization point, etc. The above described reactions, linking or crosslinking reactions can be triggered by any energy such as light, UV, IR, heat, thermal, plasma, sound, microwave, radiowave, pressure, x-ray, gamma, or any form of radiation or energy. They can be triggered by chemical reactions such as by the use of free radical, anionic or cationic catalysts or initiators.

The reactive function of the FP-PCM can assume a positive charge and bind electrovalently with a negative charge on the substrate. According to another embodiment, the reactive function can assume a negative charge and bind electrovalently with a positive charge on the substrate. According to another embodiment, the reactive functions of both the substrate and the FP-PCM and/or microcapsule are negatively charged and binding is via a multivalent cation, which acts as a cross-linker. According to still another embodiment, the reactive functions of both the substrate and the FP-PCM and/or microcapsule are positively charged and binding is via a multivalent anion, which acts as a cross-linker. The cross-linking multivalent cation, anion or both could be organic or inorganic.

Examples of FP-PCM Structures

Figure 7:
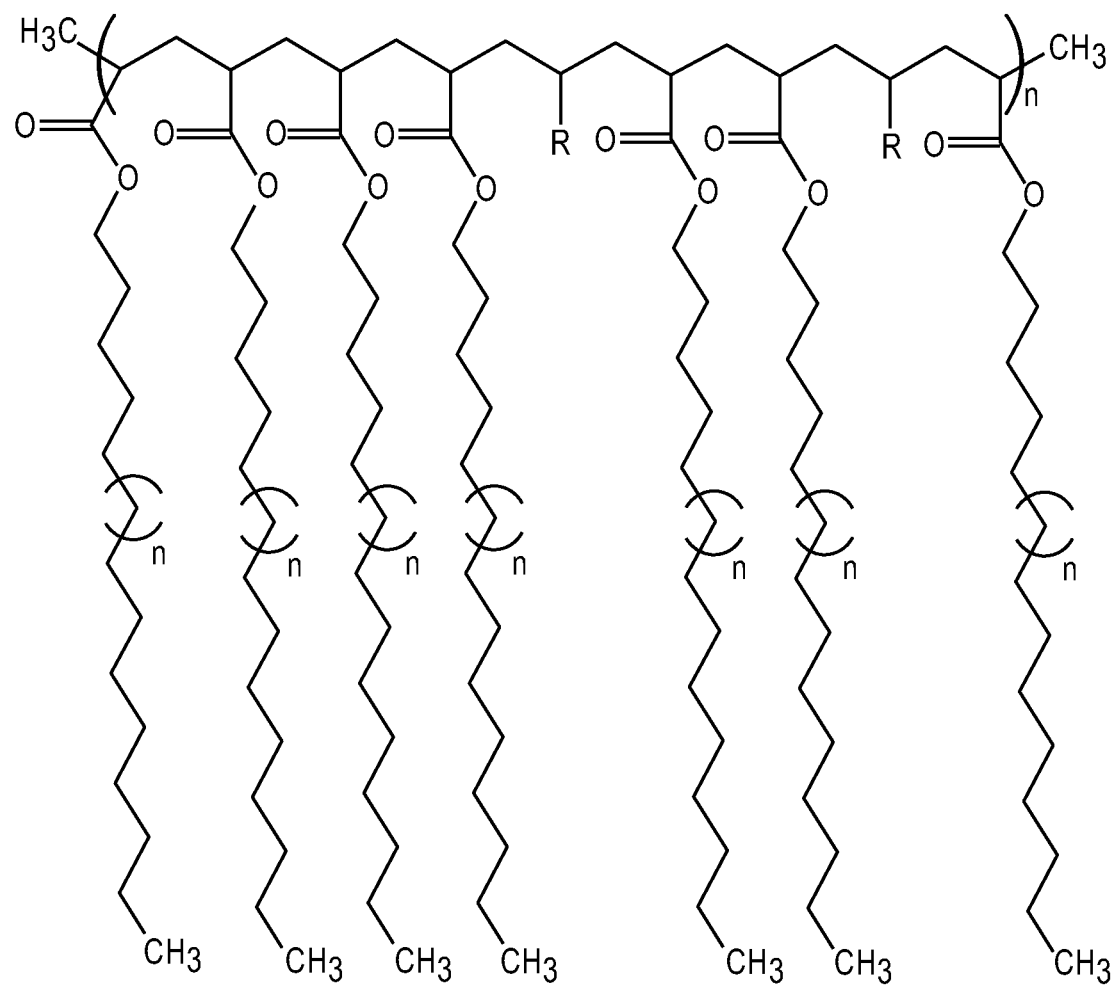
FIGS. 7-10D show various embodiments of functional polymeric PCMs.
Figure 7A:
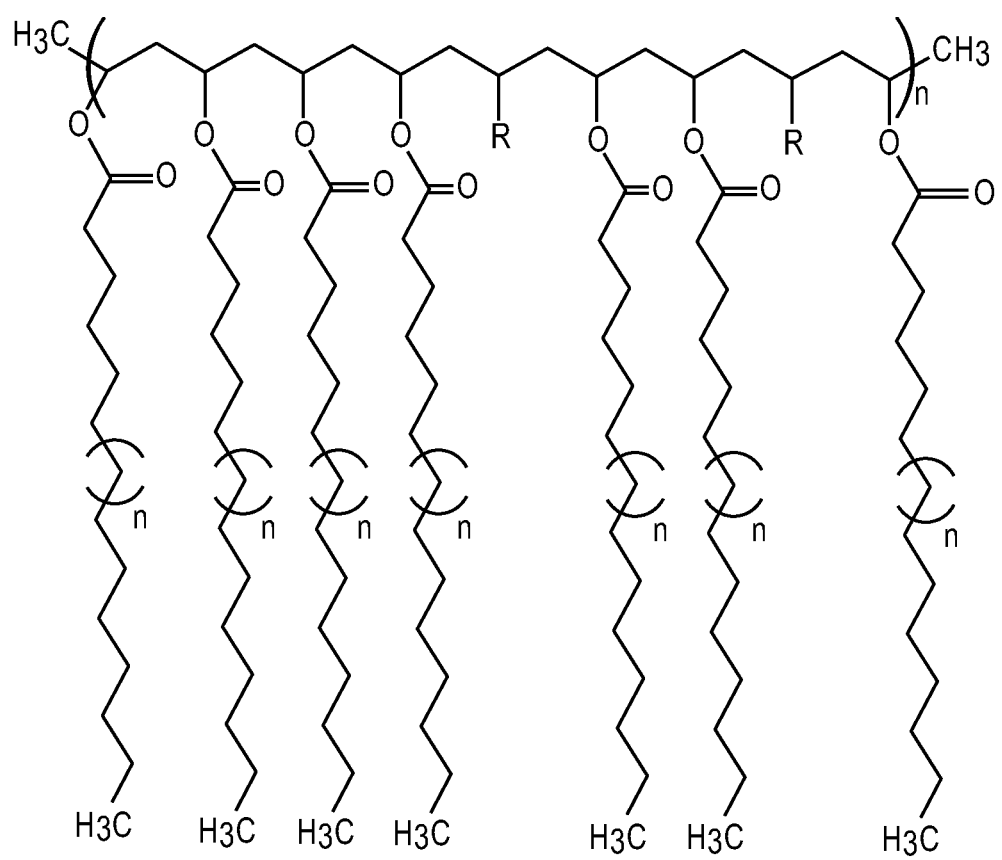
Figure 7B:
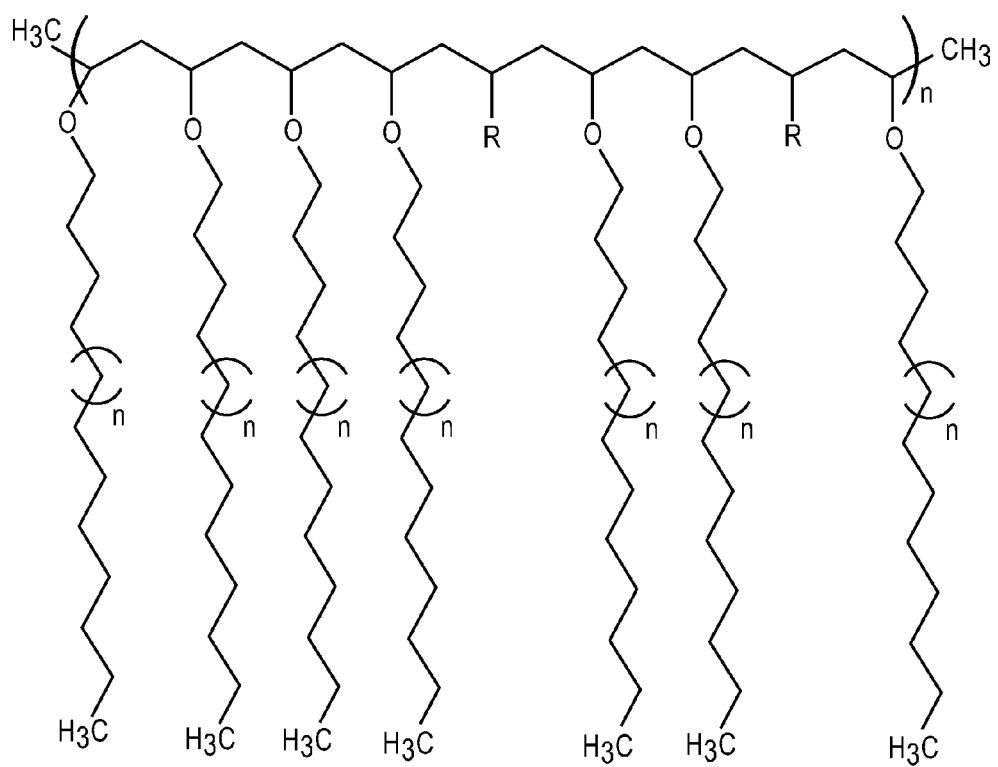
Figure 7C:
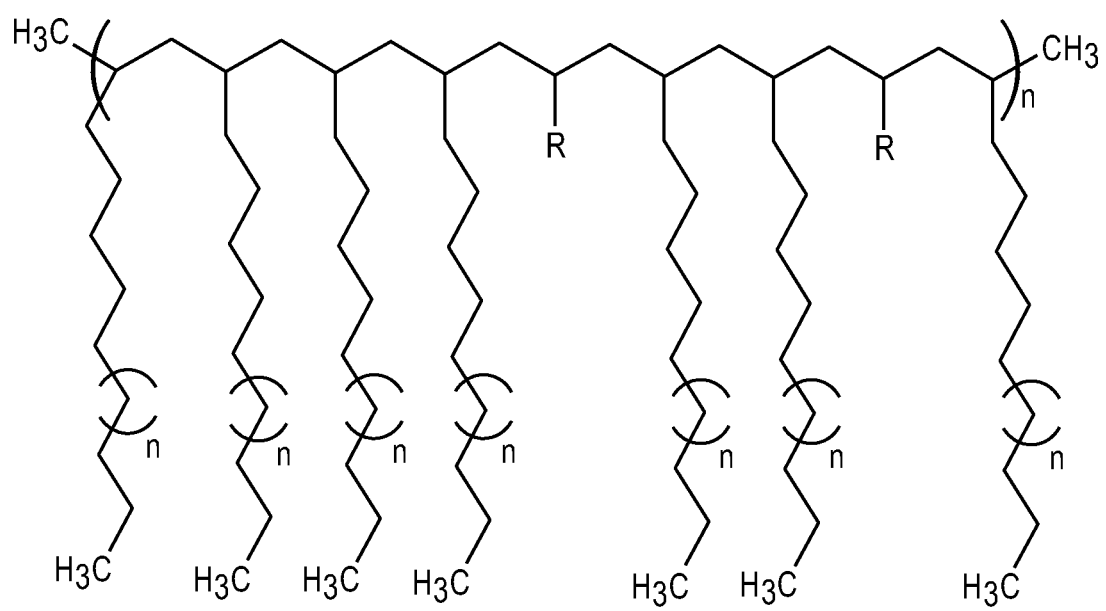

FIGS. 7-10D are schematic drawings of FP-PCMs used in accordance with various aspects of the present invention. Both are composed of a backbone chain and side chains. The FP-PCM in FIG. 7 represent long chain alkyl polyacrylate or polymethacrylate, and 7A-7C where 7A is long chain alkyl vinyl esters, 7B is long chain vinyl ethers and 7C is long chain alkyl olefins.

Figure 8:
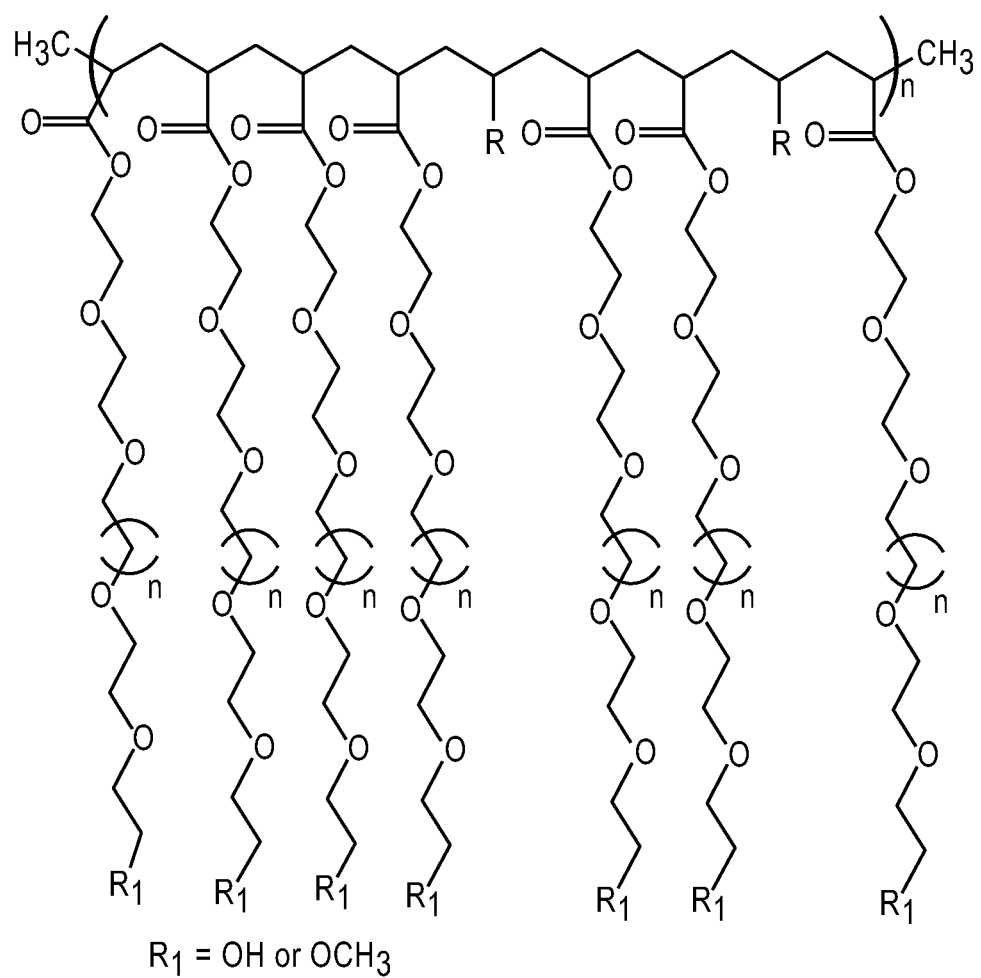
Figure 8A:
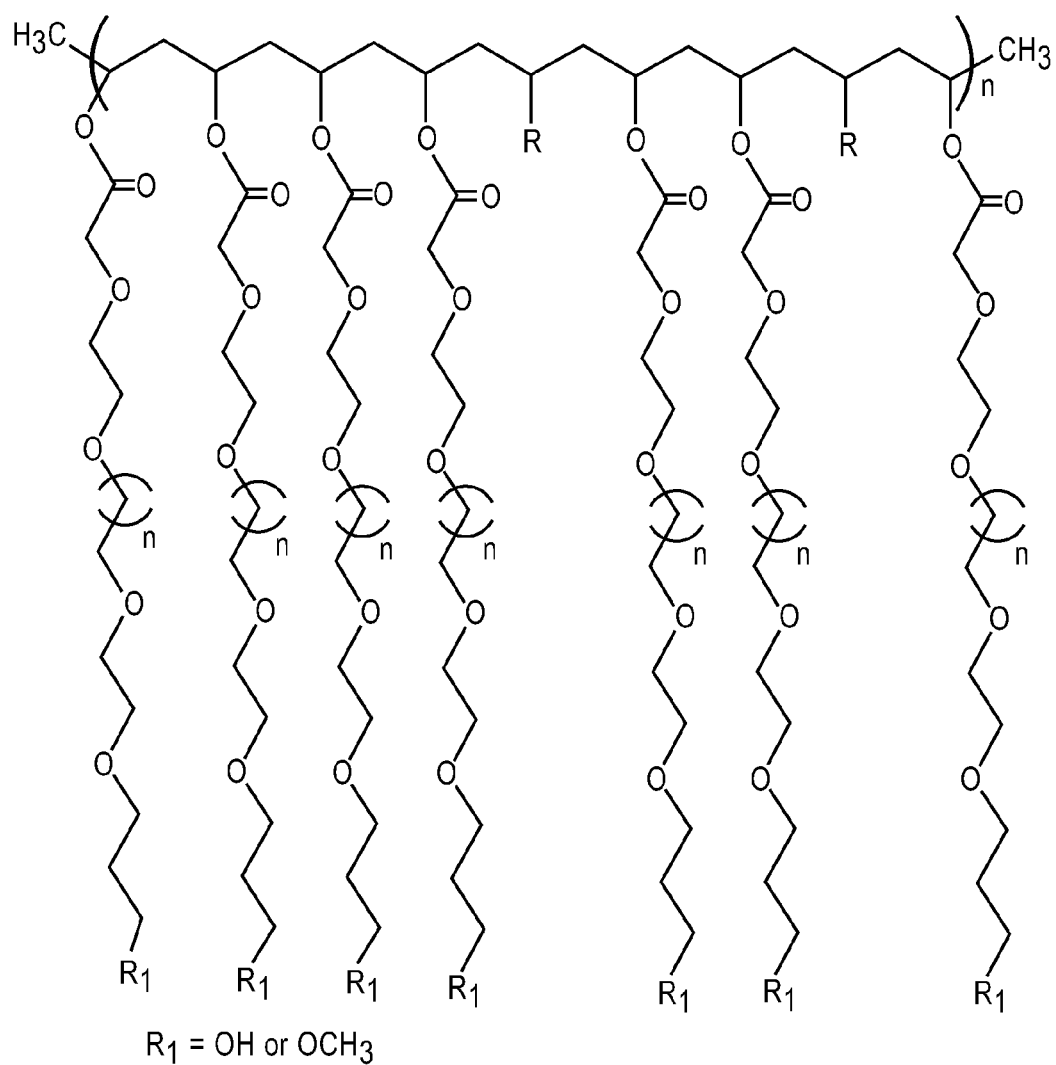
Figure 8B:
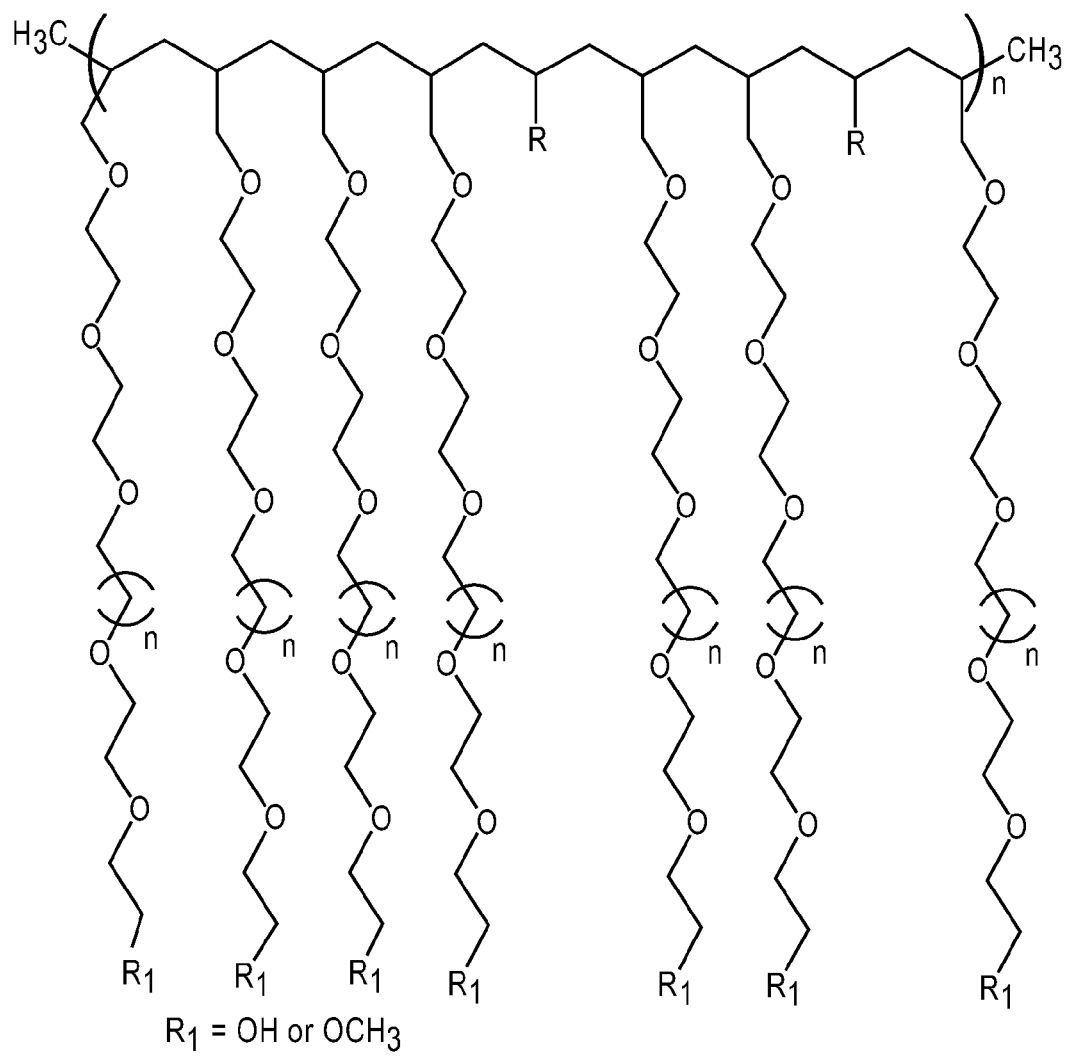

FIGS. 8A and 8B represent long chain glycol polyacrylates or polymethacrylates, where 8A is long chain glycol vinyl esters and 8B is long chain glycol vinyl ethers.

In FIGS. 7 and 8, R represents one or more of the reactive functions(s) described above. In those figures, the functions are drawn along the backbone, but that is only one option. As indicated above, the functions could also be placed at the end(s) of the backbone, on the side chains and any combination of those. Each FP-PCM may have a single or multiple reactive functions. FP-PCM may also carry multiple reactive functions of a similar chemical nature or a combination of reactive functions of different chemical nature. The length of the side chains may vary in different embodiments as shown by the variable chain length n.

Figure 9A:
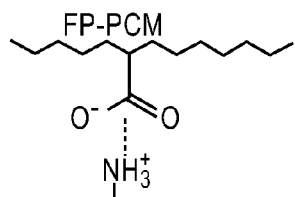
Figure 9B:
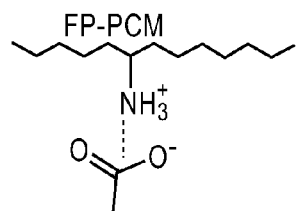
Figure 9C:
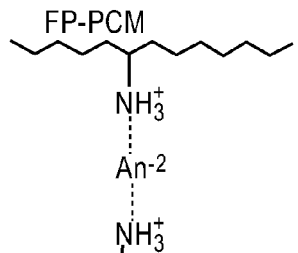
Figure 9D:
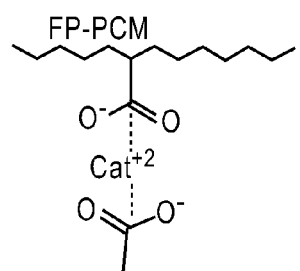
Figure 9E:
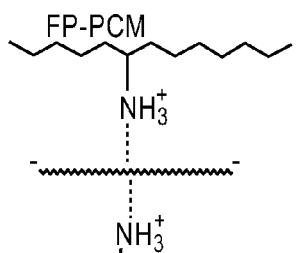
Figure 9F:
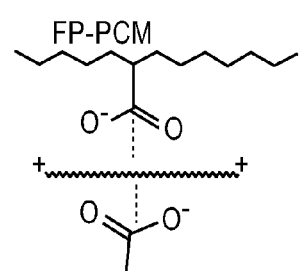

With reference to FIGS. 9A-9F, FIG. 9A drawing depicts an acidic or low pH carboxyl functional FP-PCM ionically interacting with a basic or high pH amino functional substrate. FIG. 9B depicts basic or high pH amino functional FP-PCM ionically interacting with an acidic or low pH carboxyl functional substrate. FIG. 9C depicts basic or high pH amino functional FP-PCM and a basic or high pH amino functional substrate being neutralized and ionically bound or "crosslinked" with an anion such as an amine. FIG. 9D depicts an acidic or low pH carboxyl functional FP-PCM and an acidic or low pH carboxyl functional substrate being neutralized and ionically bound or "crosslinked" with a cation such as a metal salt. FIG. 9E depicts basic or high pH amino functional FP-PCM and a basic or high pH amino functional substrate being neutralized and ionically bound or "crosslinked" with negatively charged organic compound such as dicarboxy functional polymer or dicarboxy functional FP-PCM. FIG. 9F depicts an acidic or low pH carboxyl functional FP-PCM and an acidic or low pH carboxyl functional substrate being neutralized and ionically bound or "crosslinked" with positively charged organic compound such as diamine functional polymer or diamine functional FP-PCM.

Figure 10A:
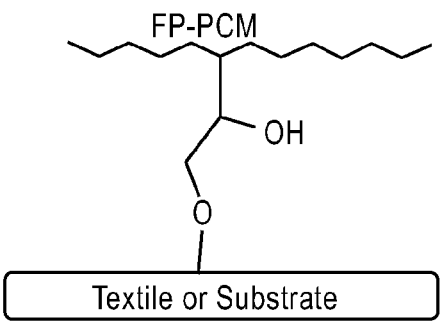
Figure 10B:
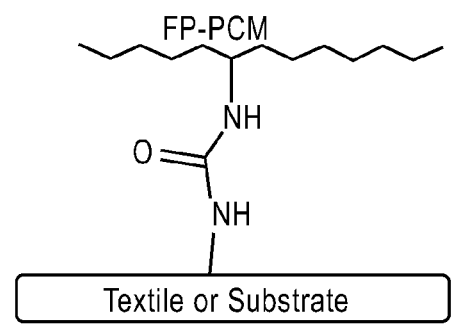
Figure 10C:
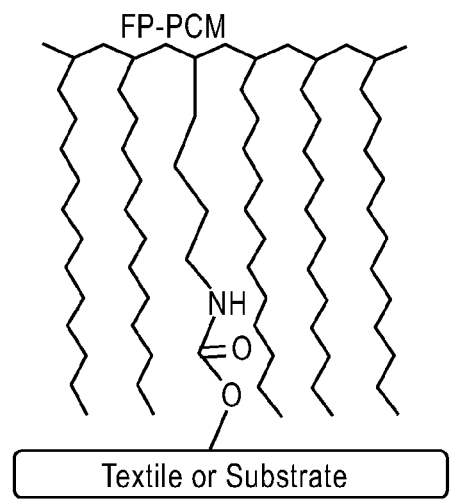
Figure 10D:
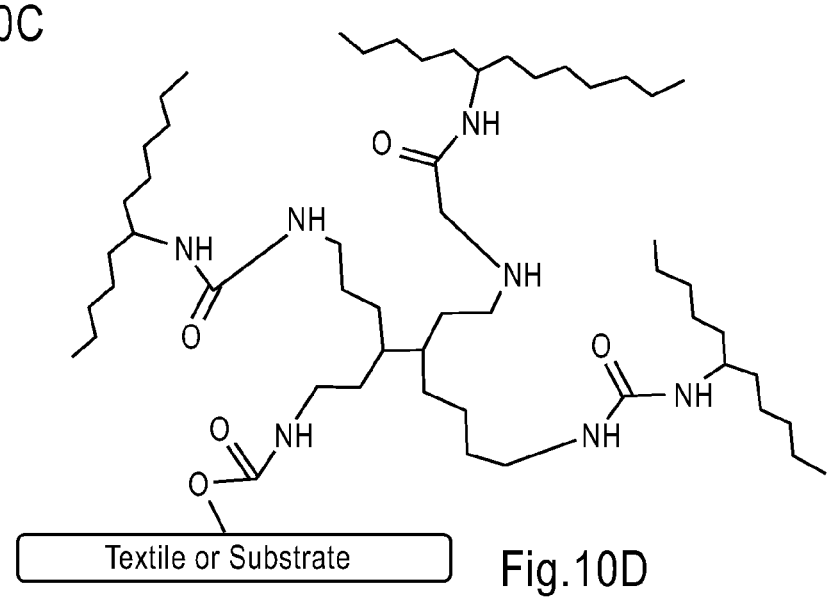

With reference to FIGS. 10A-10D, FIG. 10A depicts a covalent ether bond from the reaction of an FP-PCM epoxy and hydroxyl on a cellulose substrate. FIG. 10B depicts a covalent urea bond from the reaction of an FP-PCM isocyanate and amine from another material. FIG. 10C depicts a covalent urethane bond from the reaction of an FP-PCM isocyanate on the end of a side chain and hydroxyl from a cellulose substrate. FIG. 10D depicts a covalent urea and urethane bonds from the reaction of amine function, FP-PCMs, multifunctional isocyanate crosslinker/binder, and hydroxyl from a cellulose substrate.

Use of Precisely Branched FP-PCMs

In addition to the above disclosure concerning functional polymeric phase change material application and the use with various substrates, the disclosure below focuses on how using a more precisely branched polymer can give more precise and repeatable control of a copolymer addition. It is contemplated that each of the embodiments shown in FIGS. 7-10 may be modified to utilize the precisely branched polymers disclosed and discussed below. One of skill in the art would readily recognize how to incorporate the precisely branched polymers into the examples above and into variations of the above examples.

Standard polymerizations do not give precise and repeatable control of the comonomer addition because the catalysts generally add co-monomers in a random fashion. As discussed above, many polymers currently available commercially have random monomer incorporation. Current catalysts and polymerization technologies produce polymers with "drifting copolymer" structures where polymer chains in the product have a wide range of compositions of the comonomers. Due to the randomness of this comonomer addition, less control can be exerted over the thermal properties of the copolymer such as melt/crystallization temperature and the amount of crystallization. The amount of crystallization can be expressed as a percentage crystallinity, latent heat, heat of fusion or Joules per gram.

Precise branching control as discussed below allows for greater latent heat content at a given melt temperature versus random comonomer incorporation which requires more comonomer to give the same melt temperature, leading to lower percentage crystallinity and lower latent heat.

Figure 11:
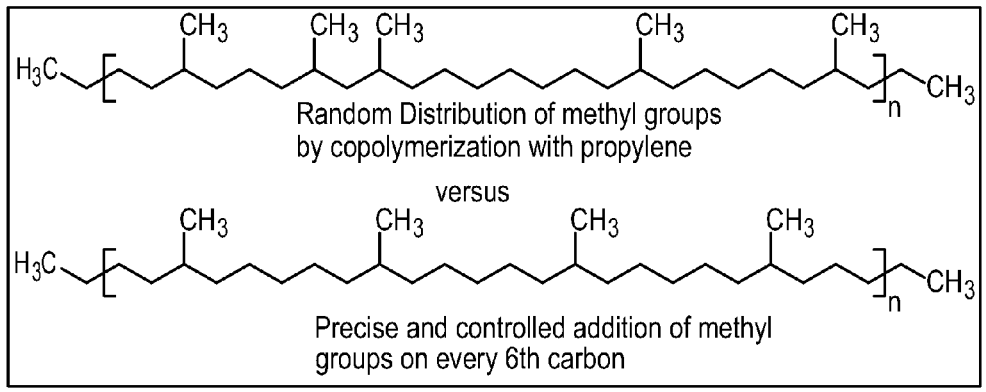
FIG. 11 shows one embodiment of the precisely branched polymers compared with randomly distributed polymers.
Figure 12:
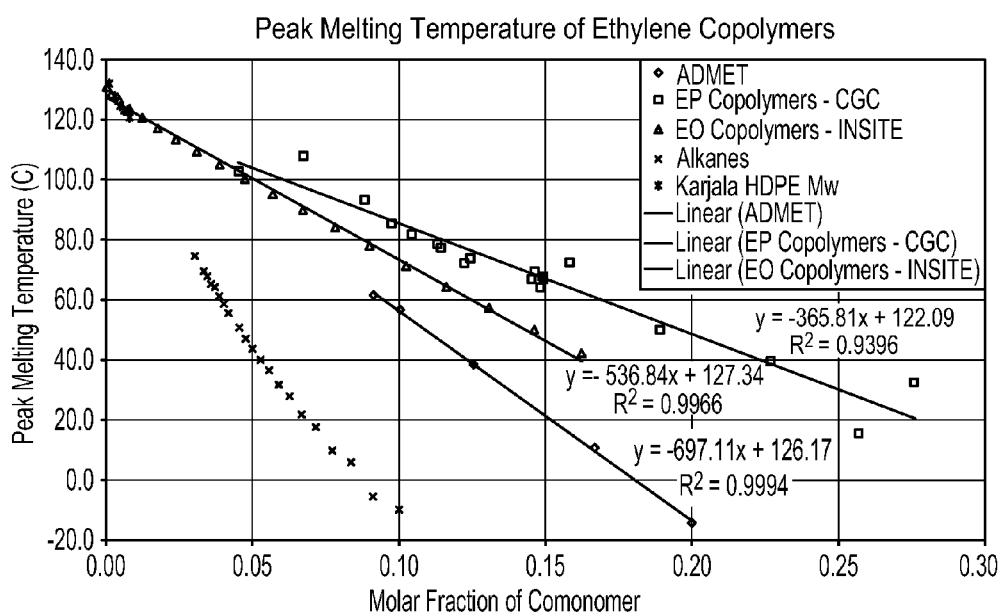
FIG. 12 is a graph depicting the peak melting point of various copolymers.
Figure 13:
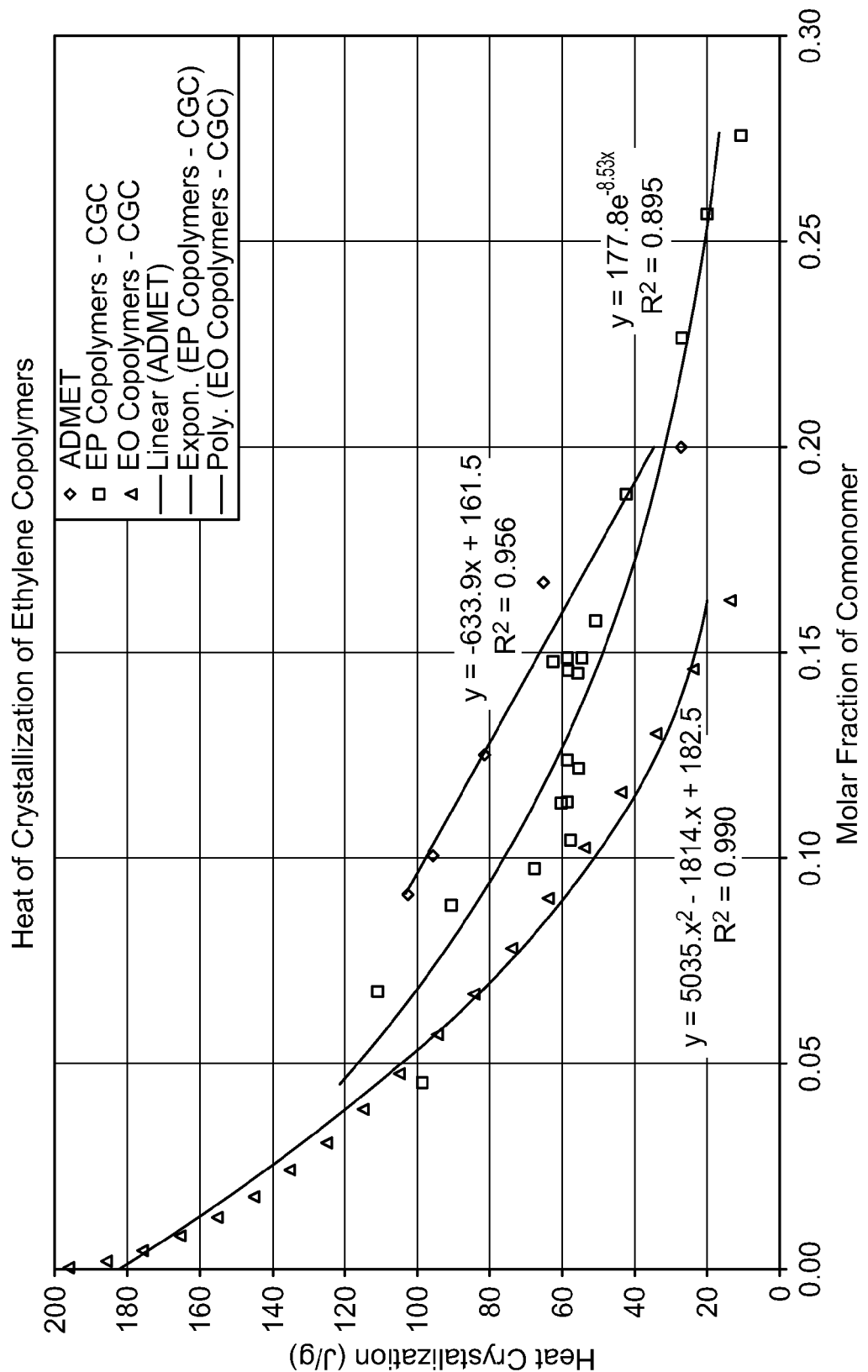
FIG. 13 is a graph depicting the heat of crystallization of various copolymers.

With general reference to FIGS. 11-13, various graphs are shown that illustrate the difference in both melt temperature and latent heat. In FIGS. 11-13 the precisely branched polymers are labeled as ADMET. In the various embodiments, figures and examples, ADMET stands for Acyclic Diene Metathesis Polymerization and generally represents polymers with precisely placed methyl branches.

It is well known in the industry, that for polyolefin polymers the melting temperature and latent heat are controlled by the longest carbon segments in the polyolefin backbone. For instance in polyethylene random copolymers, the distribution of ethylene sequences vary. In the case of polyethylene copolymers, thick crystal lamella can be formed from the longer ethylene sequences which will result in higher melting temperatures. The shorter ethylene sequences and/or branches will not be incorporated into these crystallites or lamella resulting in lowered heats of fusion or Joules per gram.

In accordance with one embodiment and example, a precisely branched polyethylene material having equal ethylene sequences yields the following features: a faster decrease in melting temperature at lower branch content; better control of the melting temperature; and an overall higher amount of ethylene sequences incorporated into the lamella or crystallite, yielding higher latent heats.

Therefore, aspects of the invention and the use of these precisely controlled copolymers yields materials with phase change materials exhibiting enhanced temperature regulating, heat absorbing, and heat releasing properties. In order to obtain a preferred PCM with melting temperatures suitable for use in electronics applications and as described below. In yet another embodiment, and a latent heat of fusion of >25 Joules per gram in one embodiment, >5 Joules per gram in another embodiment, and between 5 and 150 Joules per gram in yet another embodiment, a PCM in one example has a structure with one or more of the following features:

The overall polymer molecular weight (n) is between 100-10,000,000, between 1000-1,000,000 or between 10,000-500,000 in various embodiments.

With the molecular weight distribution expressed as polydispersity or Pd=Mn/Mw, it is between 1-20, between 1-10, or between 1-3 in various embodiments.

The ethylene length between branches is between 5-500,000, between 10-400,000, or between 10-20 in various embodiments.

The length described above can be expressed in a number of ways such as number of m units in diagram 1 below, branches per 1000 carbons (branches/1000 C), mole % branches or weight % branches. The PCM structure also has the following characteristics in one or more embodiments:

The number of m units is between 0-500,000, between 0-200,000 or between 5-15,000 in different embodiments.

There are between 200-0, between 100-5 or between 100-0 branches per 1000 carbons (branches/1000 C) in different embodiments.

The mole % of the branches is 0-50% or between –30% in different embodiments.

The weight percentage of the branches is between 0-50% or between 10-30% in different embodiments.

In some embodiments it is preferred that the branches are methyl branches from propylene as the comonomer and that propylene is 0-30 mole % of the polymer. In another The syndiotactic, isotactic or L- and D-chiral segments can be mixed in a ration between 9:1 and 1:9 to give complete or partial stereocomplex formation and subsequent thermal and physical property adjustment. Other crystalline complexes may also be utilized such as complexes between different polymers such as polyamides and polyesters, cationic/anionic, polyethers/polyacids, and triple helixes.

R3, R4, R5 can be any functional group, polar group or halogen group, salt, metal, catalyst end, crosslinking group, or any of the following functional groups: acid anhydride groups, amino groups, N-substituted amino groups and their salts, amide groups, imine groups, imide groups, azide groups, azo groups, amine-fromaldehyde groups, carbonyl

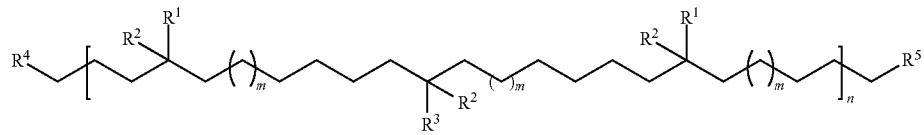

In diagram 1 above, illustrating one embodiment, R1 may be any of CH3, C2H5, CnH2n+1, OCH3, OC2H5, or any functional group, polar group, halogen group, their normal, branched or mixed group. In certain embodiments R1 is selected from either CH3 or OCH3. In diagram 1, R2=H, CH3 and in certain specific embodiments, R2 is limited to H.

In diagram 1, R3=H, CH3 or some concentration of a selected functional group, polar group or halogen group. In certain embodiments, R3 is limited to CH3 or to one or more concentrations of a functional group In diagram 1, R4 and R5 are polymer end groups and can be H, CH3 or any functional group, polar group or halogen group, salt, metal, catalyst end, crosslinking group, another polymer chain to form copolymers (block, graft, etc.). In some embodiments, R4, R5 can be the same or different. In certain embodiments, R4 and R5 are limited to H, CH3 or any functional group.

In accordance with other aspects R1, R2, R3, R4, and R5 can have some degree of stereocontrol or stereochemistry associated with them. For example:

R1, R2, R3 may be atactic, isotactic or syndiotactic.

R1, R2, R3 may also be controlled for chirality to yield L- and D-chiral homo and copolymers (or another way of stating is R- and S-polymers).

Different polymer architectures based on the stereochemistry of the polymer chain can lead to various crystalline complexes. For example, syndiotactic homo- and copolymers can complex with isotactic homo- and copolymers. Polymers of opposite chirality can be mixed to form a racemic stereocomplex. In one embodiment, a certain amount of isotactic L-polymer can be mixed with an amount of isotactic D-polymer to yield a racemic stereocomplex with thermal and physical properties different than the L- or D-chiral homopolymers. (A polymer stereocomplex is defined as a stereoselective interaction between two complementing stereoregular polymers, that interlock and form a new composite, demonstrating altered physical and thermal properties different than the parent polymers.)

These syndiotactic, isotactic or L- and D-chiral segments can be in different polymer chains (homopolymer segments) or in the same polymer (stereoblock copolymers segments). The syndiotactic, isotactic or L- and D-chiral segments can make up anywhere between 1-100% of the polymer or copolymer as well as various intermediate percentage ranges.

groups, carboxy groups and their salts, cyclohexyl epoxy groups, epoxy groups, glycidyl groups, hydroxy groups, isocyanate groups, cyanate groups urea groups, aldehyde groups, ketone groups, ester groups, ether groups, alkenyl groups, alkynyl groups, thiol groups, disulfide groups, silyl or silane groups, halogenated leaving groups, peroxide groups, salt groups, groups based on glyoxals, groups based on aziridines, groups based on active methylene compounds or other b-dicarbonyl compounds (e.g., 2,4-pentandione, malonic acid, acetylacetone, ethylacetone acetate, malonamide, acetoacetamide and its methyl analogues, ethyl acetoacetate, and isopropyl acetoacetate), halo groups, hydrides, or other polar or H bonding groups and combinations thereof.

The crosslinking groups discussed above may also include the ability to reversibly or irreversibly change the crosslink by thermal, sonic, photon, pressure, or chemical (water, solvents, ions, etc.) energy.

Various other methods of functionalization are described shown in the following references, the details of which are incorporated by reference into the present application: Synthesis of Functional Polylefins using Metallocenes: A Comprehensive Review; Atiqullah M., et. al.; Polymer Reviews, 50:178-230, 2010; Comprehensive Organometallic Chemistry III: 11.20 Polymerization of Alkenes; Elsevier Ltd.; Fujita T., Makio H.; Vol. 11, 691-734, 2007; Functionalized Ethylene Copolymers and Materials via Olefin Metathesis Polymerization; Baughman, T., Univ. of Florida Dissertation, 2006.

Figure 14:
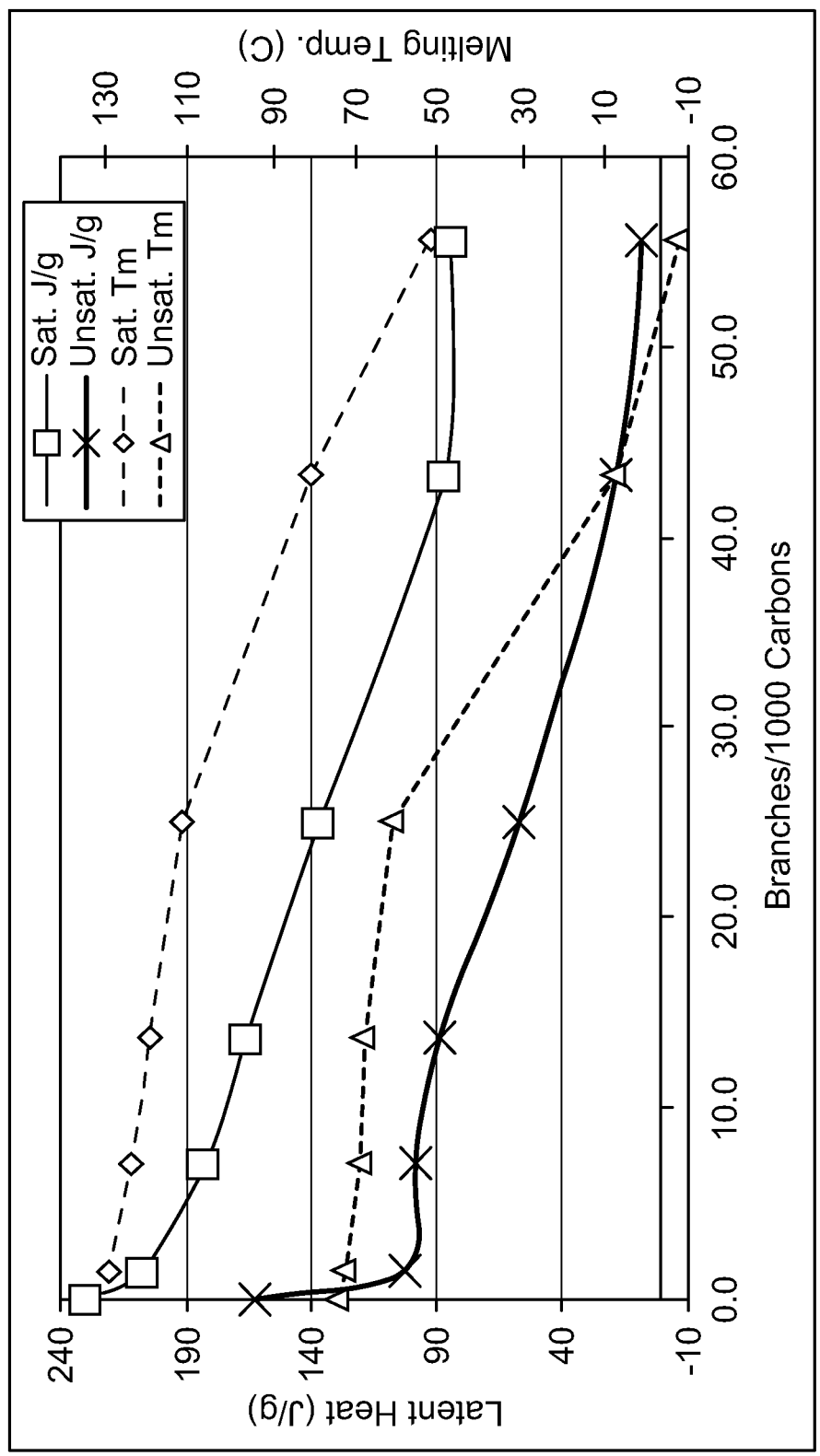
FIG. 14 is a graph depicting the latent heat and melting point of various copolymers.

In accordance with another aspect, the polymer may have a certain degree of unstaturation or include double and triple bonded atoms in the polymer. For instance, alkene or alkyne bonds. This unsaturation (not all valence electrons are "saturated" or reacted to other atoms) can be incorporated and controlled by the monomers used in the polymerization (isoprene, butadiene, α-olefins, etc.), hydride elimination (β-hydride elimination, etc.), various polymerization mechanisms (ring-opening metathesis polymerization (ROMP), acyclic diene metathesis (ADMET described herein, etc.) or controlled hydrogenation/dehydrogenation. For instance, as shown in Diagram 2 and FIG. 14, examples of making the invention by ADMET polymerization and subsequent hydrogenation are shown. FIG. 14 shows the effect of unsaturation on the thermal properties.

Diagram 2

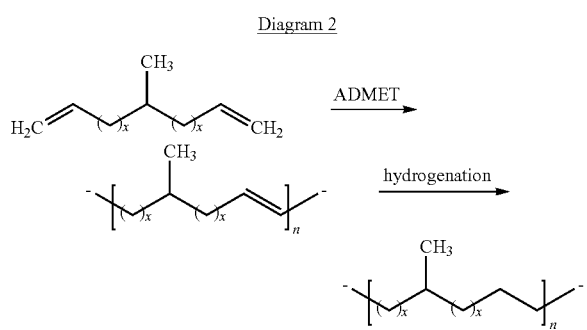

As can be seen, unsaturation causes a lower melting temperature and also slighly lower latent heat of fusion, but by controlling the level of unsaturation, one can also control the thermal properties. In some embodiments the unsaturation is 0-99 mole %. In other embodiments the unsaturation is 0-15 mole %. In various other embodiments, various intermediate ranges of mole % are utilized.

The isomeric orientation of the double bond can also have an effect on the properties of the unsaturated polymer. The cis/trans orientation of the double bond can also be controlled by the hydrogenation catalyst or the hydrogenation process conditions such as time, temperature, pressure, etc.

The isomer ratio, unsaturation and double bond orientation will vary depending on the comonomer composition, comonomer distribution and polymerization conditions. One goal of a composition in accordance with an aspect of the present invention is to maximize latent heat in the preferred temperature range.

Copolymer segments used in connection with aspects of the present invention can be copolymers or blended with any of the other polymers/copolymers disclosed herein. In addition, copolymer segments used in connection with aspects of the present invention can be high melt or low melt.

Use of Nucleating Agents

In order to improve the crystallinity of the PCM, pPCM and/or fpPCM and therefore the latent heat and thermal conductivity of these materials, nucleating agents can also be added. Nucleating agents can effect improved crystal growth, crystallization speed, crystal shape and size, amount of crystallization and number of crystallites of the materials.

Furthermore, the particle size of the nucleating agent and the mixing of these are important factors in ensuring optimal performance of the additives. Features of a good melt insensitive nucleating agent may be selected from one or more of the following:

It contains both an organic group and a polar group
It is well dispersed
It is insoluble or can become insoluble in the polymer
It has an epitaxial match with the PCM crystal
The physical or chemical nature of nucleating agents can be diverse. A nucleating agent can be:
  An impurity, i.e. catalyst residue
  An organic compound like benzoic acid, hydrocarbons or fatty acid based materials
  An inorganic compound such as mineral or pigment
  A foreign polymer crystal, i.e. polyethylene for octadecane, etc.
  A diluent, i.e. a material that lowers the Tg or improves the chain mobility leading to improved chain packing.

Additional nucleating agents that may be utilized include those described in U.S. Pat. No. 7,569,630 β-Crystalline Polypropylene to Chemtura Corp., U.S. Pat. No. 7,879,933 Blending Nucleating Agents Composition and Methods to Milliken & Company, and Hyperform® products from Milliken & Company. Other examples are aliphatic hydrocarbons, aromatic hydrocarbons, alcohols, fatty acids, fatty acid salts, fatty acid esters, fatty amides, fatty amines, fatty alcohols, N-Phenyl-N'-stearylurea, zinc glycerolate, benzoic acid, salts and esters of benzoic acid, benzoic acid derivatives, Na benzoate, Li benzoate, Al hydroxy-4-tert.-butyl benzoate, phosphate esters, phosphate ester salts, sodium 2,2'-methylene-bis-(4,6-di-tert-butylphyenyl)phosphate, dibenzylidene sorbitol, derivatives of dibenzylidene sorbitol, linear or branched polyphenyls, salts of hydrogen phthalate, 1,2-cyclohexanedicarboxylic acid and the mono or di neutralized salt (i.e. Na, K, Al, B, Ti, Zn, Ca, Li, Mg, etc.), cetyl alcohol, stearyl alcohol, eicosanol, myristic acid, palmitic acid, behenic acid, stearic acid amide, ethylenebisoleic acid amide, methylolbehenic acid amide, 1-octacosanol, 1-heptacosanol, 1-hexacosanol, 1-pentacosanol, 1-tetracosanol, 1-tricosanol, 1-docosanol, 1-heneicosanol, 1-eicosanol, 1-nonadecanol, 1-octadecanol, 1-heptadecanol, 1-hexadecanol, 1-pentadecanol, 1-tetradecanol, 1-tridecanol, tridecylamine, tetradecylamine, pentadecylamine, hexadecylamine, heptadecylamine, octadecylamine, nonadecylamine, eicocylamine, heneicocylamine, dococylamine, tricocylamine, tetracocylamine, pentacocylamine, hexacocylamine, heptacocylamine and octacocylamine, etc. Minerals such as talc, kaolin, calcium carbonate, $TiO_2$, salts, NaCl, and Na carbonate may also be used as nucleating agents. These compounds may be used singly or in combination of two or more thereof.

Microcapsules and Other Containment and/or Absorbing Structures for Phase Change Materials PCM can be contained in microcapsules or some other containment structure or particulate. Containment structures other than microcapsules are capable of carrying functional groups, either as a natural part of their structure or from their modified manufacturing. For instance, PCMs can be absorbed and stabilized into any number of particles including silica (fumed or precipitated), graphite, graphene, carbon nanoparticles, carbon or activated carbon, zeolites, organo-clays, montmorillonite, bentonite, clay, talc, and vermiculite. Paraffin or hydrophobic PCMs can also be absorbed in any number of polymers, especially crosslinked polymers, similar to how a plasticizer will absorb into plastics. For instance PCM can be absorbed into any polyolefin and polyolefin copolymer such as polyethylene, polypropylene, salts of polyolefins and their copolymers, poly(meth)acrylates, salts of poly(meth)acrylates, polyvinyls, aliphatic polyesters, rubbers, copolymers (i.e. Kraton® copolymers, Elvaloy®) and mixtures, etc. PCMs based on glycols can be absorbed into any hydrophilic polymers such as polyvinyl alcohol, substituted cellulose (CMC, HMC, etc.) etc.

PCMs, pPCMs, fpPCMs can also be contained, absorbed or infused on any particle or fiber including the below described thermal conductive fillers, reinforcing materials, FR addtives, etc. These containment or absorbing particle can be any shape such as round, spherical, cylindrical, fiber, sheet, flake, powder, whiskers, tubular, platelets, foams, meshes, agglomerates of these shapes or any other irregular shape. Depending on the application, a single shape or mixture of shapes may be advantageous to provide the optimum packing and arrangement for particle contact. These containment or absorbing particle can be any size but are preferably 0.1 nm to 100 mm.

Other materials which can absorb or contain PCMs such as standard superabsorbant polymers based on cross-linked sodium polyacrylate. Other materials are also used to make a superabsorbent polymer, such as polyacrylamide copolymer, ethylene maleic anhydride copolymer, cross-linked carboxymethyl-cellulose, polyvinyl alcohol copolymers, cross-linked polyethylene oxide, and starch grafted copolymer of polyacrylonitrile to name a few.

Microcapsules are implemented to contain a phase change material, which serves to absorb or release heat to reduce or eliminate heat transfer. In particular, the microcapsules are formed as shells that define internal compartments within which the phase change material is positioned. The shells can be formed of any suitable material that serves to contain the phase change material, thus offering a degree of protection to the phase change material against ambient or processing conditions or against loss or leakage during use. For example, the shells can be formed of a polymer or any other suitable encapsulation material.

The selection of a material forming the microcapsule shells can be dependent upon various considerations, such as its affinity for other materials in the TMM, affinity or adhesion to electronic components, its reactivity or lack of reactivity with the phase change material, TMM materials or electrical components, its resistance to degradation under ambient or processing conditions, and its mechanical strength. In particular, for certain implementations, a material forming the shells can be selected so as to include a set of functional groups, acid anhydride groups, amino groups, N-substituted amino groups and their salts, amide groups, imine groups, imide groups, azide groups, azo groups, amine-fromaldehyde groups, carbonyl groups, carboxy groups and their salts, cyclohexyl epoxy groups, epoxy groups, glycidyl groups, hydroxy groups, isocyanate groups, cyanate groups urea groups, aldehyde groups, ketone groups, ester groups, ether groups, alkenyl groups, alkynyl groups, thiol groups, disulfide groups, silyl or silane groups, halogenated leaving groups, peroxide groups, salt groups, groups based on glyoxals, groups based on aziridines, groups based on active methylene compounds or other b-dicarbonyl compounds (e.g., 2,4-pentandione, malonic acid, acetylacetone, ethylacetone acetate, malonamide, acetoacetamide and its methyl analogues, ethyl acetoacetate, and isopropyl acetoacetate), halo groups, hydrides, or other polar or H bonding groups and combinations thereof. At least some of these functional groups can be exposed on outer surfaces of the shells and can allow chemical bonding to a complementary set of functional groups included in either of, or both, the substrates or other TMM materials, thereby enhancing durability or adhesion. In such fashion, at least some of the microcapsules can be chemically bonded to other PCMs, pPCMs, fpPCMs or fillers. Thus, for example, a material forming the shells can include a set of carboxy groups, which can chemically bond to a set of hydroxy groups. As another example, those carboxy groups included in the shells can chemically bond to a set of amino groups.

Examples of polymers that can be used to form the shells include those listed under the "polymers" definition, including those with carboxy groups, such as polymers including monomeric units based on acrylic acid or methacrylic acid. For certain implementations, the shells can be formed of a polymer that includes from about 1 to about 100 molar percent of monomeric units that include carboxy groups, such as from about 20 to about 80 molar percent, from about 25 to about 60 molar percent, or from about 40 to about 50 molar percent of the monomeric units. In some instances, it can be desirable to adjust a molar percentage of the monomeric units based on sizes of the microcapsules. For example, as a size of an individual one of the microcapsules decreases, an outer surface area of that microcapsule also typically decreases. Thus, to maintain a desired amount of exposed functional groups for chemical bonding, it can be desirable to increase the molar percentage of the monomeric units as the size of that microcapsule decreases. As another example, as a size of an individual one of the microcapsules increases, a weight of that microcapsule also typically increases. Thus, to account for the increasing weight, it can be desirable to increase the molar percentage of the monomeric units as the size of that microcapsule increases. Table 1 provides examples of ranges of the molar percentages as a function of the sizes of the microcapsules. Referring to Table 1, the microcapsules are assumed to be spherical for ease of presentation. Similar considerations and molar percentages can also apply to polymers with other types of functional groups.

TABLE 1

| Radius - r ($\mu$m) | Surface area - $4\pi r^2$ ($\mu m^2$) | Molar percent of monomeric units with carboxy groups |
|---|---|---|
| 0.5 | 3 | 50-60 |
| 1 | 13 | 45-55 |
| 2 | 50 | 40-50 |
| 3 | 113 | 40-50 |
| 4 | 201 | 35-45 |
| 5 | 314 | 35-45 |
| 6 | 452 | 30-40 |
| 7 | 616 | 30-40 |
| 8 | 804 | 25-35 |

Other examples of polymers that can be used to form the shells include those formed of monomers using any suitable polymerization technique. Table 2 below sets forth examples of such monomers that include different types of functional groups.

TABLE 2

| Functional Group | Monomers |
|---|---|
| Carboxy Group | acrylic acid, methacrylic acid, maleic acid, itaconic acid, citraconic acid, vinylacetic acid, p-vinylbenzoic acid, 2-acryloyloxyethylacidphosphate, β-acryloyloxyethyl hydrogen succinnate (or any other anhydride reacted or modified hydroxy group-containing monomer), and any other unsaturated polymerizable carboxylic acid |
| Isocyanate Group | isocyanato methacrylate, monomer supplied as TMI by Cytec Industries, 2-methacryloyloxyethyl isocyanate, acryloyloxyethyl isocyanate, blocked isocyanates such as 2-(0-[1'-methylproplyideneamino]carboxyamino)ethyl methacrylate, and any other unsaturated polymerizable isocyanate |
| Anhydride Group | maleic anhydride, itaconic anhydride, citraconic anhydride, and any other unsaturated polymerizable anhydride |
| Hydroxy Group | $CH_2=CR'COO(CH_2)_nOH$, where R' = $CH_3$ or H, n = 2-4 (e.g., hydroxyethyl methacrylate, hydroxyethyl acrylate, hydroxypropyl methacrylate, hydroxypropyl acrylate, hydroxybutyl methacrylate, and hydroxybutyl acrylate); $CH_2=CR'COO((CH_2)_nO)_zOH$, where R' = $CH_3$ or H, n = 1-10, z = 1-1,000 (e.g., glycol based acrylates or methacrylates, such as ethyleneglycol methacrylate, ethyleneglycol acrylate, polyethyleneglycol methacrylate, and polyethyleneglycol acrylate); allyl alcohol; α-ethylallyl alcohol; allylcarbinol; $CH_2=CH-(CH_2)_m-O-((CH_2)_nO)_zOH$, where m = 0-4, n = 1-10, z = 1-1000 (e.g., glycol based vinyl ethers, such as ethyleneglycol monovinyl ether and polyethyleneglycol monovinyl ether); $CH_2=CH-O-CO-((CH_2)_nO)_zOH$, where n = 1-10, z = 1-1000 (e.g., glycol based vinyl esters, such as ethyleneglycol monovinyl ester and polyethyleneglycol monovinyl ester); and any other unsaturated polymerizable hydroxy group-containing monomer |
| Epoxy Group | glycidyl methacrylate, glycidyl acrylate, allyl glycidyl ether, 2-vinyloxyethyl glycidyl ether, and any other unsaturated polymerizable epoxy-group containing monomer |

TABLE 2-continued

| Functional Group | Monomers |
|---|---|
| Amino or N-Substituted Amino Group | acrylamide; methacrylamide; $CH_2=CR'CONHCH_2OX$, where $R' = CH_3$ or H, X = H, methoxy, ethoxy, propoxy, isopropoxy, butoxy, or isobutoxy; and vinylamine; and any other unsaturated polymerizable amino group-containing monomer |
| Silyl Group | methacryloxypropyltrimethoxysilane, methacryloxypropyltriethoxysilane, methacryloxypropyltributoxysilane, triethoxyvinylsilane, trimethoxyvinylsilane, triacetoxyvinylsilane, triisopropoxyvinylsilane, tris(methoxyethoxy)vinylsilane, and any other unsaturated polymerizable silane |

Microcapsules can also be multi-walled or have multiple shell layers. The inner layer should provide the required strength, durability and containment while the outer layers provide compatibility or adhesive properties. The outerwall can be a thermoplastic polymer which can melt or soften at desired temperatures to flow, act like a viscous liquid or fuse the microcapsules to substrates, other microcapsules or other TMM materials. The thermoplastic outer wall should have a melting or glass transition temperature (Tg) below the temperature which will damage the electronic components but above normal use temperatures. The outerwall can be made of any polymer that melts, softens or flows such as polyolefins, rubbers, polyvinyls, poly(meth)acrylates, polyurethanes, etc. or copolymers.

Microcapsules can have the same shape or different shapes, and can have the same size or different sizes. In some instances, the microcapsules can be substantially spheroidal or spherical, and can have sizes ranging from about 0.1 nm to about 1,000 microns, such as from about 0.1 nm to about 500 microns, from about 0.1 nm to about 100 microns, from about 1 to about 15 microns. For certain implementations, it can be desirable that a substantial fraction, such as at least 50 percent, or at least 80 percent of the microcapsules have sizes within a specified range, such as from about 1 to about 15 microns. It can also be desirable that the microcapsules are monodisperse with respect to either of, both, their shapes and sizes.

Figure 15A:
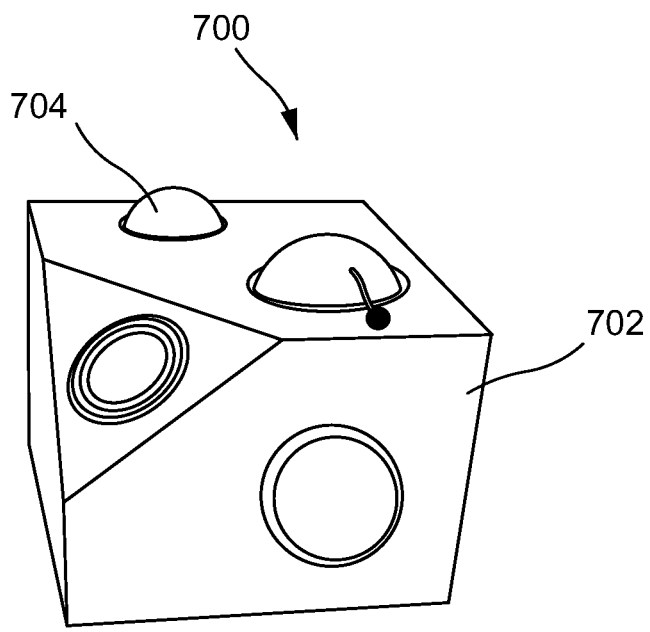
FIGS. 15A and 15B show details of a microcapsule as used in connection with various aspects of the present invention.
Figure 15B:
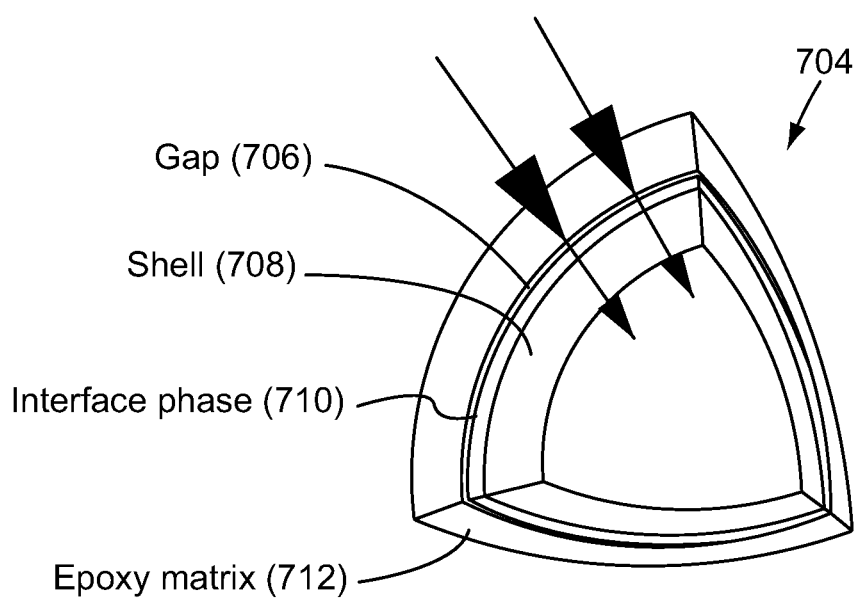

Microcapsules can be of a durable, breakable, or controlled release type. It can be advantageous to have the microcapsule core material permanently contained to prevent leakage or loss of core material during use or processing. It may also be advantageous to have the core material released thru either fast (breakable) or slow (controlled release) means. For instance, when microcapsules are added to composites, and the composites are cured at higher temperatures, small voids can be formed between the composite and microcapsule shell wall due to variables such as differential expansion between microcapsule and composite, incompatibility between microcapsule and composite or shape distortion, etc. Release of core material and allowing it to flow into and fill these voids allows for greatly improved thermal conductivity. This is shown in FIGS. 15A-15B.

Selection of a PCM Transition Temp.

The selection of a PCM is typically dependent upon the transition temperature that is desired for a particular application that is going to include the PCM. The transition temperature is the temperature or range of temperatures at which the PCM experiences a phase change from solid to liquid or liquid to solid. For example, a PCM having a transition temperature near normal body temperature or around 60° C. can be desirable for electronics applications to prevent user injury and protect overheating components. A phase change material according to some embodiments of the invention can have a transition temperature in the range of about −5° C. to about 150° C. In one embodiment, the transition temperature is about 6° C. to about 90° C. In another embodiment, the transition temperature is about 30° C. to about 70° C. In another embodiment, the PCM has a transition temperature of about 40° C. to about 60° C.

The transition temperature can be expanded or narrowed by modifying the purity of the PCM, molecular structure, blending of PCMs, blending of mPCM, blending of polymeric PCMs and any mixtures thereof.

In addition, the temperature control is dependent on the absorption and release of energy by changing phases, preferably by absorbing energy and melting or releasing/dissipating heat by solidifying or crystallization. These melting (Tm) and crystallization (Tp) temperatures for a single PCM material are preferably not widely spread ("supercooling"). This difference can be defined as the difference between peak melting temperature and peak crystallization temperature as measured by a DSC, i.e. $\Delta T$ (° C.)=Tm−Tc. Preferably this $\Delta T$ is <15° C., preferably <10° C., more preferably <5° C.

Mixing and Layering of PCM Transition Temperatures

In some embodiments, it may be advantageous to have multiple or broad transition temperatures. If a single narrow transition temperature is used, this can cause thermal/energy buildup before the transition temperature is reached. Once the transition temperature is reached, then energy will be absorbed until the latent energy is consumed and the temperature will then continue to increase. Broad or multiple transition temperatures allow for temperature regulation and thermal absorption as soon the temperature starts to increase, thereby alleviating any thermal/energy buildup. Multiple or broad transition temperatures can also more efficiently help "bleed-off" or conduct heat away from a component by overlapping or staggering thermal absorptions. For instance a TMM contains PCM1 which absorbs at 35-40° C. and PCM2 which absorbs at 38-45° C. PCM1 will start absorbing and controlling temperature until a majority of the latent heat is used, at which time PCM2 will start to absorb and conduct energy from PCM1 thereby rejuvenating PCM1 and allowing it to keep functioning. This broadening or mixing of transition temps can be done by combining all materials or layering them as depicted in the various figures.

Selection of Latent Heat Values

The selection of the phase change material can be dependent upon a latent heat of the phase change material. A latent heat of the phase change material typically correlates with its ability to absorb and release energy/heat or modify the heat transfer properties of the article. In some instances, the phase change material can have a latent heat that is at least about 20 J/g, such as at least about 40 J/g, at least about 50 J/g, at least about 70 J/g, at least about 80 J/g, at least about 90 J/g, or at least about 100 J/g. Thus, for example, the phase change material can have a latent heat ranging from about 20 J/g to about 400 J/g, such as from about 60 J/g to about 400 J/g, from about 80 J/g to about 400 J/g, or from about 100 J/g to about 400 J/g.

TMM Rheology, Viscosity, Crosslinking and Physical Properties of the PCM

The rheology (i.e. viscosity or flow properties) of the TMM is important for many different processes of the electronics manufacturing and use applications. Variables such as general application of the TMM into the electronics either by spray, flow, coating, pressure adhesive or extrusion is controlled by the rheology. The application must balance rheology to achieve sufficient gap fill and reduction of air spaces for good thermal conductivity versus maintaining the structure and stability of the TMM on a specific component or within a specific area of the electronic, i.e. the material cannot further flow or migrate away from its desired position.

TMM with phase change and/or polymeric properties are advantageous in solving the above problems since they can be formulated to be solid at low temperatures and deformable or flowable at phase change or higher temperatures. The phase change temperature can be lower, equal to or higher than the normal operating temperature of the electronic component. These TMM embodiments are also advantageous over greases or waxes in that improved physical properties such as tensile, elongation, flexibility, toughness can be improved.

Rheology, viscosity and flow of the TMM can be controlled by many different variables. These can include the characteristics of the pPCM/fpPCM such as type of polymer, the polymer structure, the polymer mol. wt., polymer branching (i.e. number of branches, length of branches, types of branches, etc.), polymer functionality (i.e. type and amount), copolymers, compatibility with other polymers, crosslinking of the polymer, type of crosslinking, entanglement of the polymer, compatibility with additives, etc.

The polymer glass transition temperature (Tg, temperature at which a polymer changes from a glassy state to a rubbery state) can be controlled to allow for flow at or below operating temperatures. The Tg can be between −20° C. and 150° C., preferably between 15° C. and 90° C.

The polymer mol. wt. can be controlled to provide low or high viscosity with higher mol. wt. polymers providing low viscosity or no flow. The molecular weight of pPCM/fpPCM is preferably of at least 500 Daltons, more preferably at least 2000 Daltons.

The polymer branching can be controlled to provide for chain entanglement and rheology control. The polymer chain can have any number and length of chains. The polymer preferably has 0-1000 branches. The branches are at least 50 daltons. The branches can be in any configuration such as random, comb, etc. The branches can be in a stereospecific configuration.

The polymer can be a copolymer or block copolymer in which there are "hard" segments and "soft" segments. The hard segments can be due to high Tg moieties or crystallizible moieties, whereas the soft segments can be due to low Tg moieties or amorphous segments. The hard segments can interact and create a crosslink, entanglement or interaction that creates a degree of fixation or high viscosity. The soft segment can be free to flow or rearrange due to heat or pressure.

In one embodiment, the weight of the crystallizable section forms at least 20%, more preferably at least 50%, and most preferably at least 70% of the total weight of the pPCM/fpPCM.

They type and amount of functionality can also effect the rheology, flow properties and setting of the TMM. For instance, the TMM can be applied to the electronic component then fully cured and crosslinked through any of the previously described functionality, reactions or crosslinking mechanisms The functionality can be also be mixed to give different crosslinking reactions and different kinetics of the crosslinking reactions. As example, epoxy and amines can quickly cure at room temperature to provide for a fast set, tack free time, and use. This partial cure allows for slight flow or gap fill either over time or as the TMM warms up from electronic use—at this time, a second set of crosslinking reactions can occur to fully crosslink and fully set the TMM. These second set of crosslinking reactions can be triggered either by oxidation, heat, UV etc. such as oxygen radical crosslinking of unsaturated groups, N-methylol ether crosslinking with hydroxyl or carboxyl, or UV initiated free radical reaction with unsaturated moieties.

The different crosslinking reactions and kinetics can be controlled by the use of different catalysts or initiators that react at different temperatures. For instance, two different free radical (FR) initiators (peroxide, azo, etc.) with different decomposition temperatures can be combined with a polymer containing various unsaturated groups. The first FR initiator can decompose at application temperatures creating a partial cure, crosslinking or set while allowing for some flow and gap fill. The second FR initiator can then decompose and react to further react at higher temperatures.

These various temperatures of reaction, application or use can also be controlled by external environments. For instance, room temperature crosslinking reactions can be controlled by preparing, shipping/storing and applying the TMM at lower than room temperature or at freezing temperatures, then allowing the reaction to proceed as the electronic parts are assembled Likewise, crosslinking reactions can be controlled by the addition of heat, light or other forms of energy.

Rheology, viscosity, flow and gap fill can also be controlled by the use of reversible reactions or crosslinks. These are sometimes referred to as "self-healing" systems. For instance, the TMM can contain ionic crosslinks based $Zn^{+2}$ carboxyl salts or S—S disulfide bonds that can easily break, allow flow and recombine.

Examples of reversible reactions are hydrolysis of ester bonds, breaking and recombination of the urethane bond into hydroxyl and isocyanate, breaking and recombination of the urea bond into amine and isocyanate, Diels-Alder reaction based crosslinks, ionic bonds based on metals, metal coordination or organic salts, hydrogen bonding, metal coordination, hydrophobic forces, van der Waals forces, pi-pi interactions and electrostatic effects.

The above described phase changes or chemical associations can also be used as reversible crosslinks, i.e. the melting and recrystallization of polymer crystalline segments. Associations of hydrophobic/hydrophilic sections of copolymers or block copolymers. Copolymers or block copolymers with different Tg segments, hard/soft segments, etc.

Rheology, viscosity, flow and gap fill can also be controlled by the use or addition of rheology control agents, thickeners, etc. These materials are such things as silica, carbon particles, talc, ZnO, Calcium carbonate, partially crosslinked or gelled polymers, etc. The following described particles and fillers can also be used a rheology control or viscosity agents.

Fillers and Additives—Thermal Conductive Fillers

Aspects of the present invention pertain to using a thermal conductive filler in combination with the various phase change materials described herein. As described above, Thermal Conductivity, k (also denoted as λ or κ), is the property of a material's ability to conduct heat is measured in W/m·K.

Thermal conductivity is defined as the quantity of heat (Q) transmitted through a unit thickness (L) in a direction normal to a surface of unit area (A) due to a unit temperature gradient (ΔT) under steady state conditions and when the heat transfer is dependent only on the temperature gradient.

The TMM described herein can also have various conductive additives and fillers to improve the various properties. Materials to enhance the thermal conductivity can be added such as forms of carbon (graphene, graphite (synthetic or natural, expanded or exfoliated, etc), graphite oxide, diamond (synthetic or natural), diamond aerogel, carbon fibers, carbon nanotubes (CNT or single walled (SWCNT)), multiwalled (MWCNT)), fullerenes (buckyballs), loonsdaleite, carbine, glassy carbon and amorphous carbon. Other thermal conductive particles can include metals, metal salts, metal carbides, metal oxides, metal nitrides, metal sulfate derivatives, metal phosphate derivatives, boron nitride (cubic and hexagonal), boron carbide, boron oxide, alumina, Al, Al oxide, $Al_2O_3$, Al nitride, Ag, Au, metallized glass, Sn, Zn, ZnO, Cu, Mg, MgO, wollastonite, silica (fused, fumed, precipitated, coated, colloidal, agglomerated), silicon carbide (SiC), silicone, silica coated particles and alloys (silica coated Al nitride), sapphire, quartz, polyhedral oligomeric silsesquioxane (POSS), Fe, Fe oxides, Pt, Pb, Ni, Ti, Ti oxides, Cr, Bi, In, Ga, Ge, Ce, La, W, WC, Li, Be, Be oxides, Ca, Rb, Sr, Cs, Ba, Fr, Ra, Sc, V, Mn, Co, As, Se, Y, Zr, Zr oxides Nb, Mo, Tc, Ru, Rh, Cd, In, Sb, Te, Hf, Ta, Re, Os, Jr, Hg, Tl, Po, Rf, Db, Sg, Bh, Hs, Mt, Ds, Rg, Pr, Nd, Pm, Sm, Eu, Gd, Tb, Dy, Ho, Er, Tm, Yb, Lu, Ac, Th, Pa, U, Np, Pu, Am, Cm, Bk, Cf, Es, Fm, Md, No, Lr, etc. and their blends, solders, eutectics and alloys.

Low melting or fusible materials and fillers can also be included for enhancement of rheology, gap fill, and conductivity (electrical and thermal). These may comprise Ga, In, Sn, or any alloy and oxide thereof. The low melting metal may optionally further comprise Ag, Bi, Cd, Cu, Pb, Zn, or a combination thereof. Examples of suitable low melting metals, alloys and their oxides include Ga, InGa alloys, In—Ag alloys, InBi alloys, In—Sn alloys, Bi—Sn alloys, Pb—Sn alloys, InPb alloys, InPb—Ag alloys, InBi—Sn alloys, Sn—In—Zn alloys, Sn—Bi—Zn alloys, Sn—In—Ag alloys, Sn—Ag—Bi alloys, Sn—Bi—Cu—Ag alloys, Sn—Ag—Cu—Sb alloys, Sn—Ag—Cu alloys, Sn—Ag alloys, Sn—Ag—Cu—Zn alloys, and combinations thereof. The low melting metal can have a melting point of up to 250° C., alternatively up to 225° C. The low melting metal can have a melting point of at least 50° C., alternatively at least 150° C. The low melting metal can be a eutectic alloy, a non-eutectic alloy, an oxide, or a pure metal. Low melting metals are commercially available. The low melting metal may comprise at least about 0.1 up to about 20% of the weight of the TMM. These alloys, oxides or metals can also be separate layers or segregated portions of the TMM.

The thermal conductive fillers work most efficiently if they are in close contact or touching other thermally conductive or crystalline materials in order to facilitate a direct conductive pathway. Therefore the concentration, impurities, crystallinity, shape, size, compatibility and distribution of the fillers and other thermal materials is important.

The fillers can be 5-95% of the TMM. The amount of filler will depend on many factors such as compatibility, effect on rheology, etc. The particle can be any shape such as round, spherical, cylindrical, fiber, sheet, flake, powder, whiskers, tubular, platelets, foams, meshes, agglomerates of these shapes or any other irregular shape. Depending on the application, a single shape or mixture of shapes may be advantageous to provide the optimum packing and arrangement for particle contact.

The particle can have any aspect ratio, from 1 for perfectly spherical particles to an infinite aspect ratio for nanomaterials. The particle size can be from 0.1 nanometer to 1 mm. The size and distribution of the particle will depend on the application such as nanometer sized particles allow for good dispersion, compatibility with good gap fill whereas large particles allow for lower concentration but provide for higher occurrence of contact between the particles for good thermal conductivity. Depending on the application, a single particle size or narrow particle size distribution may be advantageous for rheology optimization, whereas a mixture of particle sizes allows for most efficient packing distribution curve. For instance smaller average particles can fill the interstitial spaces between larger average particles to produce the optimum packing theory distribution curve which provides for efficient thermal transfer.

The particles can be of a monomolecular thickness, layer or size, such as the individual platelets or layers which make up bigger particles. As an example, graphene is one-atom-thick planar sheets of $sp^2$-bonded carbon atoms that are densely packed in a honeycomb crystal lattice. Graphene sheets stack to form graphite.

Thermal conductivity can be improved by using materials that will align or orient themselves to connect and provide a pathway from the electronic component to the cooler surface. For instance the use of fibers, whiskers, flakes or sheets can be used such that the materials when applied will align or pack along their longitudinal axis. Further examples is using fibers, flakes or sheets that have a length equal or greater than the TMM thickness so that the one end of the fiber, flake or sheet is touching the electronic component and the other end reaches to the surface or contacts the cooler surface, heat sink or heat spreader providing a constant unbroken single particle pathway. These types of fillers can also provide strength and reinforcement to the TMM to improve the tensile, adhesive or cohesive properties.

In order to provide optimum thermal conductivity, the fillers should have maximum purity with reduced included elemental materials. Purities greater than 95%, preferably >99% and most preferably >99.99999%. Higher purities also lead to higher material crystallinity with >50% crystallinity, preferably >90% and most preferably >99% crystalline. Reduced elemental impurities also means lower radioactive emissions with radioactive particle emissions lower than 0.001 counts/$cm^2$·hr, (i.e. positively charged alpha particle ($\alpha$), a positively or negatively charged beta particle ($\beta$), a photon or gamma particle, ($\gamma$), or a neutron and neutrinos).

In order to improve filler or particle compatibility with the TMM, electronic components or matrix material, it can be advantageous to surface treat the particle. This can also improve the rheology, viscosity and flow characteristics of the TMM. Surface treated particles can have improved compatibility with the binder, polymers or matrix material of the TMM which allows for complete coverage or surface wetting of the particle and therefore less air space or voids around the particle providing for improved thermal conductivity. Particle surface treatments can be by reaction with coupling agents, oxidation, acid, base, flame, functionalizing, etc. plasma oxidation, plasma sulfonation, ozone treatments in the presence or absence of ultraviolet light, alkaline surface hydrolysis, silanation, silanization and plasma ammonia treatment.

Coupling or surface treating agents can be any functional material such as FP-PCMs, FP-PCM with salt functionality, nonionic molecules with hydrophilic or hydrophobic moieties (i.e. aliphatic ethoxylates, alkyl ethoxylates, alkylphenoxy ethoxylates and their branched analogues), anionic or cationic molecules or polymers such as those containing carboxyl groups, containing amine neutralized carboxy groups, containing amine groups, acid neutralized amine groups etc. anhydrides and unsaturated polymeric acids or their salts and analogues (i.e. maleinized polybutadiene, maleinized or acid functional polyolefins, maleinized or acid functional poly (meth)acrylates, maleinized or acid functional polyesters, including metal or amine salts), alkoxysilanes, alkoxy-functional oligosiloxanes, alkylthiols, fatty acids, fatty acid metal salts, fatty acid amine salts, fatty amines, fatty amine salts, titanates, titanate coupling agents, zirconates, zirconate coupling agents, aluminates, aluminate coupling agents or mixtures thereof. Coupling agents such as those supplied by Kenrich Petrochemicals, Inc., Capaute Chemical, or Tyzor™ products from Dupont Inc., Dynasylan® silanes and organo-functional silanes from Evonik Degussa GmbH Germany, Dow Corning® "Z" silanes or Xiameter® "OFS" silanes from Dow Corning Corp.

Treating agents and treating methods are known in the art, see for example, U.S. Pat. No. 6,169,142 (col. 4, line 42 to col. 5, line 2). The TIM may comprise at least about 0.05% of a treating agent. The TIM may comprise up to about 10%, alternatively up to about 5%, alternatively up to about 0.5%, of a treating agent. The treating agent can be an alkoxysilane having the formula: $R^5_x Si(OR^6)_{(4-x)}$, where x is 1, 2, or 3; alternatively x is 3. $R^5$ is a substituted or unsubstituted monovalent hydrocarbon group of at least about 1 carbon atom, alternatively at least about 8 carbon atoms. $R^5$ has up to about 50 carbon atoms, alternatively up to about 30 carbon atoms, alternatively up to about 18 carbon atoms. $R^5$ is exemplified by alkyl groups such as hexyl, octyl, dodecyl, tetradecyl, hexadecyl, and octadecyl; and aromatic groups such as benzyl and phenylethyl. $R^5$ can be saturated or unsaturated, branched or unbranched, and unsubstituted. $R^5$ can be saturated, unbranched, and unsubstituted.

$R^6$ is an unsubstituted, saturated hydrocarbon group of at least about 1 carbon atom. $R^6$ may have up to about 4 carbon atoms, alternatively up to about 2 carbon atoms. The treating agent is exemplified by hexyltrimethoxysilane, octyltriethoxysilane, decyltrimethoxysilane, dodecyltrimethyoxysilane, tetradecyltrimethoxysilane, phenylethyltrimethoxysilane, octadecyltrimethoxysilane, octadecyltriethoxysilane, a combination thereof, and others.

Alkoxy-functional oligosiloxanes can also be used as treatment agents. Alkoxy-functional oligosiloxanes and methods for their preparation are known in the art, see for example, EP 1 101 167 A2. For example, suitable alkoxy-functional oligosiloxanes include those of the formula $(R^6O)_a Si(OSi R^7_2 R^8)_{4-a}$. In this formula, a is 1, 2 or 3, alternatively a is 3. Each $R^6$ can be an alkyl group. Each $R^7$ is can be independently selected from unsaturated monovalent hydrocarbon groups of about 1 to about 10 carbon atoms. Each $R^8$ can be an unsaturated monovalent hydrocarbon group having at least about 11 carbon atoms.

Treatment agents for alumina or passivated aluminum nitride could include alkoxysilyl functional alkylmethyl polysiloxanes (e.g., partial hydrolysis condensate of $R^9_b R^{10}_c Si(O^{11})_{(4-b-c)}$ or cohydrolysis condensates or mixtures), similar materials where the hydrolyzable group would be silazane, acyloxy or oximo. In all of these, a group tethered to Si, such as $R^9$ in the formula above, is a long chain unsaturated monovalent hydrocarbon or monovalent aromatic-functional hydrocarbon. $R^{10}$ is a monovalent hydrocarbon group, and $R^{11}$ is a monovalent hydrocarbon group of about 1 to about 4 carbon atoms. In the formula above, b is 1, 2, or 3 and c is 0, 1, or 2, with the proviso that b+c is 1, 2, or 3. One skilled in the art could optimize a specific treatment to aid dispersion of the filler without undue experimentation.

Other specific examples of treating agents such as organo-functional silanes have the following typical molecular structure: X—CH$_2$CH$_2$CH$_2$Si(OR)$_{3-n}$R'$_n$ where n=0, 1, 2. Many combinations are possible, but these are characterized by the fact that they contain two different types of reactive groups. The OR groups are hydrolyzable groups such as methoxy, ethoxy or acetoxy groups. The group X is an organo-functional group, such as epoxy, amino, methacryloxy (shown below), or sulfido. The presence of some Si-alkyl groups ensures low surface tension and good wetting properties. A typical example for sulfido-silanes: (OR)$_3$Si—(CH$_2$)$_3$—S$_x$—(CH$_2$)$_3$Si(OR)$_3$ where x=2 to 8.

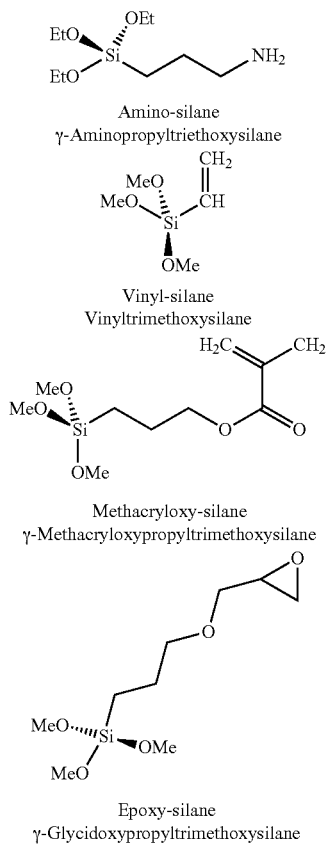

Amino-silane
γ-Aminopropyltriethoxysilane

Vinyl-silane
Vinyltrimethoxysilane

Methacryloxy-silane
γ-Methacryloxypropyltrimethoxysilane

Epoxy-silane
γ-Glycidoxypropyltrimethoxysilane

Use of Fire Resistant Additives

In order to provide a margin of safety for the electronic components, a fire retarder (FR) can be added to prevent combustion if the components overheat. Materials such as Magnesium hydroxide, Al hydroxide, expanded graphite, ammonium polyphosphate, phosphate salts, polyphosphate salts, wherein the polyphosphate can be any mol. wt. or degree of polymerization, pentaerythritol, treated montmorillonite, halogenated compounds, ammonium bromide, chlorinated or brominated alkanes and polymers, antimony oxide, antimony trioxide, red phosphorous, magnesia cements, magnesium oxysulphate, magnesium phosphate, magnesium sulphate, boron compounds, borates, boric acid, silicon and silica compounds, melamine and melamine compounds, sol-gels, sodium carbonate, sodium silicate, tetrakis (hydroxymethyl)phosphonium salts, halocarbons, including chlorendic acid derivates, halogenated phosphorus compounds including tri-o-cresyl phosphate, tris(2,3-dibromopropyl)phosphate (TRIS), bis(2,3-dibromopropyl)phosphate, tris(1-aziridinyl)-phosphine oxide (TEPA), phosphoramides, triphenyl phosphate (TPP), resorcinol diphosphate (RDP), bisphenol-a-disphosphate (BPA-DP), organic phosphine oxides, halogenated epoxy resin (tetrabromobisphenol A), etc. including their blends or mixtures.

Another example is to have the FR material as part of the microcapsule shell. For instance, melamine or melamine compounds provide excellent microcapsule shells and also provide good FR properties. Sol-gels can also be used as mPCM shells or secondary shells to give additional FR protection. Any shell material, shell polymer or secondary shell layer can also incorporate any of the above FR additives to infer improved FR properties to the TMM.

Use of Electrically Conducting and Static Charging/Discharging Materials and Polymers.

In certain embodiments of the invention, it may also be advantageous to include materials designed to control electrical energy or static energy. This electrical energy can either be conducted, discharged, dissipated, stored or other means of moving this energy. Metallic materials, such as previously described above, can include any metal, alloy, oxide, etc. These can also be in any shape or size as previously outlined. Many of the previously described thermal conductors can also be used as electrical conductors. Organic or organic doped materials can also be included in the TMM package. These materials can include the general polymer structures shown below:

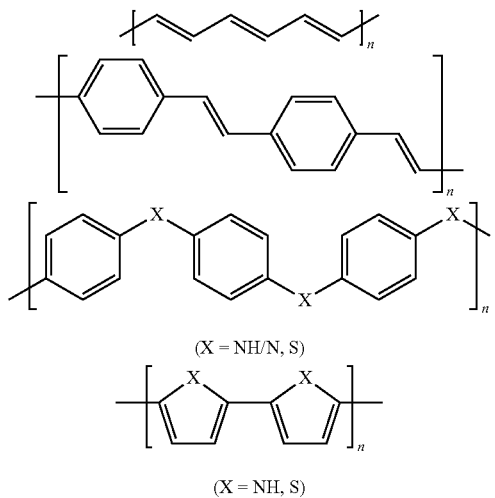

Chemical structures of some conductive polymers.
From top left clockwise: polyacetylene; polyphenylene vinylene;
polypyrrole (X=NH) and polythiophene (X=S);
and polyaniline (X=NH/N) and polyphenylene sulfide (X=S)

These and other general classes of conducting polymers can be broken down as in the below table:

|  | No heteroatom | Nitrogen-containing | Sulfur-containing |
| --- | --- | --- | --- |
| Aromatic main chain | Poly(fluorene)s Polyphenylenes Polypyrenes Polyazulenes polynaphthalenes | Poly(pyrroles)s (PPY) Poly(o-aminophenols) (POAP) Polycarbazoles Polyindoles Polyazepines Polypyridines Polyanilines (PANI) | Poly(thiophene)s (PT) Poly(3,4-ethylenedioxythiophene) (PEDOT) Poly(p-phenylene sulfide) (PPS) |
| Double bonds in main chain | Poly(acetylene)s (PAC) |  |  |
| Aromatic and Double Bonds | Poly(p-phenylene vinylene) (PPV) |  |  |

More specifically, various materials, polymers and monomers can be further broken down into more specific charge or radiation conducting materials. The various combinations and mixtures of materials using below example materials is infinite and the below examples are not complete or inclusive. Infinite combinations can produce various polymers, copolymers, mixtures, etc. that can have electrically conducting and static dissipating properties. These polymers can be doped with any combination of the infinite number of salts or metallic salts to enhance the conductivity:

Photosensitizing and charge transport compounds such as 1,1,4,4-Tetraphenyl-1,3 butadiene, 4-[2-[5-[4-(Diethylamino)phenyl]-4,5-dihydro-1-phenyl-1H-pyrazol-3-yl] ethenyl]-N,N-diethylaniline, 5,12-Bis(phenylethynyl)naphthacene, 9,10-Bis(phenylethynyl)anthracene, 9,10-Di-p-tolylanthracene, 9,10-Phenanthrenequinone, Benzo[ghi]perylene, Coronene, Julolidine, Pentaphene-78, Perylene-66, Phenanthrene, Phenanthridine, Phenazine, Phenothiazine, Pyrazole-72, Quinacridonequinone, Quinolin-65, Thioxanthone-64, Triphenylene, Violanthrone-79, [4-[Bis(2-hydroxyethyl)amino]phenyl]-1,1,2-ethylenetricarbonitrile.

Light Emitters, Dopants, electron & hole transporting materials such as: 5,12-Dihydro-5,12-dimethylquino[2,3-b]acridine-7,14-dione, 8-Hydroxyquinoline zinc, Anthracene, Benz[b]anthracene, Coumarin 6, Dichlorotris(1,10-phenanthroline)ruthenium(II) hydrate, Lithium tetra(2-methyl-8-hydroxyquinolinato)boron, Perylene, Platinum octaethylporphyrin, Rubrene, Tris(2,2'-bipyridyl)dichlororuthenium(II) hexahydrate, Tris(2,2'-bipyridyl-d8)ruthenium(II) hexafluorophosphate, Tris(benzoylacetonato)mono(phenanthroline)europium(III), Tris(dibenzoylmethane)mono(1,10-phenanthroline)europium(III), Tris(dibenzoylmethane)mono(5-amino-1,10-phenanthroline)europium(III), Tris-(8-hydroxyquinoline)aluminum, Tris[1-phenylisoquinoline-C2,N]iridium(III), Tris[2-(4,6-difluorophenyl)pyridinato-C2,N]iridium(III), Tris[2-(benzo[b]thiophen-2-yl)pyridinato-C3,N]iridium(III), Tris[2-phenylpyridinato-C2,N]iridium(III), Metal and salt dopants.

Light Emitting Polymers such as: Cyano-Polyphenylene vinylene (CN-PV) Polymers including: Poly(2,5-di(hexyloxy)cyanoterephthalylidene), Poly(2,5-di(octyloxy)cyanoterephthalylidene), Poly(2,5-di(3,7-dimethyloctyloxy)cyanoterephthalylidene), Poly(5-(2-ethylhexyloxy)-2-methoxy-cyanoterephthalylidene), Poly(5-(3,7-dimethyloctyloxy)-2-methoxy-cyanoterephthalylidene).

Nitrogen-Containing Polymers including: Poly(2,5 pyridine) and Poly(3,5 pyridine).

Poly(fluorenylene ethynylene) (PFE) Polymers including: Poly(9,9-dioctylfluorenyl-2,7-yleneethynylene), Poly[9,9-di(3',7'-dimethyloctyl)fluoren-2,7-yleneethynylene], Poly[9,9-di(2'-ethylhexyl)fluoren-2,7-yleneethynylene], Poly[9,9-di-dodecylfluoroenyl-2,7-yleneethylnylene].

Poly(phenylene ethynylene) (PPE) Polymers including: Poly(2,5-di(3',7'-dimethyloctyl)phenylene-1,4-ethynylene), Poly(2,5-dicyclohexylphenylene-1,4-ethynylene), Poly(2,5-di(2'-ethylhexyl)-1,4-ethynylene), Poly(2,5-didodecylphenylene-1,4-ethynylene), and Poly(2,5-dioctylphenylene-1,4-ethynylene).

Polyfluorene (PFO) Polymers and Co-Polymers including: Poly(9,9-di-n-dodecylfluorenyl-2,7-diyl), Poly(9,9-di-n-hexylfluorenyl-2,7-diyl), Poly(9,9-di-n-octylfluorenyl-2,7-diyl), Poly(9,9-n-dihexyl-2,7-fluorene-alt-9-phenyl-3,6-carbazole), Poly[(9,9-di-n-octylfluorenyl-2,7-diyl)-alt-(benzo[2,1,3]thiadiazol-4,8-diyl)], Poly[(9,9-dihexylfluoren-2,7-diyl)-alt-(2,5-dimethyl-1,4-phenylene)], Poly[(9,9-dihexylfluoren-2,7-diyl)-co-(9-ethylcarbazol-2,7-diyl)], Poly[(9,9-dihexylfluoren-2,7-diyl)-co-(anthracen-9,10-diyl)], Poly[(9,9-dioctylfluorenyl-2,7-diyl)-co-bithiophene], Poly[9,9-bis-(2-ethylhexyl)-9H-fluorene-2,7-diyl].

Polyfluorene-Vinylene (PFV) Co-Polymers including: Poly((9,9-dihexyl-9H-fluorene-2,7-vinylene)-co-(1-methoxy-4-(2-ethylhexyloxy)-2,5-phenylenevinylene)), Poly(9,9-di-(2-ethylhexyl)-9H-fluorene-2,7-vinylene), Poly(9,9-di-n-hexylfluorenyl-2,7-vinylene), Poly[(9,9-di-(2-ethylhexyl)-9H-fluorene-2,7-vinylene)-co-(1-methoxy-4-(2-ethylhexyloxy)-2,5-phenylenevinylene)], and Poly[9-(2-ethylhexyl)-3,6-carbazolevinylene-alt-2,6-naphthalenevinylene].

Polyphenylene Vinylene (PPV) Polymers and Co-Polymers including: Poly(1-methoxy-4-(3-propyloxy-heptaisobutyl-PSS)-2,5-phenylenevinylene)-co-(1-methoxy-4-(2-ethylhexyloxy)-2,5-phenylenevinylene) (60:40), Poly(1-methoxy-4-(O-disperse Red 1))-2,5-phenylenevinylene, Poly(2,5-bis(1,4,7,10-tetraoxaundecyl)-1,4-phenylenevinylene), Poly(2,5-dihexyloxy-1,4-phenylenevinylene), Poly (2,5-dioctyl-1,4-phenylenevinylene), Poly(2,6-naphthalenevinylene), Poly(p-xylene tetrahydrothiophenium chloride), Poly[(m-phenylenevinylene)-alt-(2,5-dibutoxy-p-phenylenevinylene)], Poly[(m-phenylenevinylene)-alt-(2,5-dihexyloxy-p-phenylenevinylene)], Poly[(m-phenylenevinylene)-alt-(2-methoxy-5-(2-ethylhexyloxy)-p-phenylenevinylene)], Poly[(m-phenylenevinylene)-alt-(2-methoxy-5-octyloxy-p-phenylenevinylene)], Poly[(m-phenylenevinylene)-co-(2,5-dioctoxy-p-phenylenevinylene)], Poly[(o-phenylenevinylene)-alt-(2-methoxy-5-(2-ethylhexyloxy)-p-phenylenevinylene)], Poly [(p-phenylenevinylene)-alt-(2-methoxy-5-(2-ethylhexyloxy)-p-phenylenevinylene)], Poly[1-methoxy-4-(3-propyloxy-heptaisobutyl-PSS)-2,5-phenylenevinylene], Poly[1-methoxy-4-(3-propyloxy-heptaisobutyl-PSS)-2,5-phenylenevinylene]-co-[1-methoxy-4-(2-ethylhexyloxy)-2,5-phenylenevinylene] (30:70), Poly[2,5-bis(3',7'-dimethyloctyloxy)-1,4-phenylenevinylene], Poly[2,5-bisoctyloxy)-1,4-phenylenevinylene], Poly[2-(2',5'-bis(2"-ethylhexyloxy)phenyl)-1,4-phenylenevinylene], Poly[2-methoxy-5-(2-ethylhexyloxy)-1,4-phenylenevinylene], Poly[2-methoxy-5-(3',7'-dimethyloctyloxy)-1,4-phenylenevinylene], Poly[5-methoxy-2-(3-sulfopropoxy)-1,4-phenylenevinylene] potassium salt, Poly[tris(2,5-bis(hexyloxy)-1,4-phenylenevinylene)-alt-(1,3-phenylenevinylene)], and Poly{[2-[2',5'-bis(2"-ethylhexyloxy)phenyl]-1,4-phenylenevinylene]-co-[2-methoxy-5-(2'-ethylhexyloxy)-1,4-phenylenevinylene]}.

Polythiophene Polymers and Co-Polymers (regioregular or regiorandom stearic configurations) including: Poly(3-(2-methoxyethoxy)ethoxymethylthiophene-2,5-diyl), Poly(3,4-ethylenedioxythiophene), Poly(3-butylthiophene-2,5-diyl), Poly(3-cyclohexyl-4-methylthiophene-2,5-diyl), Poly(3-cyclohexylthiophene-2,5-diyl), Poly(3-decyloxythiophene-2,5-diyl), Poly(3-decylthiophene-2,5-diyl), Poly(3-dodecylthiophene-2,5-diyl), Poly(3-hexylthiophene-2,5-diyl), Poly(3-octylthiophene-2,5-diyl), Poly(3-octylthiophene-2,5-diyl-co-3-decyloxythiophene-2,5-diyl), Poly(thiophene-2,5-diyl), bromine terminated, Poly[(2,5-didecyloxy-1,4-phenylene)-alt-(2,5-thienylene)].

Water-Soluble light emitting polymers including: Poly(2,5-bis(3-sulfonatopropoxy)-1,4-phenylene, disodium salt-alt-1,4-phenylene), Poly[(2,5-bis(2-(N,N-diethylammonium bromide)ethoxy)-1,4-phenylene)-alt-1,4-phenylene], Poly[5-methoxy-2-(3-sulfopropoxy)-1,4-phenylenevinylene] potassium salt, Poly{[2,5-bis(2-(N,N-diethylamino)ethoxy)-1,4-phenylene]-alt-1,4-phenylene}

Polymer Hole Transport and Host Materials including Polyvinyl polymers such as: Poly(1-vinylnaphthalene), Poly (2-vinylcarbazole), Poly(2-vinylnaphthalene), Poly(9-vinylcarbazole), and Poly(N-ethyl-2-vinylcarbazole).

Conducting polymers, copolymers and monomers including Polyacetylenes such as Poly[1,2-bis(ethylthio)acetylene], Poly(phenylene sulfides), Polyanilines, copolymers and Polyaniline Dopants including Camphor-10-sulfonic acid (β), Dinonylnaphthalenesulfonic acid, Dodecylbenzenesulfonic acid, Polyaniline (emeraldine base, emeraldine salt, leucoemeraldine base, nigraniline, or pernigraniline), o-ethoxyaniline, ortho & meta mono- and di-substituted anilines, ortho or meta-aminoacetophenone, and m-toluidine.

Polypyrroles and Pyrrole Monomers including: 1H-Pyrrole-1-propanoic acid, 3,4-Ethylenedioxypyrrole-2,5-dicarboxylic acid, 3,4-Ethylenedioxypyrrole, 3,4-Propylenedioxypyrrole, 4-(3-Pyrrolyl)butyric acid, Diethyl 1-benzyl-3,4-ethylenedioxypyrrole-2,5-dicarboxylate, and Polypyrrole (conductive, doped or undoped).

Polythiophenes and Thiophene Monomers including: 3,4-Ethylenedioxythiophene, Poly(3,4-ethylenedioxythiophene), bis-poly(ethyleneglycol), lauryl terminated, Poly(3,4-ethylenedioxythiophene), tetramethacrylate end-capped, Poly(3,4-ethylenedioxythiophene)-block-poly(ethylene glycol), Poly(3,4-ethylenedioxythiophene)-poly(styrenesulfonate), Poly(3,4-ethylenedioxythiophene), Poly (thiophene-3-[2-(2-methoxyethoxy)ethoxy]-2,5-diyl).

Sulfonated versions of Polyfluorenes, Poly(o-aminophenols) (POAP), Polytetrathiafulvalenes, Polynapthalenes, Poly (para-phenylene vinylene)s, natural or Biological Melanin pigment polymers.

Organic Photovoltaic materials including: Conducting Materials such as 5,5''''-Dihexyl-2,2':5',2'':5'',2''':5''',2'''':5'''',2'''''-sexithiophene, Copper(II) 1,2,3,4,8,9,10,11,15,16,17,18,22,23,24,25-hexadecafluoro-29H,31H-phthalocyanine, Copper(II) phthalocyanine, Fullerene-$C_{60}$, Fullerene-$C_{84}$, Pentacene, Perylene-3,4,9,10-tetracarboxylic dianhydride, Perylene, Poly(3-dodecylthiophene-2,5-diyl), Poly(3-hexylthiophene-2,5-diyl) regioregular, Poly(3-octylthiophene-2,5-diyl) regioregular, Poly[2-methoxy-5-(3',7'-dimethyloctyloxy)-1,4-phenylenevinylene], Tris[4-(5-dicyanomethylidenemethyl-2-thienyl)phenyl]amine, [5,6]-Fullerene-$C_{70}$, [6,6]-Pentadeuterophenyl $C_{61}$ butyric acid methyl ester, [6,6]-Phenyl $C_{61}$ butyric acid methyl ester, [6,6]-Phenyl $C_{71}$ butyric acid methyl ester, [6,6]-Phenyl $C_{85}$ butyric acid methyl ester, [6,6]-Thienyl $C_{61}$ butyric acid methyl ester, [6,6]Diphenyl $C_{62}$ bis(butyric acid methyl ester), and α-Sexithiophene.

Dyes including 1,3-Bis[4-(dimethylamino)phenyl]-2,4-dihydroxycyclobutenediylium dihydroxide, bis(inner salt), 7-Methylbenzo[a]pyrene, 9,10-Dihydrobenzo[a]pyrene-7 (8H)-one, Benzo[e]pyrene, Coumarin 102, Coumarin 153, Coumarin 30, Coumarin 480 D, Coumarin 6, Merocyanine 540 and Pyrene.

Particles and their doped, undoped, various crystal forms, and mixtures with metals including: Titanium oxide, Titanium dioxide, Titanium$^{+4}$ oxides and dioxides, and Zinc oxide.

Organic Semi-conductors including n-Type Oligomers and Polymers such as 1,4,5,8-Naphthalenetetracarboxylic dianhydride 2,3,5,6-Tetrafluoro-7,7,8,8-tetracyanoquinodimethane, 5,10,15,20-Tetrakis(pentafluorophenyl)-21H,23H-porphine palladium(II), 7,7,8,8-Tetracyanoquinodimethane, Copper(II) 1,2,3,4,8,9,10,11,15,16,17,18,22,23,24,25-hexadecafluoro-29H,31H-phthalocyanine, Fullerene-$C_{60}$, Fullerene-$C_{84}$, N,N'-Dioctyl-3,4,9,10-perylenedicarboximide, N,N'-Dipentyl-3,4,9,10-perylenedicarboximide, N,N'-Diphenyl-3,4,9,10-perylenedicarboximide, N,N'-Bis(2,5-di-tert-butylphenyl)-3,4,9,10-perylenedicarboximide, Perylene-3,4,9,10-tetracarboxylic dianhydride, [5,6]-Fullerene-$C_{70}$, [6,6]-Phenyl $C_{61}$ butyric acid methyl ester, [6,6]-Phenyl $C_{71}$ butyric acid methyl ester, [6,6]-Phenyl $C_{85}$ butyric acid methyl ester,

[6,6]-Phenyl-$C_{61}$ butyric acid butyl ester, [6,6]-Phenyl-$C_{61}$ butyric acid octyl ester, [6,6]-Thienyl $C_{61}$ butyric acid methyl ester, [6.6]Diphenyl $C_{62}$ bis(butyric acid methyl ester), Poly(2,5-di(hexyloxy)cyanoterephthalylidene), Poly(2,5-di(octyloxy)cyanoterephthalylidene), Poly(2,5-di(3,7-dimethyloctyloxy)cyanoterephthalylidene), Poly(5-(2-ethylhexyloxy)-2-methoxy-cyanoterephthalylidene), Poly(5-(3,7-dimethyloctyloxy)-2-methoxy-cyanoterephthalylidene), Poly(benzimidazobenzophenanthroline), Poly[(1,4-divinylenephenylene)(2,4,6-triisopropylphenylborane)], and Poly[(2,5-didecyloxy-1,4-phenylene) (2,4,6-triisopropylphenylborane)], diphenyl terminated.

p-Type Oligomers and Polymers including: 13,6-N-Sulfinylacetamidopentacene, 2,2':5",2":5",2"'-Quaterthiophene, 3,3"'-Didodecyl-2,2':5',2":5",2"'-quaterthiophene, 3,3"'-Dihexyl-2,2':5',2":5",2"'-quaterthiophene, 5,5""-Dihexyl-2,2': 5',2":5",2"':5",2"':5",2"-sexithiophene, 5,5'-Di(4-biphenylyl)-2,2'-bithiophene, 5,5'-Dihexyl-2,2'-bithiophene, 6,13-Dihydro-6,13-methanopentacene-15-one, Benz[b]anthracene, Benz[b]anthracene, Bis(ethylenedithio)tetrathiafulvalene, Copper(II) phthalocyanine, Coronene purified by sublimation, Dibenzotetrathiafulvalene, Pentacene, Pentacene-N-sulfinyl-n-butylcarbamate adduct, Pentacene-N-sulfinyl-tert-butylcarbamate, Platinum octaethylporphyrin, Rubrene, Tetrathiafulvalene, Tris[4-(5-dicyanomethylidenemethyl-2-thienyl)phenyl]amine, α-Sexithiophene, Poly(3-dodecylthiophene-2,5-diyl) regiorandom or regioregular, Poly(3-hexylthiophene-2,5-diyl) regiorandom or regioregular, Poly(3-octylthiophene-2,5-diyl) regiorandom or regioregular, Poly[(9,9-di-n-octylfluorenyl-2,7-diyl)-alt-(benzo[2,1,3]thiadiazol-4,8-diyl)], Poly[(9,9-dioctylfluorenyl-2,7-diyl)-co-bithiophene], Poly[2-methoxy-5-(2-ethylhexyloxy)-1,4-phenylenevinylene], Poly[2-methoxy-5-(3',7'-dimethyloctyloxy)-1,4-phenylenevinylene]

Use of Other Additives

Suitable antioxidants are known in the art and are commercially available. Suitable antioxidants include phenolic antioxidants and combinations of phenolic antioxidants with stabilizers. Phenolic antioxidants include fully sterically hindered phenols and partially hindered phenols. Stabilizers include organophosphorous derivatives such as trivalent organophosphorous compound, phosphites, phosphonates, and a combination thereof; thiosynergists such as organosulfur compounds including sulfides, dialkyldithiocarbamate, dithiodipropionates, and a combination thereof; and sterically hindered amines such as tetramethyl-piperidine derivatives. Suitable antioxidants and stabilizers are disclosed in Zweifel, Hans, "Effect of Stabilization of Polypropylene During Processing and Its Influence on Long-Term Behavior under Thermal Stress," Polymer Durability, Ciba-Geigy AG, Additives Division, CH-4002, Basel, Switzerland, American Chemical Society, vol. 25, pp. 375-396, 1996. Suitable antioxidants are supplied by BASF Corp. under the Irgafos® and Irganox® tradenames. Antioxidants supplied by Chemtura Corp. under the Naugalube® and Naugard® tradenames. Stabilizers and antioxidants supplied by Nanjing Union Rubber and Chemicals Co., Ltd.

Suitable phenolic antioxidants include vitamin E, IRGANOX B225 and IRGANOX 1010 from BASF Corp., IRGANOX 1010 comprises pentaerythriol tetrakis(3-(3,5-di-t-butyl-4-hydroxyphenyl)propionate).

Reaction catalyst inhibitors are known in the art and commercially available, see for example, U.S. Pat. No. 5,929,164 (col. 1, line 65 to col. 3, line 65). Inhibitors can be a phosphine, a diphosphine, an amine, a diamine, a triamine, an organic sulfide, an alkenyl-functional compound, an alkynyl-functional compound, a hydroxy-functional compound, a combination thereof, or any other transition metal catalyst poison.

Suitable phosphines include trialkyl phosphines and triaryl phosphines such as triphenyl phosphine. Suitable diphosphines include tetraphenylethylene diphosphine. Suitable amines include n-butyl amine and triethanolamine. Suitable diamines include tetramethylenediamine. Suitable organic sulfides include ethyl phenyl sulfide. Suitable alkenyl-functional compounds can be organic, organosilicones, or organosilanes. Suitable alkenyl-functional compounds include vinylsiloxanes and vinylsilanes. Suitable alkynyl functional compounds can be organic, such as acetylene, propyne, 1-butyne, 1-pentyne, 4,4-dimethyl-1-pentyne, 1-hexyne, 5-methyl-1-hexyne, and 1-decyne.

Methods of Manufacture of the PCM and TMM—Structure for Temperature Management and Heat Dissipation The TMM can be prepared by any convenient means such as mixing all components together at higher temperatures, preferably higher than the phase change temperature of the PCM/pPCM/fpPCM. The TMM can be manufactured by addition of ingredients in a certain order to facilitate specific reactions or interactions such as the pretreatment of the fillers and particles with coupling agents or silanes. The TMM can be mixed at low, room temperature or higher temperatures. The TMM can be prepared in mixing vessels, reactors, extruders or the like.

Application Forms

The FP-PCM, P-PCM, mPCM, PCM, additives and finished TMM can be implemented as a coating, laminate, infusion, treatment, gums, gels, film, sheets, greases, waxes or ingredient in a coating, laminate, infusion, treatment, caulks, gums, gels, film, sheets, tapes, greases, waxes that is formed adjacent to, on or within the electronic components and materials using any suitable coating, laminating, layering, infusion, etc. technique. Application techniques and forms can include spray coating, air atomized spraying, airless atomized spraying, electrostatic spraying, slot die coating, contact slot coating, curtain coating, knife coating, roller coating, kiss coating, transfer coating, foam coating, brushing, screen-printing, padding, dipping or immersion, saturating, printing, pressure or gravity feed nozzles/guns, hot melt applicators, pump guns, manually operated guns, syringes, needle guns, various shape and size nozzles, molding, overmolding, injection molding, RIM, prepeg, Resin infusion process such as resin transfer molding (RTM), vacuum infusion process (VIP) and vacuum assisted RTM (VARTM), pultrusion, extrusion, plasma, etc. The TMM can be applied to release sheets or other temporary substrate surface for packaging/shipment then subsequently transferred to the electronic components, i.e. indirect transfer processes.

The TMM can also be constructed to be the chip or board substrates, or depending on the properties of the pPCM/fpPCM it can be the whole or part of the structural part of the component body or casing for electronic component to facilitate improved conductivity and temperature regulation/control. For example, the outside housing or casing of a cellphone or computer tablet. As described below, multiple layers of different materials can be manufactured together to provide various levels of temperature control, facilitate improved thermal conductive pathways to the outside environment and allow for acceptable user properties.

The application process can be run cold, warm, hot or at room temperature, i.e. above or below room temperature, i.e. −100° C. to 400° C. Curing, crosslinking, drying or further reactions of the TMM or various layers to either cause bonding between or within the layers, or to facilitate the application of additional layers can be accomplished by any energy source. Examples are thermal, heat, light, UV, IR, radiation, solar, induction, pressure, sonic or sound waves, x-ray, radio waves, gamma waves, microwave, laser, e-beam, plasma, etc.

During use or application, the TMM can be positioned so that it is adjacent to an internal component, thus serving to control the temperature of internal electronic components. It is also contemplated that the TMM can be positioned so that it is exposed to an outside environment, thus serving to facilitate temperature to the outside, protect internal components from the outside environment or protect users from internal overheating. The TMM covers at least a portion of the substrate or electronic component. Depending on characteristics of the substrate or electronic component or a specific coating technique that is used, the TMM can penetrate below the top surface and permeate at least a portion of the substrate or electronic component. While two layers are described, it is contemplated that the article can include more or less layers for other implementations. In particular, it is contemplated that a third layer can be included so as to cover at least a portion of a bottom surface of the substrate. Such a third layer can be implemented in a similar fashion as the TMM or can be implemented in another fashion to provide different functionality, such as water repellency, stain resistance, stiffness, impact resistance, etc. The TMM can be applied to provide a continuous coating, encapsulant or complete coverage, or the TMM be used in a discontinuous pattern.

Figure 17:
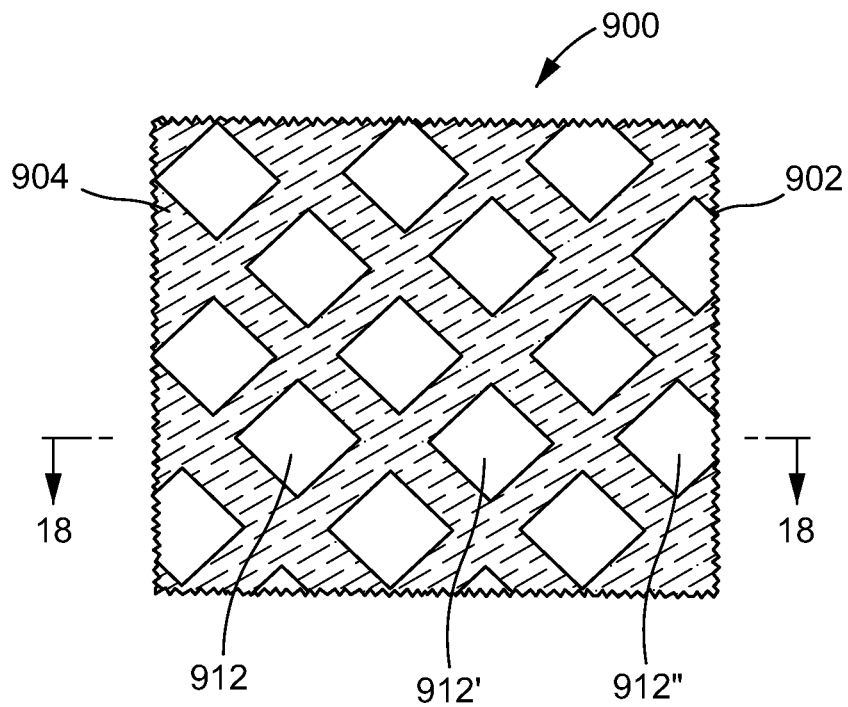
FIGS. 17 and 18 show additional embodiments of applying aspects of the present invention to a substrate.
Figure 18:
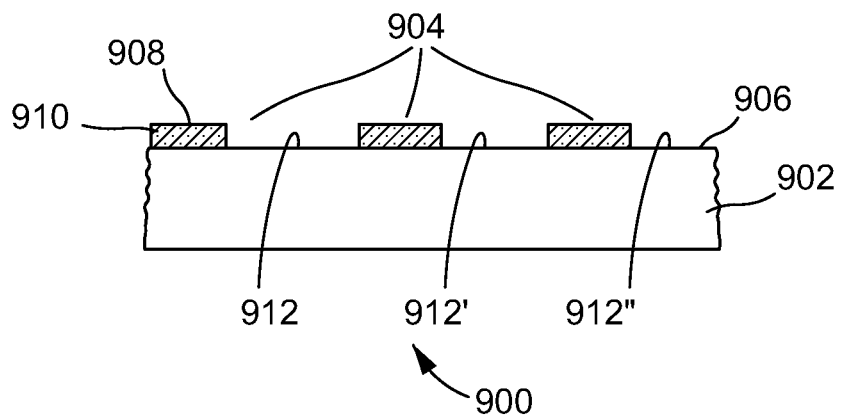

As shown in FIG. 17 and FIG. 18, the TMM 904 is formed in a crisscross pattern. This crisscross pattern comprises a first set of spaced apart regions (e.g., coating strips) that intersect a second set of spaced apart regions (e.g., coating strips) at an angle. In the present embodiment, the strips of the first set are generally parallel and evenly spaced from one another, and the strips of the second set are also generally parallel and evenly spaced from one another. The strips of the first and second set intersect at a right angle to create regions of discontinuity (e.g., 912, 912', and 912") that are generally diamond-shaped or square-shaped (i.e., as seen from the top view of FIG. 17) and are distributed across the surface 906. If desired, the spacing, width, or intersection angle of the strips may be varied to adjust the spacing, shapes, or sizes (i.e., largest linear dimension measured from the top view of FIG. 17) of the regions of discontinuity. Depending on the particular characteristics desired for the electronic article 900 or method of applying the TMM 904, the thickness of the strips may be generally uniform or may vary across a portion or portions of the coating 904. In the present embodiment, the thickness of the strips may be up to about 20 meters (e.g., from about 0.1 mm to about 20 meters), and, typically, the thickness of the coating strips may be up to about 200 mm (e.g., from about 0.1 mm to about 200 mm) to provide desired TMM properties.

In the embodiment shown in FIG. 17 and FIG. 18, the regions of discontinuity are separated from one another and expose a remaining portion of the surface 906 that is not covered by the coating 904. Alternatively or in conjunction, these regions of discontinuity may serve as passageways or openings to facilitate improved thermal conductivity or transport air, heat, pressure or other materials into or out of the electronic components.

It should be recognized that the coating 904 may, in general, be formed in a variety continuous, discontinuous, regular or irregular patterns and with regions of discontinuity having a variety of shapes and sizes. By way of example and not limitation, the coating 904 may be formed in a honeycomb pattern (e.g., with hexagonal regions of discontinuity), a grid pattern (e.g., with square-shaped or rectangular regions of discontinuity), a random pattern (e.g., with regions of discontinuity distributed randomly), and so forth. In general, the regions of discontinuity may be distributed across the surface 906 at intervals that are regularly spaced or not regularly spaced. The regions of continuity or discontinuity may be formed with a variety regular or irregular shapes such as, by way of example and not limitation, circular, half-circular, nubbin, domed, diamond-shaped, hexagonal, multilobal, octagonal, oval, pentagonal, rectangular, square-shaped, star-shaped, trapezoidal, triangular, wedge-shaped, pyramidal, conical, cylindrical and so forth. If desired, one or more regions of discontinuity may be shaped as logos, letters, or numbers. In the present embodiment, the regions of discontinuity may have sizes up to about 100 mm (e.g., from about 0.1 mm up to about 100 mm) and will typically have sizes ranging from about 1 mm to about 10 mm. In general, the regions of discontinuity may have the same or different shapes or sizes.

Figure 19:
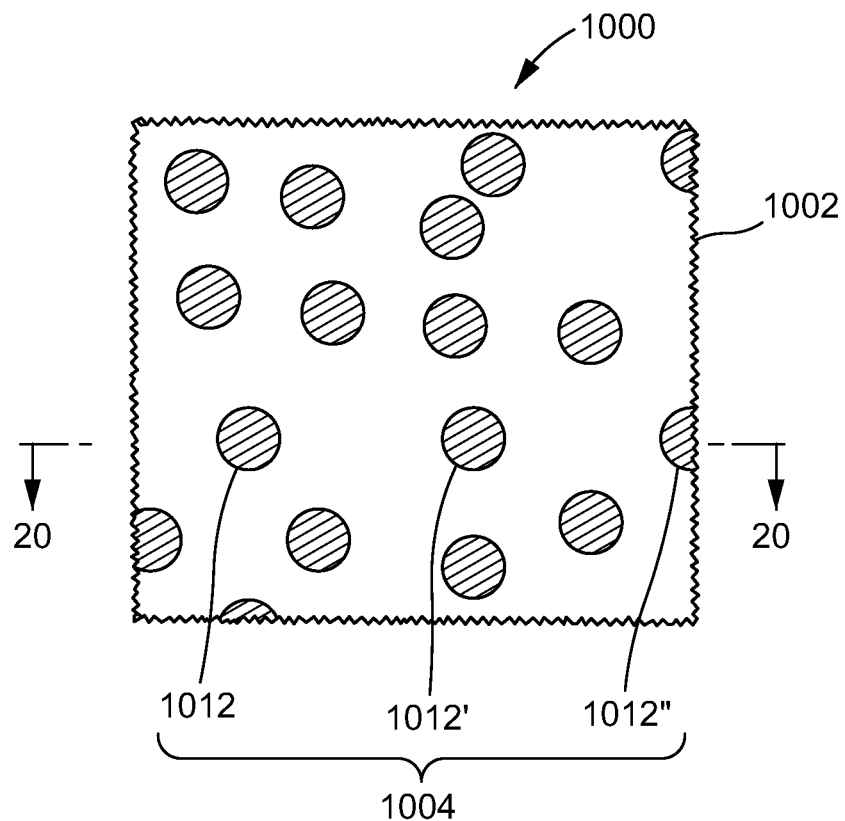
FIGS. 19 and 20 show additional embodiments of applying aspects of the present invention to a substrate.
Figure 20:
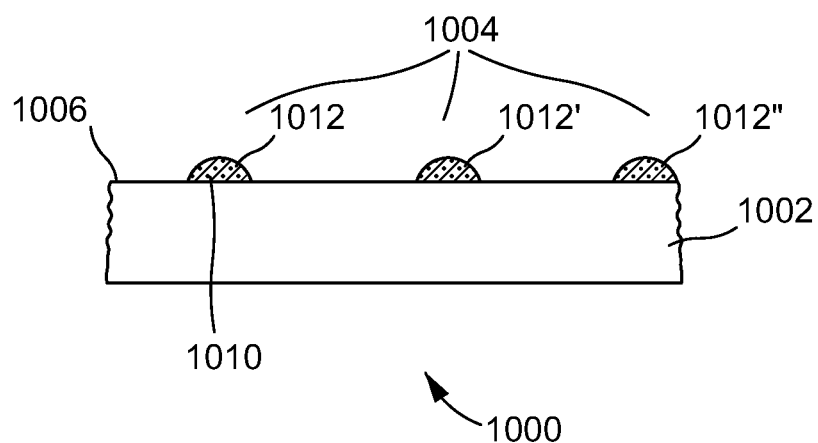

For example, FIGS. 19 and 20 show a substrate 1000 with the TMM 1012 formed in a dotted pattern. The dots 1012, 1012' and 1012" of TMM create regions of discontinuity and are distributed across the surface 1006.

The TMM, components or substrates can also be the same or different layers of the ingredients themselves. For instance, the layers can be a combination or mixture of TMM, fire retardants, thermal conductors, heat spreaders, etc. The layers can be individual or combination of ingredients such as PCM, mPCM, pPCM, fpPCM, binders, thermal conductors, heat spreaders, additives, etc. The layers can be the same, mixtures of or different transition temperatures, latent heats, thermal conductivities, etc. For example a first substrate or layer can be a film or sheet of FP-PCM, a second substrate or layer are microcapsules (or another containment structure) with same or different transition temperature or another FP-PCM bonded to the first layer, a third layer may be a separate layer bonded to the second layer which enhances thermal conductivity.

Example of Polymeric PCM Putty for Electronics Temperature Regulation

DSC was measured on a Perkin-Elmer Diamond DSC with a heating rate of 5° C./min. per ISO 11357 Plastics (DSC) Part 3. Thermal Conductivity and Specific Heat were measured on a Netzsch Instruments LFA 447 Nanoflash and DSC 404C respectively. Thermal conductivity was run per ASTM E-1461.

Preparation of polystearyl methacrylate polymeric PCM. In a flask equipped with a stirrer, condenser, nitrogen, purge and temperature controller was reacted:

|   | Ingredients | Manufacturer | Weight |
|---|---|---|---|
| 1 | n-pentyl propionate | Dow Chemical | 36.1 |
| 2 | SR324 Stearyl methacrylate | Sartomer Company | 94.0 |
| 3 | Glycidyl methacrylate | Dow Chemical | 6.0 |
| 4 | Di-t-amyl peroxide | Sigma-Aldrich Corp. | 2.7 |
| 5 | Di-t-amyl peroxide | Sigma-Aldrich Corp. | 0.5 |

1 was added to the flask and heated to 152° C. under nitrogen. #2, #3 and #4 were combined and added slowly to reaction flask over 3.5 hours. This was let react an additional 1.0 hours, #5 added, let react for 1.5 hours then cooled to yield a 69.7% solution of polystearyl methacrylate-co-glycidyl methacrylate with a melt point of 31.1° C. and 83.8 J/g latent heat.

Figure 23:
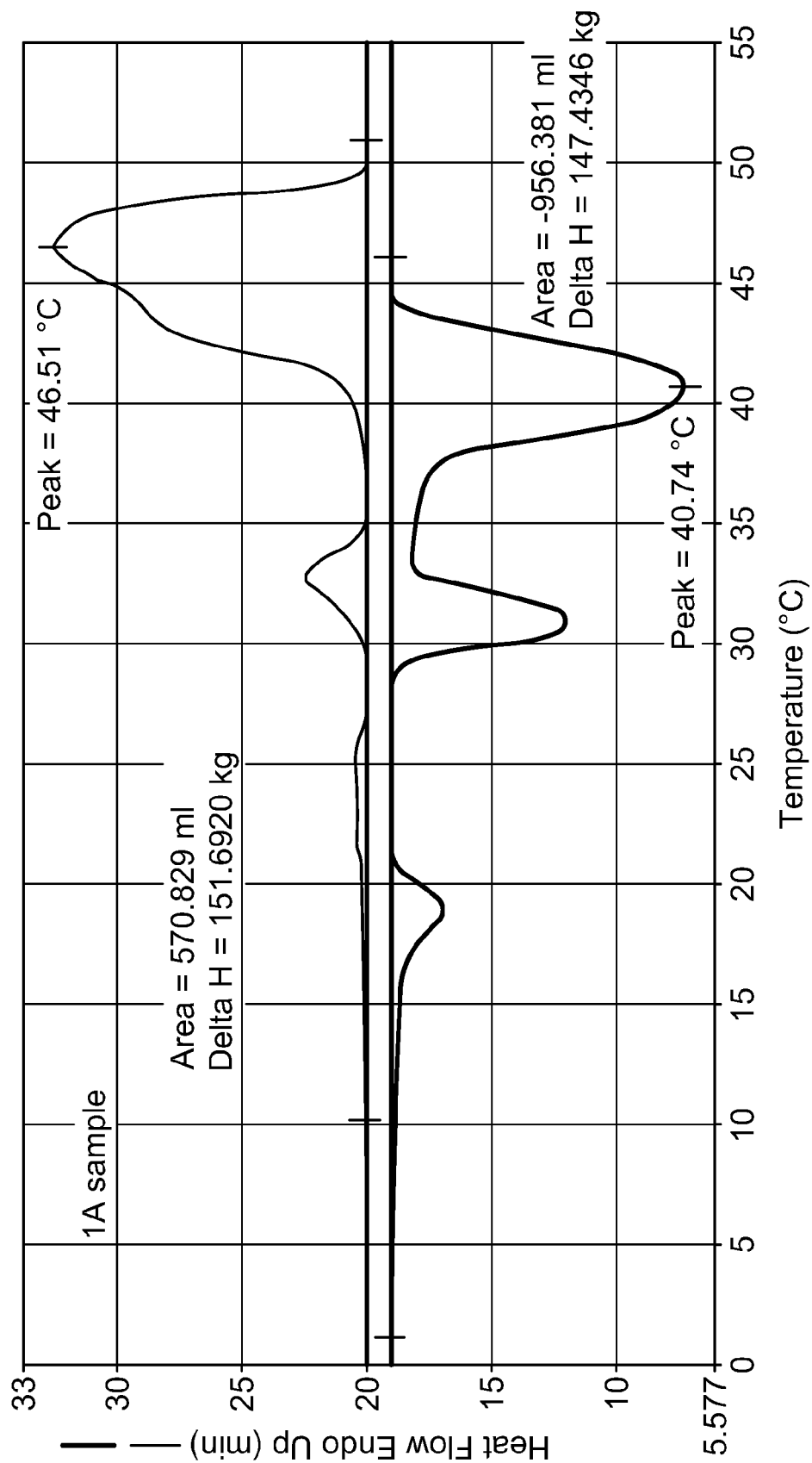
FIG. 23 shows the graphed results of one embodiment of the present invention.

The above solution was dried to 100% solids. 35.0 grams of this polymer was heated to 55° C. and mixed with 65.0 grams of spray dried Docosane (C22) containing microcapsules (Microtek Laboratories, Inc.). Once the microcapsules were dispersed evenly, 5.0 grams of graphite powder (Ecophit EG15 supplied by SGL Group) was blended in to yield a putty for electronics control with the following properties and DSC. FIG. 23 shows the graphed results of this example.

| | |
|---|---|
| Phase Change Transition T (° C.) | 40-50° C. |
| Latent Heat (J/g) | 150 J/g |
| Specific Heat Capacity (J/g · K) | 2.6 |
| Thermal Conductivity @ 50° C. (W/m · K) | 1.2 |
| Density (g/m$^3$) | 0.98 |

It should be clearly understood that by providing examples of specific compositions, applicant does not intend to limit the scope of the claims to any of these specific composition. To the contrary, it is anticipated that any combination of the functional groups, polymeric phase change materials, and articles described herein may be utilized to achieve the novel aspects of the present invention. The claims are not intended to be limited to any of the specific compounds described in this disclosure, any disclosure incorporated herein or the example given above.

While the present invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, process step or steps, to the objective, spirit and scope of the present invention. All such modifications are intended to be within the scope of the claims appended hereto. In particular, while the methods disclosed herein have been described with reference to particular steps performed in a particular order, it will be understood that these steps may be combined, sub-divided, or re-ordered to form an equivalent method without departing from the teachings of the present invention. Accordingly, unless specifically indicated herein, the order and grouping of the steps is not a limitation of the present invention.

What is claimed is:

1. An electronic device, wherein one or more components of the electronic device generate heat during operation, the electronic device including structure for temperature management and heat dissipation, the structure for temperature management and heat dissipation comprising:
   a heat transfer substrate having a surface that is in thermal communication with an ambient environment;
   a temperature management material in physical contact with at least a portion of the one or more components of the electronic device and at least a portion of the heat transfer substrate;
   the temperature management material comprising,
      a mixture of two or more crosslinked polymeric latent heat storage materials, the mixture having two different transition temperatures between 0° C. and 100° C.; and
      a thermal conductive filler.

2. The electronic device of claim 1, wherein the heat transfer substrate is a printed circuit board and wherein the one or more components of the electronic device are mounted to the printed circuit board.

3. The electronic device of claim 1, further comprising a second substrate in thermal communication with the heat transfer substrate.

4. The electronic device of claim 1, wherein the heat transfer substrate is an exterior surface of the electronic device.

5. The electronic device of claim 1, wherein the heat transfer substrate is a display of the electronic device.

6. The electronic device of claim 1, wherein the thermal conductive filler is a form of carbon.

7. The electronic device of claim 6, wherein the thermal conductive filler is graphene.

8. The electronic device of claim 1, wherein the thermal conductive filler is a form of alumina.

9. The electronic device of claim 1, wherein the thermal conductive filler is a boron compound.

10. The electronic device of claim 1 wherein the structure for temperature management and heat control further comprises a fusible material.

11. The electronic device of claim 1 wherein the thermally conductive filler comprises between 5% and 95% of the temperature management material.

12. The electronic device of claim 1 wherein the thermally conductive filler has a purity that is greater than 95%.

13. The electronic device of claim 1 wherein the structure for temperature management and heat control further comprises a fire resistant additive.

14. The electronic device of claim 1, further comprising a housing containing the one or more electronic components and the structure for temperature management and heat dissipation.

15. A personal computing device, comprising:
   a housing;
   a printed circuit board;
   one or more components attached to the printed circuit board that generate heat during operation of the electronic device;
   structure for temperature management and heat dissipation, the structure for temperature management and heat dissipation comprising:
      a heat transfer substrate having a surface that is in thermal communication with the printed circuit board and a surface that is in thermal communication with an ambient environment;
      a temperature management material in physical contact with at least a portion of the one or more components of the electronic device and at least a portion of the heat transfer substrate;
      the temperature management material comprising,
         a mixture of two or more polymeric latent heat storage materials the mixture having two different transition temperatures between 0° C. and 100° C.; and
         a thermal conductive filler.

16. The personal computing device of claim 15, wherein the device is a phone.

17. The personal computing device of claim 15, wherein the device is a tablet computer.

18. The personal computing device of claim 15, wherein the device is a laptop computer.

19. A method of constructing a personal computing device, the personal computing device comprising a housing, a printed circuit board, one or more components attached to the printed circuit board that generate heat during operation of the electronic device, and a structure for temperature management and heat dissipation, the structure for temperature management and heat dissipation comprising a heat transfer substrate having a surface that is in thermal communication with the printed circuit board and a surface that is in thermal communication with an ambient environment, a mixture of two or more temperature management materials, the mixture in physical contact with at least a portion of the one or more components of the electronic device and at least a portion of the heat transfer substrate, at least one of the two temperature management materials comprising, a functional polymeric latent heat storage material, carrying at least one function, having a latent heat of at least 5 Joules per gram and a transition temperature between 0° C. and 100° C., and a thermal conductive filler, the method comprising:

applying the mixture over at least a portion of the one or more components attached to the printed circuit board;

enclosing the printed circuit board, the one or more components, and the structure for temperature management and heat dissipation with the housing;

curing the mixture.

20. The method of claim 19, wherein the mixture substantially fills all voids within the housing.

21. An electronic device, wherein one or more components of the electronic device generate heat during operation, the electronic device including structure for temperature management and heat dissipation, the structure for temperature management and heat dissipation comprising:

a heat transfer substrate having a surface that is in thermal communication with an ambient environment;

a mixture of two or more temperature management materials, the mixture in physical contact with at least a portion of the one or more components of the electronic device and at least a portion of the heat transfer substrate;

at least one of the temperature management materials comprising, a crosslinked polymeric latent heat storage material having a latent heat of at least 5 Joules per gram and a transition temperature between 0° C. and 100° C. and carrying at least one function; and a thermal conductive filler.

* * * * *